United States Patent
Ohsawa et al.

(10) Patent No.: US 8,304,094 B2
(45) Date of Patent: Nov. 6, 2012

(54) LIGHT-EMITTING ELEMENT USING SPIROFLUORENE DERIVATIVE AND ELECTRONIC APPLIANCE

(75) Inventors: Nobuharu Ohsawa, Zama (JP); Sachiko Kawakami, Isehara (JP); Harue Osaka, Sagamihara (JP)

(73) Assignee: Semiconductor Energy Laboratory Co., Ltd., Atsugi-shi, Kanagawa-shi (JP)

( * ) Notice: Subject to any disclaimer, the term of this patent is extended or adjusted under 35 U.S.C. 154(b) by 903 days.

(21) Appl. No.: 12/071,636

(22) Filed: Feb. 25, 2008

(65) Prior Publication Data

US 2008/0206598 A1 Aug. 28, 2008

(30) Foreign Application Priority Data

Feb. 28, 2007 (JP) .................................. 2007-049843

(51) Int. Cl.
*H01L 51/54* (2006.01)
(52) U.S. Cl. ........ 428/690; 428/917; 313/504; 313/506; 252/301.16; 257/40; 257/103; 257/E51.051
(58) Field of Classification Search ............ 257/E51.051
See application file for complete search history.

(56) References Cited

U.S. PATENT DOCUMENTS

| | | | |
|---|---|---|---|
| 6,406,804 | B1 | 6/2002 | Higashi et al. |
| 7,816,668 | B2 * | 10/2010 | Kawakami et al. ............. 257/40 |
| 7,897,964 | B2 * | 3/2011 | Kawakami et al. ............. 257/40 |
| 2006/0040132 | A1 * | 2/2006 | Liao et al. ..................... 428/690 |
| 2006/0063027 | A1 | 3/2006 | Vestweber et al. |
| 2007/0003785 | A1 * | 1/2007 | Slusarek et al. ............. 428/690 |
| 2007/0149784 | A1 | 6/2007 | Murata et al. |
| 2007/0215867 | A1 * | 9/2007 | Kawakami et al. ............. 257/40 |

FOREIGN PATENT DOCUMENTS

| | | |
|---|---|---|
| CN | 1756824 | 4/2006 |
| JP | 2004-087395 | 3/2004 |
| JP | 2006-511939 | 4/2006 |

OTHER PUBLICATIONS

Chinese Office Action (Application No. 200880006367.7) Dated July 30, 2010.
Thomas et al. *New Carbazole-Oxadiazole Dyads for Electroluminescent Devices: Influence of Acceptor Substituents on Luminescent and Thermal Properties*, Chemistry of Materials, 2004, vol. 16, No. 25, pp. 5437-5444.
Thomas et al., *Green and Yellow Electroluminescent Dipolar Carbazole Derivatives: Features and Benefits of Electron-Withdrawing Segments*, Chemistry of Materials, 2002, vol. 14, No. 9, pp. 3852-3859.
Shen et al., *High $T_g$ Blue Emitting Materials for Electroluminescent Devices*, Journal of Materials Chemistry, 2005, vol. 15, No. 25, pp. 2455-2463.
International Search Report (Application No. PCT/JP2008/053121) dated May 13, 2008.
Written Opinion (Application No. PCT/JP2008/053121) dated May 13, 2008.
Tsutsui.T et al., "High Quantum Efficiency in Organic Light-Emitting Devices With Iridium-Complex as a Triplet Emissive Center,", Jpn. J. Appl. Phys. (Japanese Jouranl of Applied Physics), Dec. 15, 1999, vol. 39, Part 2, No. 12B, pp. 1502-1504.
Adachi.C et al., "High-Efficiency Red Electrophosphorescence Devices,", Appl. Phys. Lett. (Applied Physics Letters) , Mar. 12, 2001, vol. 78, No. 11, pp. 1622-1624.

* cited by examiner

*Primary Examiner* — Marie R Yamnitzky
*Assistant Examiner* — Michael H Wilson
(74) *Attorney, Agent, or Firm* — Eric J. Robinson; Robinson Intellectual Property Law Office, P.C.

(57) ABSTRACT

It is an object to provide a light-emitting element with high luminous efficiency by using a hole transporting substance with a sufficiently high $T_1$ level. Further, it is another object to provide a light-emitting device and an electronic appliance with low power consumption by using a hole transporting substance with a sufficiently high $T_1$ level. The present invention provides a light-emitting element which has a first layer containing a spiro-9,9'-bifluorene derivative in which one amino group is combined and a second layer containing a phosphorescent compound between an anode and a cathode.

19 Claims, 25 Drawing Sheets

LIGHT-EMITTING ELEMENT USING SPIROFLUORENE DERIVATIVE AND ELECTRONIC APPLIANCE

TECHNICAL FIELD

The present invention relates to a light-emitting element using a spirofluorene derivative. Further, the present invention relates to a light-emitting device using the light-emitting element. Furthermore, the present invention relates to an electronic appliance using the light-emitting device.

BACKGROUND ART

An organic compound is brought into an excited state by absorbing light. Through this excited state, various reactions (such as photochemical reactions) are caused in some cases, or luminescence is generated in some cases. Therefore, various applications of an organic compound have been made.

As one example of the photochemical reactions, a reaction of singlet oxygen with an unsaturated organic molecule (oxygen addition) is known (see Non-Patent Document 1: Tetsuo TSUTSUI, and eight others, Japanese Journal of Applied Physics vol. 38, L1502 to L1504, 1999, for example). Since the ground state of an oxygen molecule is a triplet state, oxygen in a singlet state (singlet oxygen) is not generated by direct photoexcitation. However, in the presence of another triplet excited molecule, singlet oxygen is generated, which can lead to an oxygen addition reaction. In this case, a compound capable of forming the triplet excited molecule is referred to as a photosensitizer.

As described above, in order to generate singlet oxygen, a photosensitizer capable of forming a triplet excited state by photoexcitation is necessary. However, since the ground state of an ordinary organic compound is a singlet state, photoexcitation to a triplet excited state is a forbidden transition, and a triplet excited molecule is not easily generated. Therefore, as such a photosensitizer, a compound in which intersystem crossing from the singlet excited state to the triplet excited state easily occurs (or a compound which allows the forbidden transition of photoexcitation directly to the triplet excited state) is required. In other words, such a compound can be used as a photosensitizer and is useful.

Also, such a compound often emits phosphorescence. The phosphorescence is luminescence generated by a transition between energies of different multiplicity and, in an ordinary organic compound, the phosphorescence indicates luminescence generated in returning from the triplet excited state to the singlet ground state (in contrast, luminescence generated in returning from a singlet excited state to the singlet ground state is referred to as fluorescence). Application fields of a compound capable of emitting phosphorescence, that is, a compound capable of converting a triplet excited state into luminescence (hereinafter, referred to as a phosphorescent compound), include a light-emitting element using an organic compound as a light-emitting substance.

This light-emitting element has a simple structure in which a light-emitting layer containing an organic compound that is a light-emitting substance is provided between electrodes. This light-emitting element has been attracting attention as a next-generation flat panel display element in terms of characteristics such as being thin and light in weight, high speed response, and direct current low voltage driving. In addition, a display device using this light-emitting element is superior in contrast and image quality, and has wide viewing angle.

The light emission mechanism of a light-emitting element in which an organic compound is used as a light-emitting substance is a carrier injection type. That is, by applying voltage with a light-emitting layer interposed between electrodes, electrons and holes injected from the electrodes are recombined to make the light-emitting substance excited, and light is emitted when the excited state returns to the ground state. As the type of the excited state, as in the case of photoexcitation described above, a singlet excited state (S*) and a triplet excited state (T*) are possible. Further, the statistical generation ratio thereof in a light-emitting element is considered to be S*:T*=1:3.

As for a compound capable of converting a singlet excited state to luminescence (hereinafter, referred to as a fluorescent compound), luminescence from a triplet excited state (phosphorescence) is not observed but only luminescence from a singlet excited state (fluorescence) is observed at a room temperature. Accordingly, the internal quantum efficiency (the ratio of generated photons to injected carriers) in a light-emitting element using a fluorescent compound is assumed to have a theoretical limit of 25% based on S*:T*=1:3.

On the other hand, when the phosphorescent compound described above is used, the internal quantum efficiency can be improved to 75 to 100% in theory. That is, a light emission efficiency that is 3 to 4 times as high as that of the fluorescence compound can be achieved. For these reasons, in order to achieve a highly-efficient light-emitting element, a light-emitting element using a phosphorescent compound has been developed actively recently (for example, see Non-Patent Document 1: Tetsuo TSUTSUI, and eight others, Japanese Journal of Applied Physics vol. 38, L1502 to L1504, 1999; and Non-Patent Document 2: Chihaya Adachi, and five others, Applied physics Letters vol. 78, No. 11, 1622 to 1624, 2001.).

DISCLOSURE OF INVENTION

The organometallic complex disclosed in Non-Patent Document 1 or 2 is a phosphorescent compound and the organometallic complex easily generates luminescence (phosphorescence) from a triplet excited state; thus a light-emitting element with high luminous efficiency is expected to be obtained by using the organometallic complex for the light-emitting element. In order to make such a light-emitting element emit light with high efficiency, a substance of which a level of triplet excitation energy ($T_1$ level) is sufficiently high is required to be used for a hole-transporting layer which is in contact with a light-emitting layer containing a phosphorescent compound. However, there are a very small number of substances that have a sufficiently high $T_1$ level and a high hole-transporting property and can be used for a light-emitting element. Note that triplet excitation energy is an energy difference between the ground state and a triplet excited state.

In view of the above, it is an object of the present invention to provide a light-emitting element with high luminous efficiency in which a hole-transporting substance with a sufficiently high $T_1$ level is used.

Further, it is another object of the present invention to provide a light-emitting device and an electronic appliance with low power consumption by using the light-emitting element of the present invention.

As a result of keen examinations, the present inventors found that when a spiro-9,9'-bifluorene derivative to which one amino group is bonded has a high $T_1$ level and a high hole-transporting property. Then, the present inventors found that the light-emitting element includes the light-emitting layer containing a phosphorescent compound and a layer containing the spiro-9,9'-bifluorene derivative, a light-emitting element with high luminous efficiency can be obtained.

Accordingly, in an aspect of the present invention, the light-emitting element includes a first layer containing the spiro-9,9'-bifluorene derivative to which one amino group is bonded and a second layer containing a phosphorescent compound between an anode and a cathode.

Among the spiro-9,9'-bifluorene derivatives, the spiro-9,9'-bifluorene derivative whose 2 position is bonded to one amino group has a sufficiently high $T_1$ level and thermophysical property. Therefore, in an aspect of the present invention, the light-emitting element preferably has the first layer containing the spiro-9,9'-bifluorene derivative whose 2 position is bonded to one amino group and the second layer containing a phosphorescent compound between an anode and a cathode.

Further, in the above-described light-emitting element, specifically, a light-emitting element is preferable in which the amino group is substituted by a substituted or unsubstituted aryl group, or the amino group is substituted by a substituted or unsubstituted heterocyclic group.

The amino group has a hole-transporting property; therefore, in the above-described light-emitting element, the first layer is preferably provided at the anode side with respect to the second layer.

Since a $T_1$ level of the first layer is high, a light-emitting element in which the first layer is adjacent to the second layer can achieve especially high luminous efficiency. Accordingly, the light-emitting element is preferable in which the first layer is adjacent to the second layer.

In another aspect of the present invention, a light-emitting element is preferable which includes a first layer containing a spirofluorene derivative represented by the following general formula (1) and a second layer containing a phosphorescent compound between an anode and a cathode.

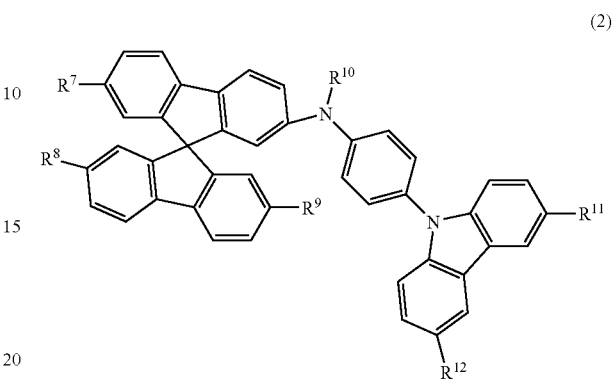

(2)

(Note that, in the formula, $R^7$ is any one of hydrogen and an alkyl group having 1 to 4 carbon atoms. Each of $R^8$ and $R^9$ is any one of hydrogen and an alkyl group having 1 to 4 carbon atoms and $R^8$ and $R^9$ may be identical or different. $R^{10}$ is an aryl group having 6 to 15 carbon atoms. Each of $R^{11}$ and $R^{12}$ is any one of hydrogen, an alkyl group having 1 to 4 carbon atoms, and an aryl group having 6 to 15 carbon atoms and $R^{11}$ and $R^{12}$ may be identical or different.)

Further, in another aspect of the present invention, a light-emitting element is preferable which includes a first layer containing a spirofluorene derivative represented by the following general formula (3) and a second layer containing a phosphorescent compound between an anode and a cathode.

(1)

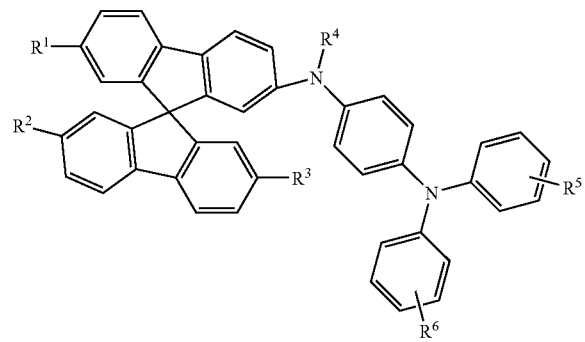

(3)

(Note that, in the formula, $R^1$ is any one of hydrogen and an alkyl group having 1 to 4 carbon atoms. Each of $R^2$ and $R^3$ is any one of hydrogen and an alkyl group having 1 to 4 carbon atoms and $R^2$ and $R^3$ may be identical or different. $R^4$ is an aryl group having 6 to 15 carbon atoms. Each of $R^5$ and $R^6$ is any one of hydrogen, an alkyl group having 1 to 4 carbon atoms, and an aryl group having 6 to 15 carbon atoms and $R^5$ and $R^6$ may be identical or different.)

Further, in another aspect of the present invention, a light-emitting element is preferable which includes a first layer containing a spirofluorene derivative represented by the fol- (Note that, in the formula, $R^{13}$ is any one of hydrogen and an alkyl group having 1 to 4 carbon atoms. Each of $R^{14}$ and $R^{15}$ is any one of hydrogen and an alkyl group having 1 to 4 carbon atoms and $R^{14}$ and $R^{15}$ may be identical or different. $R^{16}$ is an aryl group having 6 to 15 carbon atoms. $R^{17}$ is any one of hydrogen, an alkyl group having 1 to 4 carbon atoms, and an aryl group having 6 to 15 carbon atoms. $R^{18}$ is any one of an alkyl group having 1 to 4 carbon atoms and an aryl group having 6 to 15 carbon atoms.)

In another aspect of the present invention, a light-emitting element is preferable which includes a first layer containing a spirofluorene derivative represented by the following general formula (4) and a second layer containing a phosphorescent compound between an anode and a cathode.

(4)

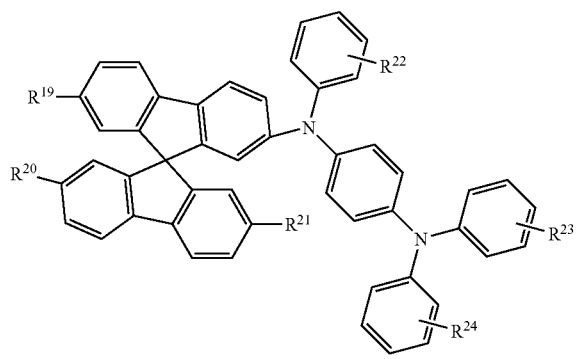

(Note that, in the formula, $R^{19}$ is any one of hydrogen and an alkyl group having 1 to 4 carbon atoms. Each of $R^{20}$ and $R^{21}$ is any one of hydrogen and an alkyl group having 1 to 4 carbon atoms and $R^{20}$ and $R^{21}$ may be identical or different. $R^{22}$ is any one of hydrogen, an alkyl group having 1 to 4 carbon atoms, and an aryl group having 6 to 15 carbon atoms. Each of $R^{23}$ and $R^{24}$ is any one of hydrogen, an alkyl group having 1 to 4 carbon atoms, and an aryl group having 6 to 15 carbon atoms and $R^{23}$ and $R^{24}$ may be identical or different.)

In another aspect of the present invention, a light-emitting element is preferable which includes a first layer containing a spirofluorene derivative represented by the following general formula (5) and a second layer containing a phosphorescent compound between an anode and a cathode.

(5)

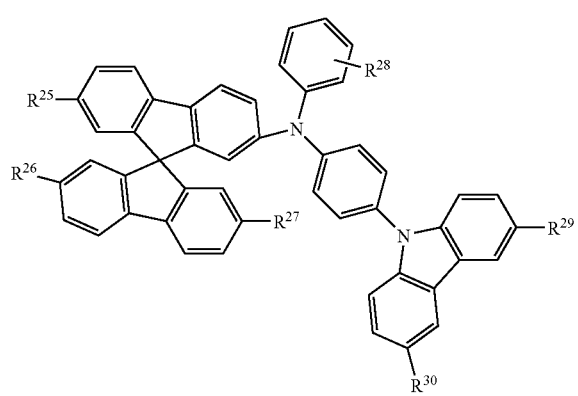

(Note that, in the formula, $R^{25}$ is any one of hydrogen and an alkyl group having 1 to 4 carbon atoms. Each of $R^{26}$ and $R^{27}$ is any one of hydrogen and an alkyl group having 1 to 4 carbon atoms and $R^{26}$ and $R^{27}$ may be identical or different. $R^{28}$ is any one of hydrogen, an alkyl group having 1 to 4 carbon atoms, and an aryl group having 6 to 15 carbon atoms. Each of $R^{29}$ and $R^{30}$ is any one of hydrogen, an alkyl group having 1 to 4 carbon atoms, and an aryl group having 6 to 15 carbon atoms and $R^{29}$ and $R^{30}$ may be identical or different.)

In another aspect of the present invention, a light-emitting element is preferable which includes a first layer containing a spirofluorene derivative represented by the following general formula (6) and a second layer containing a phosphorescent compound between an anode and a cathode.

(6)

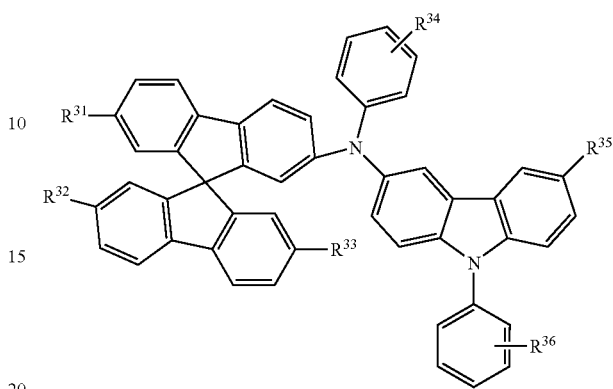

(Note that, in the formula, $R^{31}$ is any one of hydrogen and an alkyl group having 1 to 4 carbon atoms. Each of $R^{32}$ and $R^{33}$ is any one of hydrogen and an alkyl group having 1 to 4 carbon atoms and $R^{32}$ and $R^{33}$ may be identical or different. $R^{34}$ is any one of hydrogen, an alkyl group having 1 to 4 carbon atoms and an aryl group having 6 to 15 carbon atoms. $R^{35}$ is any one of hydrogen, an alkyl group having 1 to 4 carbon atoms, and an aryl group having 6 to 15 carbon atoms. $R^{36}$ is any one of hydrogen, an alkyl group having 1 to 4 carbon atoms and an aryl group having 6 to 15 carbon atoms.)

In another aspect of the present invention, a light-emitting element is preferable which includes a first layer containing a spirofluorene derivative represented by the following general formula (7) and a second layer containing a phosphorescent compound between an anode and a cathode.

(7)

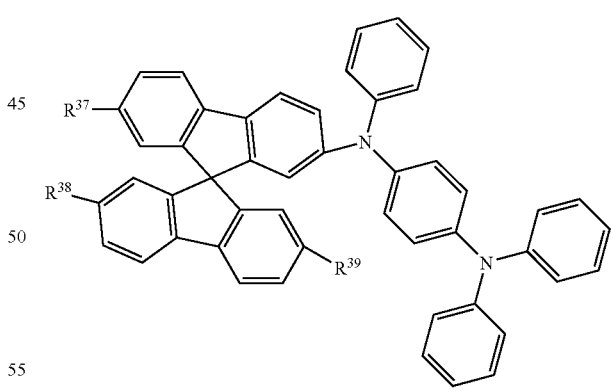

(Note that, in the formula, $R^{37}$ is any one of hydrogen and an alkyl group having 1 to 4 carbon atoms. Each of $R^{38}$ and $R^{39}$ is any one of hydrogen and an alkyl group having 1 to 4 carbon atoms and $R^{38}$ and $R^{39}$ may be identical or different.)

In another aspect of the present invention, a light-emitting element is preferable which includes a first layer containing a spirofluorene derivative represented by the following general formula (8) and a second layer containing a phosphorescent compound between an anode and a cathode.

(8)

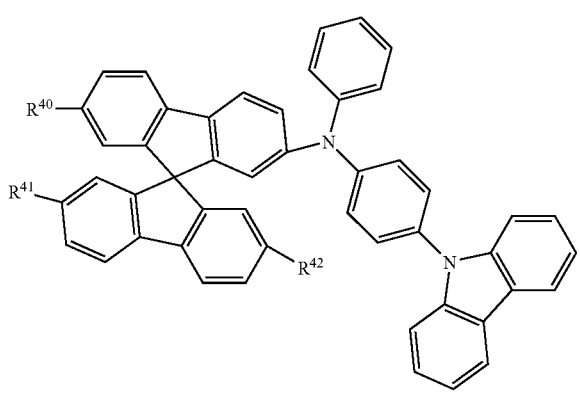

(Note that, in the formula, $R^{40}$ is any one of hydrogen and an alkyl group having 1 to 4 carbon atoms. Each of $R^{41}$ and $R^{42}$ is any one of hydrogen and an alkyl group having 1 to 4 carbon atoms and $R^{41}$ and $R^{42}$ may be identical or different.)

In another aspect of the present invention, a light-emitting element is preferable which includes a first layer containing a spirofluorene derivative represented by the following general formula (9) and a second layer containing a phosphorescent compound between an anode and a cathode.

(9)

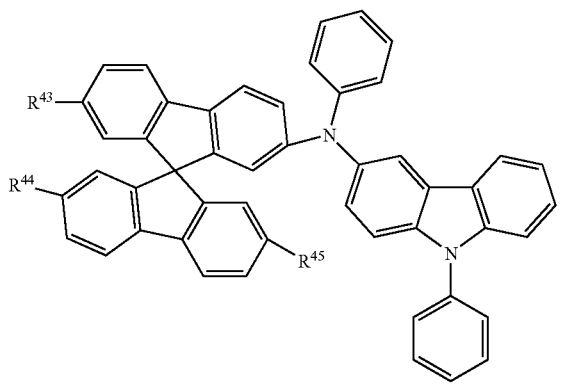

(Note that, in the formula, $R^{43}$ is any one of hydrogen and an alkyl group having 1 to 4 carbon atoms. Each of $R^{44}$ and $R^{45}$ is any one of hydrogen and an alkyl group having 1 to 4 carbon atoms and $R^{44}$ and $R^{45}$ may be identical or different.)

In another aspect of the present invention, a light-emitting element is preferable which includes a first layer containing a spirofluorene derivative represented by the following general formula (10) and a second layer containing a phosphorescent compound between an anode and a cathode.

(10)

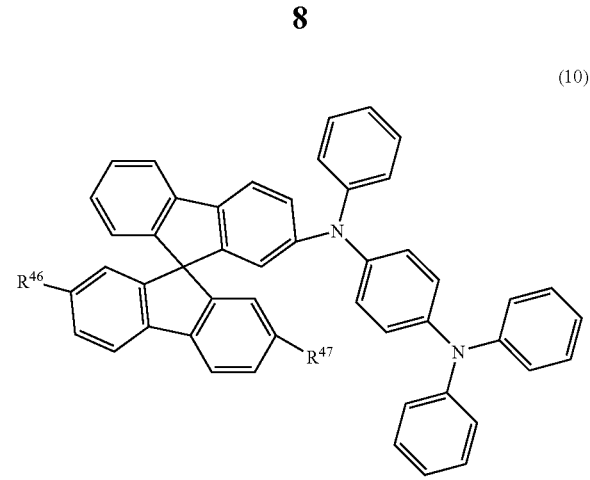

(Note that, in the formula, each of $R^{46}$ and $R^{47}$ is any one of hydrogen and an alkyl group having 1 to 4 carbon atoms and $R^{46}$ and $R^{47}$ may be identical or different.)

In another aspect of the present invention, a light-emitting element is preferable which includes a first layer containing a spirofluorene derivative represented by the following general formula (11) and a second layer containing a phosphorescent compound between an anode and a cathode.

(11)

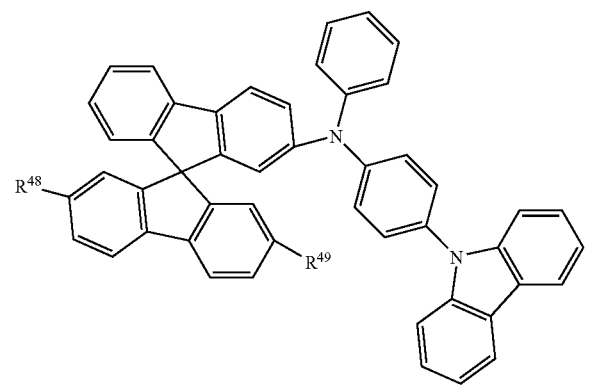

(Note that, in the formula, each of $R^{48}$ and $R^{49}$ is any one of hydrogen and an alkyl group having 1 to 4 carbon atoms and $R^{48}$ and $R^{49}$ may be identical or different.)

In another aspect of the present invention, a light-emitting element is preferable which includes a first layer containing a spirofluorene derivative represented by the following general formula (12) and a second layer containing a phosphorescent compound between an anode and a cathode.

(12)

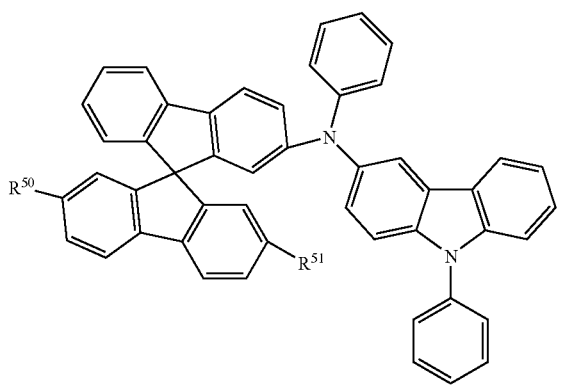

(Note that, in the formula, each of $R^{50}$ and $R^{51}$ is any one of hydrogen and an alkyl group having 1 to 4 carbon atoms and $R^{50}$ and $R^{51}$ may be identical or different.)

In another aspect of the present invention, a light-emitting element is preferable which includes a first layer containing a spirofluorene derivative represented by the following general formula (13) and a second layer containing a phosphorescent compound between an anode and a cathode.

(13)

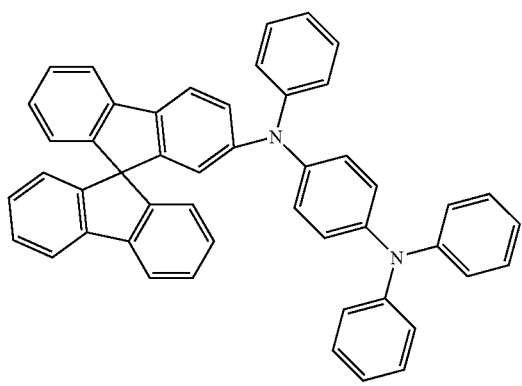

In another aspect of the present invention, a light-emitting element is preferable which includes a first layer containing a spirofluorene derivative represented by the following general formula (14) and a second layer containing a phosphorescent compound between an anode and a cathode.

(14)

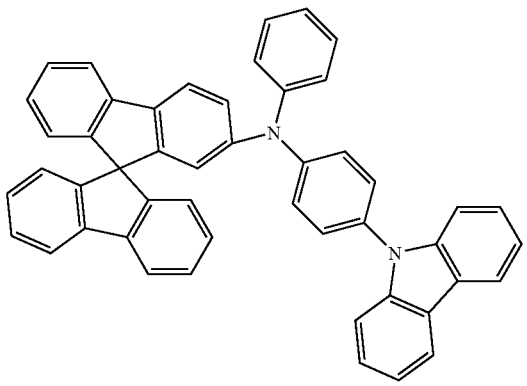

In another aspect of the present invention, a light-emitting element is preferable which includes a first layer containing a spirofluorene derivative represented by the following general formula (15) and a second layer containing a phosphorescent compound between an anode and a cathode.

(15)

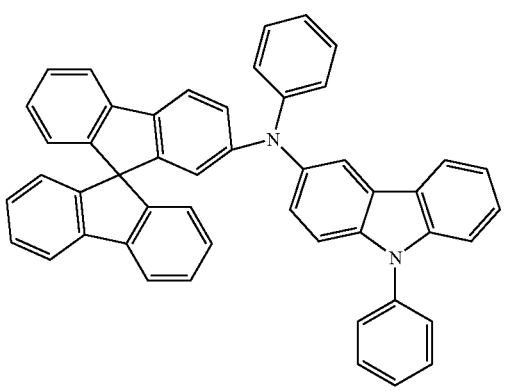

In the above-described light-emitting element, the first layer is preferably provided at the anode side with respect to the second layer.

In the above-described light-emitting element, the first layer is preferably adjacent to the second layer.

High luminous efficiency can be realized in the light-emitting element of the present invention thus obtained; therefore, a light-emitting device using the light-emitting element (an image display device or a light-emitting device) can also realize low power consumption. Accordingly, the present invention also includes a light-emitting device using the light-emitting element. Further, the present invention also includes an electronic appliance using the light-emitting device.

The light-emitting device of the present invention includes the light-emitting element of the present invention and a controller which controls light emission of the light-emitting element. In this specification, the term "light-emitting device" includes an image display device including a light-emitting element or a light-emitting device. Further, the category of the light-emitting device of the present invention includes a module including a substrate provided with a light-emitting element, attached with a connector, for example, a tape automated bonding (TAB) tape such as an anisotropic conductive film or a tape carrier package (TCP); a module in which a printed wiring board is provided at an end of the connector; or a module in which an integrated circuit (IC) is directly mounted on a substrate, provided with a light-emitting element, by a chip on glass (COG) method.

The electronic appliance of the present invention has a display portion provided with the above-described light-emitting element and the controller which controls light emission of the light-emitting element.

The light-emitting element of the present invention includes the spiro-9,9'-bifluorene derivative with a high hole-transporting property and high $T_1$ level, so that the light-emitting element with high luminous efficiency and low power consumption can be obtained.

A light-emitting device and an electronic appliance with high luminous efficiency and low power consumption can be obtained by using the light-emitting element of the present invention.

BEST MODE FOR CARRYING OUT THE INVENTION

Figure 1:
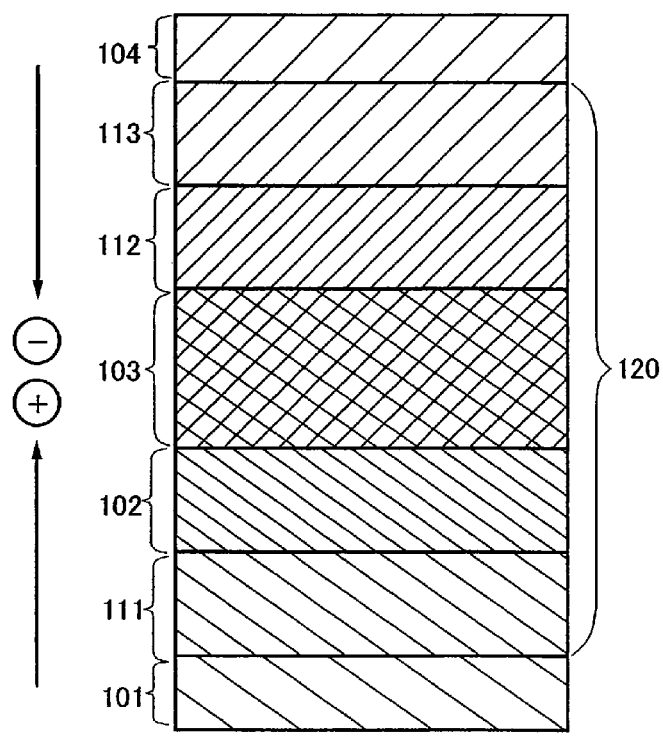
FIG. 1 is a view illustrating a light-emitting element of the present invention.

Hereinafter, the present invention will be explained in detail with reference to drawings. However, the present invention is not limited to the description below, and those skilled in the art will appreciate that a variety of modifications can be made to the modes and details without departing from the spirit and scope of the present invention. Accordingly, the present invention should not be construed as being limited to the description of the embodiment modes below.

Embodiment Mode 1

In Embodiment Mode 1, a concept of a light-emitting element of the present invention will be explained.

In recent years, the present inventors have focused on phosphorescent compounds to achieve high performance of light-emitting elements and examined light-emitting elements using a wide variety of phosphorescent compounds. As one result thereof, the present inventors have found that by using a spiro-9,9'-bifluorene derivative to which one amino group is bonded is used, a light-emitting element containing a phosphorescent compound can provide light emission with very high efficiency compared to light-emitting elements using a phosphorescent compound which have been reported so far.

Through the property evaluation made by the present inventors, it was found that the $T_1$ level of the spiro-9,9'-bifluorene derivative is high. That is, it was found that triplet excitation energy is difficult to transfer from other layers to a layer including the spiro-9,9'-bifluorene derivative. Therefore, there is little concern that excitation energy from a light-emitting layer transfers even if emission color of phosphorescence from the light-emitting layer is an emission color with large light emission energy like blue to green.

The spiro-9,9'-bifluorene derivative has a high hole-transporting property and is suitable for a material of a hole-transporting layer. Further, it was found that the lowest unoccupied molecular orbital (LUMO) level of the spiro-9,9'-bifluorene derivative is relatively high. That is, penetration of electrons from one layer to the other layer can be prevented by the layer containing the spiro-9,9'-bifluorene derivative.

Further, it was found that the spiro-9,9'-bifluorene derivative is a material with a high glass transition temperature (Tg) and high heat resistance. Therefore, a light-emitting element with high heat resistance can be obtained.

The present inventors found from an experiment result that the high $T_1$ level, the high hole-transporting property, the high electron blocking property and the high heat resistant property peculiar to the spiro-9,9'-bifluorene derivative provide many advantages when the light-emitting element is manufactured.

In a case in which a light-emitting element using a phosphorescent compound in the light-emitting layer is manufactured, when the hole-transporting layer is formed using a general hole-transporting material, since the $T_1$ level of the hole-transporting material is lower than that of the phosphorescent compound or a host material thereof; triplet excitation energy is easy to transfer to the hole-transporting layer which is adjacent to the light-emitting layer. However, the $T_1$ level of the spiro-9,9'-bifluorene derivative with high hole-transporting property is high; therefore, the triplet excitation energy is difficult to transfer from the light-emitting layer. Accordingly, a light-emitting element with high luminous efficiency or high color purity can be obtained.

Penetration of electrons from the light-emitting layer to other layer can be prevented by using the spiro-9,9'-bifluorene derivative with high LUMO level as the hole-transporting layer which is adjacent to the light-emitting layer; therefore, electrons and holes can efficiently be recombined in the light-emitting layer and a light-emitting element with high luminous efficiency can be obtained.

Embodiment Mode 2

In Embodiment Mode 2, a structure of a light-emitting element of the present invention will be explained with reference to FIG. 1.

FIG. 1 is a view illustrating a light-emitting element having a layer 120 containing an organic compound between a first electrode 101 and a second electrode 104. The layer 120 containing an organic compound includes a first layer 102 containing a spiro-9,9'-bifluorene derivative and a second layer 103 containing a phosphorescent compound.

Here, the second layer 103 containing a phosphorescent compound is preferably a layer in which a substance with triplet excitation energy larger than that of the phosphorescent compound is used as a host material and the phosphorescent compound is dispersed as a guest material. Dispersing the phosphorescent compound which is a substance serving as an emission center can prevent light emitted from the phosphorescent compound from being quenched due to the concentration.

A phosphorescent compound is not limited; however, an organometallic complex such as bis[2-(3,5-bis(trifluoromethyl)phenyl)pyridinato-N,$C^{2'}$]iridium(III)picolinate (abbrev.: Ir($CF_3$ppy)$_2$(pic)), bis[2-(4,6-difluorophenyl)pyridinato-N,$C^{2'}$]iridium(III)acetylacetonate (abbrev.: FIr(acac)), bis[2-(4,6-difluorophenyl)pyridinato-N,$C^{2'}$]iridium(III)picolinate (FIr(pic)), bis[2-(4',6'-difluorophenyl)pyridinato-N,$C^{2'}$]iridium(III)tetra(1-pyrazolyl)borate (abbrev.: FIr$_6$), tris(2-phenylpyridinato-N,$C^{2'}$)iridium (abbrev.: Ir(ppy)$_3$), (acetylacetonato)bis(2-phenylpyridinato)iridium (III) (abbrev.: Ir(ppy)$_2$(acac)), bis(1,2-diphenyl-1H-benzimidazolato)iridium(III)acetylacetonate (abbrev.: Ir(pbi)$_2$(acac)), bis(benzo[h]quinolinato)iridium(III)acetylacetonate (abbrev.: Ir(bzq)$_2$(acac)), bis(2,4-diphenyl-1,3-oxazolato-N,$C^{2'}$)iridium(III)acetylacetonate (abbrev.: Ir(dpo)$_2$(acac)), bis[2-(4'-perfluorophenylphenyl)pyridinato]iridium(III) acetylacetonate (abbrev.: Ir(p-PF-ph)$_2$(acac)), bis(2-phenylbenzothiazolato-N,$C^{2'}$)iridium(III)acetylacetonate (abbrev.: Ir(bt)$_2$(acac)), tris(2-phenylquinolinato-N,$C^{2'}$)iridium(III) (abbrev.: Ir(pq)$_3$), bis(2-phenylquinolinato-N,$C^{2'}$) iridium(III)acetylacetonate (abbrev.: Ir(pq)$_2$(acac)), bis[2-(2'-benzo[4,5-α]thienyl)pyridinato-N,$C^{3'}$)iridium(III) acetylacetonate (abbrev.: Ir(btp)$_2$(acac)), bis(1-phenylisoquinolinato-N,$C^{2'}$)iridium(III)acetylacetonate (abbrev.: Ir(piq)$_2$(acac)), tris(1-phenylisoquinolinato-N,$C^{2'}$) iridium(III) (abbrev.: Ir(piq)$_3$), (acetylacetonato)bis[2,3-bis(4-fluorophenyl)quinoxalinato]iridium(III) (abbrev.: Ir(Fdpq)$_2$(acac)), or 2,3,7,8,12,13,17,18-octaethyl-21H,23H-porphyrinplatinum(II) (abbrev.: PtOEP), can be given. In addition, a rare-earth metal complex such as tris(acetylacetonato)(monophenanthroline)terbium(III) (abbrev.: Tb(acaC)$_3$(Phen)), tris(1,3-diphenyl-1,3-propanedionato)(monophenanthroline)europium(III) (abbrev.: Eu(DBM)$_3$ (Phen)), or tris[1-(2-thenoyl)-3,3,3-trifluoroacetonato](monophenanthroline)europium (III) (abbrev.: Eu(TTA)$_3$ (Phen)) performs light emission (electron transition between different multiplicities) from a rare-earth metal ion; therefore, such a rare-earth metal complex can be used as a phosphorescent compound of the present invention. From that viewpoint, phosphor of an inorganic compound such as metal oxide to which rare-earth is added can also be used. Note that the first layer 102 includes the spiro-9,9'-bifluorene derivative; therefore, even if a phosphorescent compound which provide green light emission or blue light emission or a phosphorescent compound which has a peak of the emission spectrum from 440 nm to 540 nm is used in the second layer 103, transfer of energy can be suppressed, so that high luminous efficiency can be achieved. As such a phosphorescent compound, for example, Ir($CF_3$ppy)$_2$(pic), FIr(acac), FIr(pic), FIr$_6$, Ir(ppy)$_3$, Ir(ppy)$_2$(acac), Ir(pbi)$_2$(acac), or the like can be given.

A substance for putting a phosphorescent compound into a dispersion state (that is, a host material) is not particularly limited; however, in addition to a compound having an arylamine skeleton such as 4,4'-bis[N-(1-naphthyl)-N-phenylamino]biphenyl (abbrev.: NPB), a carbazole derivative such as 4,4'-di(N-carbazolyl)biphenyl (abbrev.: CBP) or 4,4',4''-tris(N-carbazolyl)triphenylamine (abbrev.: TCTA); or a metal complex such as bis[2-(2-hydroxyphenyl)pyridinato]zinc (abbrev.: Znpp$_2$), bis[2-(2-hydroxyphenyl)benzoxazolato]zinc (abbrev.: Zn(PBO)$_2$), bis(2-methyl-8-quinolinolato)(4-phenylphenolato)aluminum (abbrev.: BAlq) or tris(8-quinolinolato)aluminum (abbrev.: Alq$_3$) is preferably used. Further, as a substance for putting a phosphorescent compound into a dispersion state, a high molecular compound may be used. In this case, a solution obtained by dissolving a phosphorescent compound and a high molecular compound in an appropriate solvent is applied by a wet method such as ink-jet method or a spin coating method to form the second layer 103. Examples of the solvent include tetrahydrofran (THF), acetonitrile, dichloromethane, dichloroethane, toluene, xylene, or a mixed solvent thereof as well as lower alcohol such as methanol, ethanol, propanol, butanol, or sec-butanol, but the solvent is not limited thereto. Examples of the high molecular compound include a hole transporting high molecular compound such as poly(N-vinylcarbazole) (abbrev.: PVK), poly(4-vinyltriphenylamine) (abbrev.: PVTPA), poly[N-(4-{N'-[4-(4-diphenylamino)phenyl]phenyl-N'-phenylamino}phenyl)methacrylamide] (abbrev.: PTPDMA), or poly[N,N'-bis(4-butylphenyl)-N,N'-bis(phenyl)benzidine (abbrev.: Poly-TPD). An electron transporting high molecular compound such as poly[(9,9-dihexylfluorene-2,7-diyl)-co-(pyridin-3,5-diyl)] (abbrev.: PF-Py) or poly[(9,9-dioctylfluorene-2,7-diyl)-co-(2,2'-pyridin-6,6-diyl)] (abbrev.: PF-BPy) can alternatively be used as the high molecular compound.

Note that the second layer 103 can be formed by a sputtering method or an evaporation method, for example. Further, the second layer 103 can be formed by a wet method such as an ink-jet method or a spin coating method as well.

The first layer 102 containing the spiro-9,9'-bifluorene derivative is formed so as to be adjacent to the second layer 103. Now, the spiro-9,9'-bifluorene derivative used for the first layer 102 will be explained.

Among the spiro-9,9'-bifluorene derivatives used for the first layer 102, the spiro-9,9'-bifluorene derivative whose 2 position is bonded to one amino group has a sufficiently high $T_1$ level and thermophysical property.

Further, in the above-described spiro-9,9'-bifluorene derivative, specifically, the amino group is substituted by a substituted or unsubstituted aryl group, or the amino group is substituted by a substituted or unsubstituted heterocyclic group.

The spiro-9,9'-bifluorene derivative used for the first layer 102 is represented by the following general formula (1).

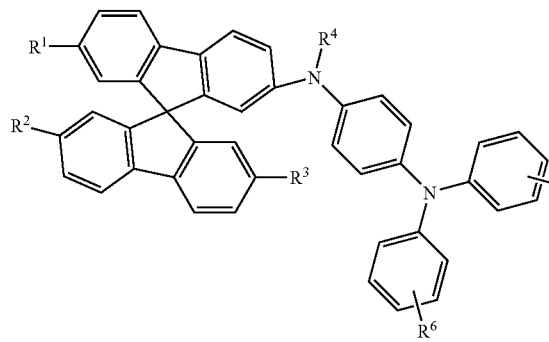

(1)

In the formula, $R^1$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As $R^1$, any one of hydrogen and a tert-butyl group is preferably used in particular.

In the formula, each of $R^2$ and $R^3$ is any one of hydrogen or an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As $R^2$ and $R^3$, hydrogen or a tert-butyl group is preferably used in particular. Note that $R^2$ and $R^3$ may be identical or different.

In the formula, $R^4$ is an aryl group having 6 to 15 carbon atoms. As the aryl group having 6 to 15 carbon atoms, a phenyl group, an o-biphenyl group, an m-biphenyl group, a p-biphenyl group, a fluoren-2-yl group, a 9,9-dimethylfluoren-2-yl group, a naphthyl group, or the like can be used. In order to make the spiro-9,9'-bifluorene derivative represented by the general formula (1) into a compound having a larger energy gap, $R^4$ is preferably a group which does not have a condensed ring skeleton, selected from among aryl groups having 6 to 15 carbon atoms. Each of the aryl groups having 6 to 15 carbon atoms may have a substituent, and an alkyl group having 1 to 4 carbon atoms or an aryl group having 6 to 15 carbon atoms can be used as the substituent. As the alkyl group having 1 to 4 carbon atoms, specifically, a methyl group, an ethyl group, a propyl group, an iso-propyl group, a butyl group, an iso-butyl group, a sec-butyl group, a tert-butyl group, or the like can be used. As the aryl group having 6 to 15 carbon atoms, specifically, a phenyl group, an o-biphenyl group, an m-biphenyl group, a p-biphenyl group, a fluoren-2-yl group, a 9,9-dimethylfluoren-2-yl group, a naphthyl group, or the like can be used. As $R^4$, an unsubstituted phenyl group is particularly preferable.

In the formula, each of $R^5$ and $R^6$ is any one of hydrogen, an alkyl group having 1 to 4 carbon atoms, and an aryl group having 6 to 15 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As the aryl group having 6 to 15 carbon atoms, a phenyl group, an o-biphenyl group, an m-biphenyl group, a p-biphenyl group, a fluoren-2-yl group, a 9,9-dimethylfluoren-2-yl group, a naphthyl group, or the like can be given. As $R^5$ and $R^6$, hydrogen is preferably used in particular. Note that $R^5$ and $R^6$ may be identical or different and may have a substituent or no substituent.

The spiro-9,9'-bifluorene derivative used for the first layer 102 is represented by the following general formula (2).

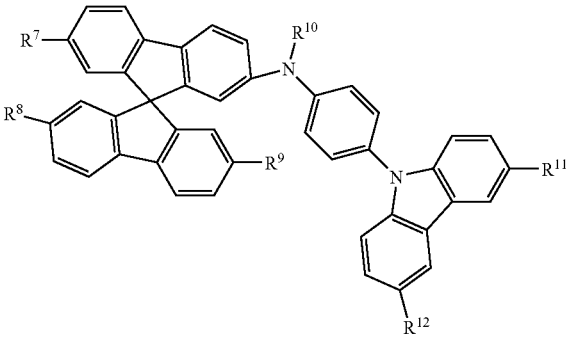

(2)

In the formula, $R^7$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As $R^7$, any one of hydrogen and a tert-butyl group is preferably used in particular.

In the formula, each of $R^8$ and $R^9$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As $R^8$ and $R^9$, hydrogen or a tert-butyl group is preferably used in particular. Note that $R^8$ and $R^9$ may be identical or different.

In the formula, $R^{10}$ is an aryl group having 6 to 15 carbon atoms. As the aryl group having 6 to 15 carbon atoms, a phenyl group, an o-biphenyl group, an m-biphenyl group, a p-biphenyl group, a fluoren-2-yl group, a 9,9-dimethylfluoren-2-yl group, a naphthyl group, or the like can be given. In order to make the spiro-9,9'-bifluorene derivative represented by General Formula 2 into a compound having a larger energy gap, $R^{10}$ is preferably a group which does not have a condensed ring skeleton. Each of the aryl groups having 6 to 15 carbon atoms may have a substituent, and an alkyl group having 1 to 4 carbon atoms or an aryl group having 6 to 15 carbon atoms can be given as the substituent. As the alkyl group having 1 to 4 carbon atoms, specifically, a methyl group, an ethyl group, a propyl group, an iso-propyl group, a butyl group, an iso-butyl group, a sec-butyl group, a tert-butyl group, or the like can be given. As the aryl group having 6 to 15 carbon atoms, specifically, a phenyl group, an o-biphenyl group, an m-biphenyl group, a p-biphenyl group, a fluoren-2-yl group, a 9,9-dimethylfluoren-2-yl group, a naphthyl group, or the like can be given. As $R^{10}$, an unsubstituted phenyl group is particularly preferable.

In the formula, each of $R^{11}$ and $R^{12}$ is any one of hydrogen, an alkyl group having 1 to 4 carbon atoms, and an aryl group having 6 to 15 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As the aryl group having 6 to 15 carbon atoms, a phenyl group, an o-biphenyl group, an m-biphenyl group, a p-biphenyl group, a fluoren-2-yl group, a 9,9-dimethylfluoren-2-yl group, a naphthyl group, or the like can be given. As $R^{11}$ and $R^{12}$, hydrogen is preferably used in particular. Note that $R^{11}$ and $R^{12}$ may be identical or different and may have a substituent or no substituent.

The spiro-9,9'-bifluorene derivative used for the first layer 102 is represented by the following general formula (3).

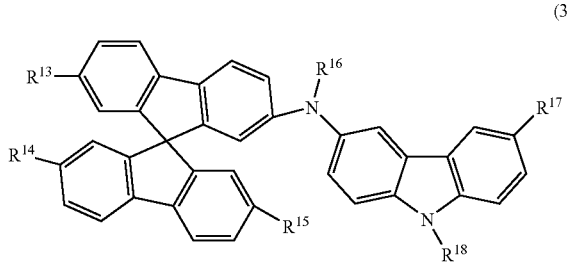

(3)

In the formula, $R^{13}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As $R^{13}$, any one of hydrogen and a tert-butyl group is preferably used in particular.

In the formula, each of $R^{14}$ and $R^{15}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As $R^{14}$ and $R^{15}$, hydrogen or a tert-butyl group is preferably used in particular. Note that $R^{14}$ and $R^{15}$ may be identical or different.

In the formula, $R^{16}$ is an aryl group having 6 to 15 carbon atoms. As the aryl group having 6 to 15 carbon atoms, a phenyl group, an o-biphenyl group, an m-biphenyl group, a p-biphenyl group, a fluoren-2-yl group, a 9,9-dimethylfluoren-2-yl group, a naphthyl group, or the like can be given. In order to make the spiro-9,9'-bifluorene derivative represented by General Formula 3 into a compound having a larger energy gap, $R^{16}$ is preferably a group which does not have a condensed ring skeleton. Each of the aryl groups having 6 to 15 carbon atoms may have a substituent, and an alkyl group having 1 to 4 carbon atoms or an aryl group having 6 to 15 carbon atoms can be given as the substituent. As the alkyl group having 1 to 4 carbon atoms, specifically, a methyl group, an ethyl group, a propyl group, an iso-propyl group, a butyl group, an iso-butyl group, a sec-butyl group, a tert-butyl group, or the like can be given. As the aryl group having 6 to 15 carbon atoms, specifically, a phenyl group, an o-biphenyl group, an m-biphenyl group, a p-biphenyl group, a fluoren-2-yl group, a 9,9-dimethylfluoren-2-yl group, a naphthyl group, or the like can be given. As $R^{16}$, an unsubstituted phenyl group is particularly preferable.

In the formula, $R^{17}$ is any one of hydrogen, an alkyl group having 1 to 4 carbon atoms, and an aryl group having 6 to 15 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As the aryl group having 6 to 15 carbon atoms, a phenyl group, an o-biphenyl group, an m-biphenyl group, a p-biphenyl group, a fluoren-2-yl group, a 9,9-dimethylfluoren-2-yl group, a naphthyl group, or the like can be given. As $R^{17}$, hydrogen is preferably used in particular. Note that $R^{17}$ may have a substituent or no substituent.

In the formula, $R^{18}$ is any one of an alkyl group having 1 to 4 carbon atoms and an aryl group having 6 to 15 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As the aryl group having 6 to 15 carbon atoms, a phenyl group, an o-biphenyl group, an m-biphenyl group, a p-biphenyl group, a fluoren-2-yl group, a 9,9-dimethylfluoren-2-yl group, a naphthyl group, or the like can be given. In order to make the spiro-9,9'-bifluorene derivative represented by the following general formula (5) into a compound having a larger energy gap, $R^{18}$ is preferably a group which does not have a condensed ring skeleton which is selected from among alkyl groups having 1 to 4 carbon atoms or aryl groups having 6 to 15 carbon atoms. Each of the aryl groups having 6 to 15 carbon atoms may have a substituent, and an alkyl group having 1 to 4 carbon atoms or an aryl group having 6 to 15 carbon atoms can be given as the substituent. As the alkyl group having 1 to 4 carbon atoms serving as the substituent, specifically, a methyl group, an ethyl group, a propyl group, an iso-propyl group, a butyl group, an iso-butyl group, a sec-butyl group, a tert-butyl group, or the like can be given. As the aryl group having 6 to 15 carbon atoms, specifically, a phenyl group, an o-biphenyl group, an m-biphenyl group, a p-biphenyl group, a fluoren-2-yl group, a 9,9-dimethylfluoren-2-yl group, a naphthyl group, or the like can be given. As $R^{18}$, an unsubstituted phenyl group is particularly preferable.

The spiro-9,9'-bifluorene derivative used for the first layer 102 is represented by the following general formula (4).

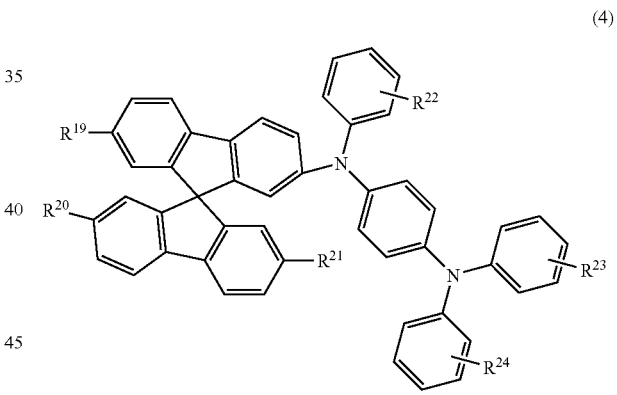

(4)

In the formula, $R^{19}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As $R^{19}$, any one of hydrogen and a tert-butyl group is preferably used in particular.

In the formula, each of $R^{20}$ and $R^{21}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{20}$ and $R^{21}$, hydrogen or a tert-butyl group is preferably used in particular. Note that $R^{20}$ and $R^{21}$ may be identical or different.

In the formula, $R^{22}$ is any one of hydrogen, an alkyl group having 1 to 4 carbon atoms and an aryl group having 6 to 15 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group or the like can be given. As the aryl group having 6 to 15 carbon atoms, specifically, a phenyl group, an o-biphenyl group, an m-biphenyl group, a p-biphenyl group, a fluoren-2-yl group, a 9,9-dimethylfluoren-2-yl group, a naphthyl group, or the like can be given. In order to make the spiro-9,9'-bifluorene derivative represented by the above general formula (4) into a compound having a larger energy gap, $R^{22}$ is preferably a group which does not have a condensed ring skeleton. As $R^{22}$, hydrogen is preferably used in particular.

In the formula, each of $R^{23}$ and $R^{24}$ is any one of hydrogen, an alkyl group having 1 to 4 carbon atoms, and an aryl group having 6 to 15 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As the aryl group having 6 to 15 carbon atoms, a phenyl group, an o-biphenyl group, an m-biphenyl group, a p-biphenyl group, a fluoren-2-yl group, a 9,9-dimethylfluoren-2-yl group, a naphthyl group, or the like can be given. As $R^{23}$ and $R^{24}$, hydrogen is preferably used in particular. Note that $R^{23}$ and $R^{24}$ may be identical or different and may have a substituent or no substituent.

The spiro-9,9'-bifluorene derivative used for the first layer 102 is represented by the following general formula (5).

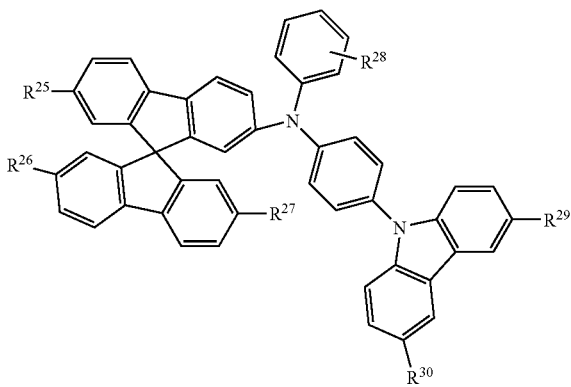

(5)

In the formula, $R^{25}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{25}$, any one of hydrogen and a tert-butyl group is preferably used in particular.

In the formula, each of $R^{26}$ and $R^{27}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{26}$ and $R^{27}$, hydrogen or a tert-butyl group is preferably used in particular. Note that $R^{26}$ and $R^{27}$ may be identical or different.

In the formula, $R^{28}$ is any one of hydrogen, an alkyl group having 1 to 4 carbon atoms and an aryl group having 6 to 15 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As the aryl group having 6 to 15 carbon atoms, specifically, a phenyl group, an o-biphenyl group, an m-biphenyl group, a p-biphenyl group, a fluoren-2-yl group, a 9,9-dimethylfluoren-2-yl group, a naphthyl group, or the like can be given. In order to make the spiro-9,9'-bifluorene derivative represented by the above general formula (5) into a compound having a larger energy gap, $R^{28}$ is preferably a group which does not have a condensed ring skeleton. As $R^{28}$, hydrogen is preferably used in particular.

In the formula, each of $R^{29}$ and $R^{30}$ is any one of hydrogen, an alkyl group having 1 to 4 carbon atoms, and an aryl group having 6 to 15 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As the aryl group having 6 to 15 carbon atoms, a phenyl group, an o-biphenyl group, an m-biphenyl group, a p-biphenyl group, a fluoren-2-yl group, a 9,9-dimethylfluoren-2-yl group, a naphthyl group, or the like can be given. As $R^{29}$ and $R^{30}$, hydrogen is preferably used in particular. Note that $R^{29}$ and $R^{30}$ may be identical or different and may have a substituent or no substituent.

The spiro-9,9'-bifluorene derivative used for the first layer 102 is represented by the following general formula (6).

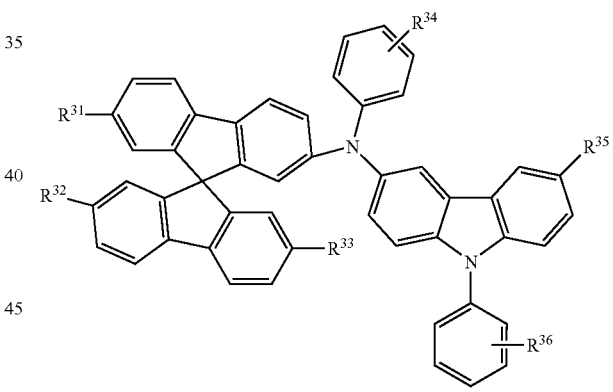

(6)

In the formula, $R^{31}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{31}$, any one of hydrogen and a tert-butyl group is preferably used in particular.

In the formula, each of $R^{32}$ and $R^{33}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{32}$ and $R^{33}$, hydrogen or a tert-butyl group is preferably used in particular. Note that $R^{32}$ and $R^{33}$ may be identical or different.

In the formula, $R^{34}$ is any one of hydrogen, an alkyl group having 1 to 4 carbon atoms and an aryl group having 6 to 15 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As the aryl group having 6 to 15 carbon atoms, specifically, a phenyl group, an o-biphenyl group, an m-biphenyl group, a p-biphenyl group, a fluoren-2-yl group, a 9,9-dimethylfluoren-2-yl group, a naphthyl group, or the like can be given. In order to make the spiro-9,9'-bifluorene derivative represented by the above general formula (6) into a compound having a larger energy gap, $R^{34}$ is preferably a group which does not have a condensed ring skeleton. As $R^{34}$, hydrogen is preferably used in particular.

In the formula, $R^{35}$ is any one of hydrogen, an alkyl group having 1 to 4 carbon atoms, and an aryl group having 6 to 15 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As the aryl group having 6 to 15 carbon atoms, a phenyl group, an o-biphenyl group, an m-biphenyl group, a p-biphenyl group, a fluoren-2-yl group, a 9,9-dimethylfluoren-2-yl group, a naphthyl group, or the like can be given. As $R^{35}$, hydrogen is preferably used in particular. Note that $R^{35}$ may have a substituent or no substituent.

The spiro-9,9'-bifluorene derivative used for the first layer 102 is represented by the following general formula (7).

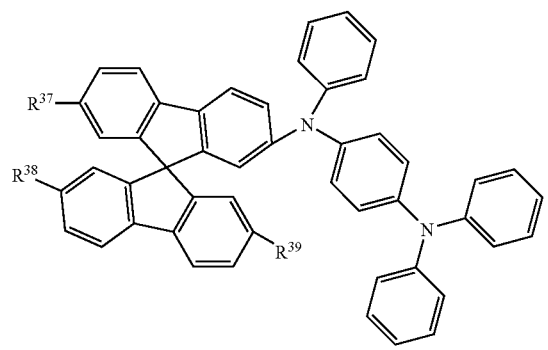

(7)

In the formula, $R^{37}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{37}$, any one of hydrogen and a tert-butyl group is preferably used in particular.

In the formula, each of $R^{38}$ and $R^{39}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{38}$ and $R^{39}$, hydrogen or a tert-butyl group is preferably used in particular. Note that $R^{38}$ and $R^{39}$ may be identical or different.

The spiro-9,9'-bifluorene derivative used for the first layer 102 is represented by the following general formula (8).

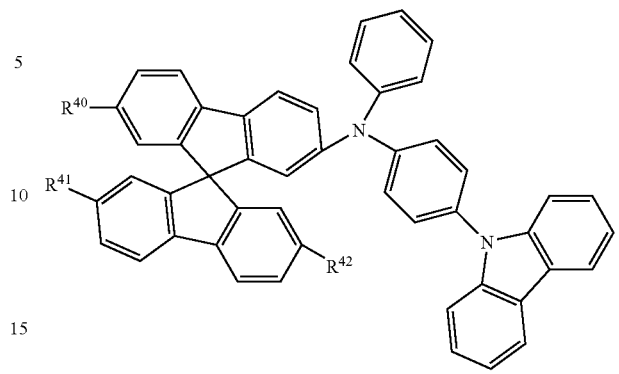

(8)

In the formula, $R^{40}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{40}$, any one of hydrogen and a tert-butyl group is preferably used in particular.

In the formula, each of $R^{41}$ and $R^{42}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{41}$ and $R^{42}$, hydrogen or a tert-butyl group is preferably used in particular. Note that $R^{41}$ and $R^{42}$ may be identical or different.

The spiro-9,9'-bifluorene derivative used for the first layer 102 is represented by the following general formula (9).

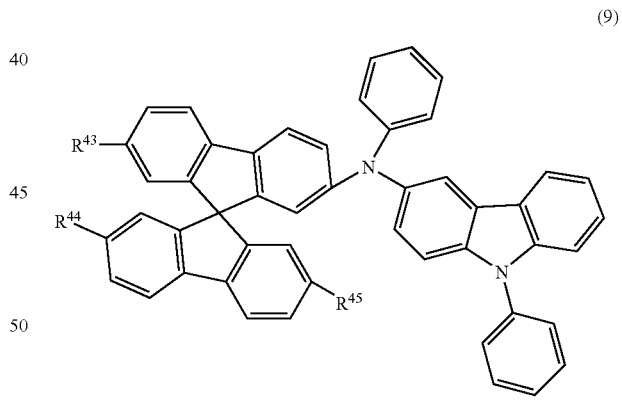

(9)

In the formula, $R^{43}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{43}$, any one of hydrogen and a tert-butyl group is preferably used in particular.

In the formula, each of $R^{44}$ and $R^{45}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{44}$ and $R^{45}$, hydrogen or a tert-butyl group is preferably used in particular. Note that $R^{44}$ and $R^{45}$ may be identical or different.

The spiro-9,9'-bifluorene derivative used for the first layer 102 is represented by the following general formula (10).

(10)

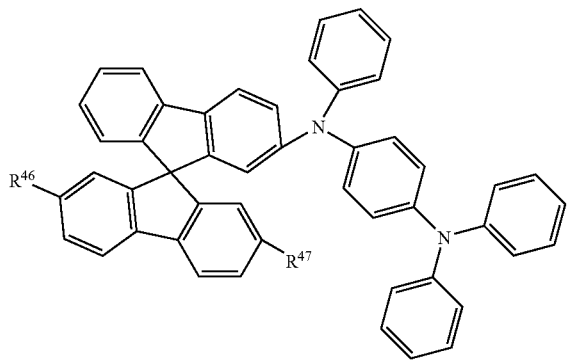

In the formula, each of $R^{46}$ and $R^{47}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{46}$ and $R^{47}$, hydrogen or a tert-butyl group is preferably used in particular. Note that $R^{46}$ and $R^{47}$ may be identical or different.

The spiro-9,9'-bifluorene derivative used for the first layer 102 is represented by the following general formula (11).

(11)

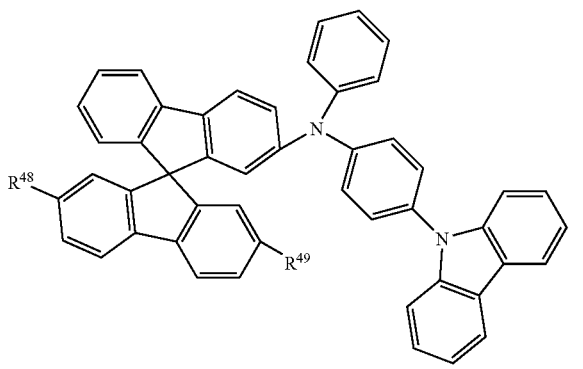

In the formula, each of $R^{48}$ and $R^{49}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{48}$ and $R^{49}$, hydrogen or a tert-butyl group is preferably used in particular. Note that $R^{48}$ and $R^{49}$ may be identical or different.

The spiro-9,9'-bifluorene derivative used for the first layer 102 is represented by the following general formula (12).

(12)

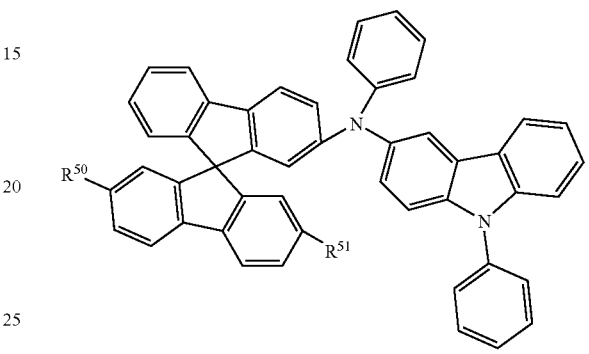

In the formula, each of $R^{50}$ and $R^{51}$ is any one of hydrogen and an alkyl group having 1 to 4 carbon atoms. As the alkyl group having 1 to 4 carbon atoms, specifically, a methyl group, an ethyl group, a propyl group, an isopropyl group, a butyl group, an isobutyl group, a sec-butyl group, a tert-butyl group, or the like can be given. As $R^{50}$ and $R^{51}$, hydrogen or a tert-butyl group is preferably used in particular. Note that $R^{50}$ and $R^{51}$ may be identical or different.

As specific examples of the spiro-9,9'-bifluorene derivatives which are represented by the above general formulas (1) to (12), the spiro-9,9'-bifluorene derivatives represented by formulae (13) to (95) are given, for example. In the formula, Me denotes a methyl group; Et, an ethyl group; iPr, an isopropyl group; Pr, a propyl group; Bu, a butyl group; iBu, an isobutyl group; sBu, a sec-butyl group; and tBu, a tert-butyl group. Note that the spiro-9,9'-bifluorene derivative used for the light-emitting element of the present invention is not limited thereto.

(13)

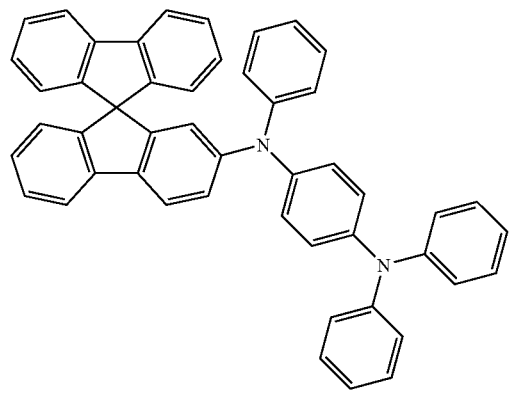

(14)

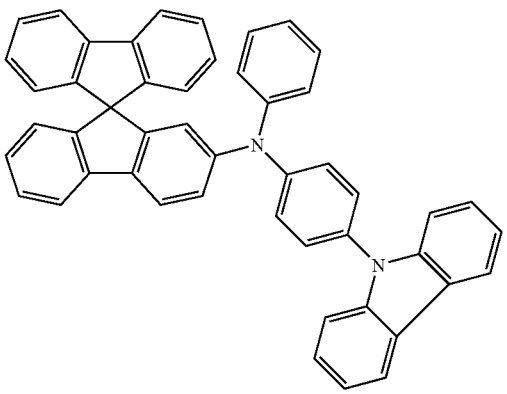

(15) 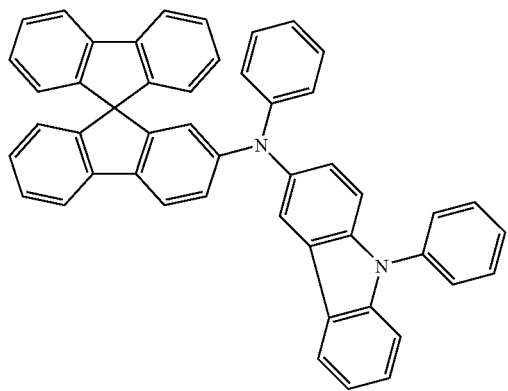
(16) 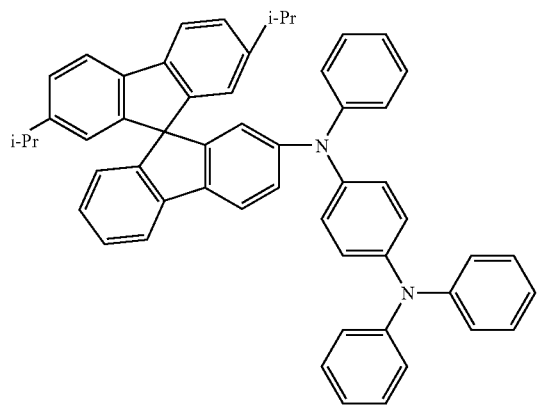
(17) 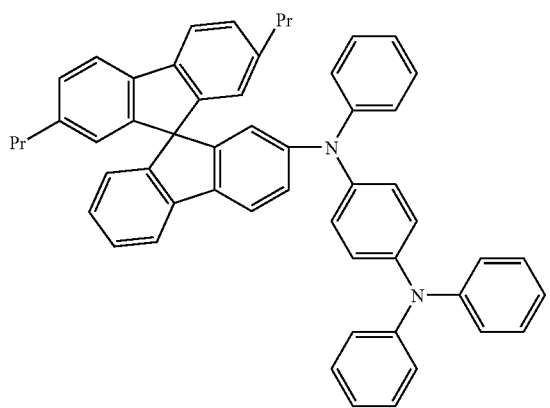
(18) 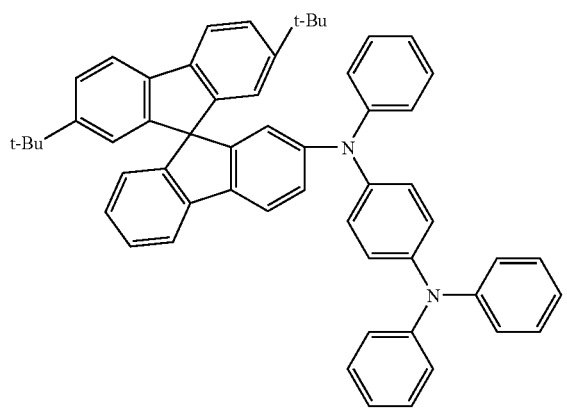
(19) 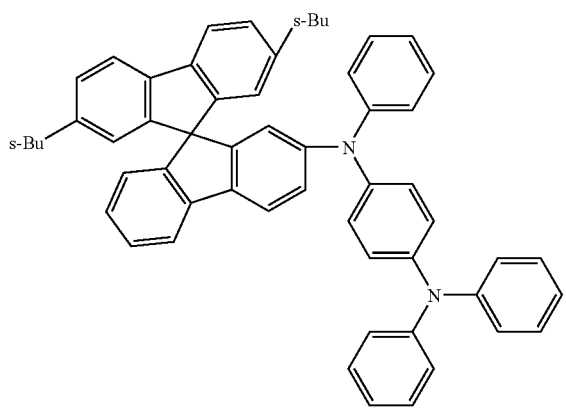
(20) 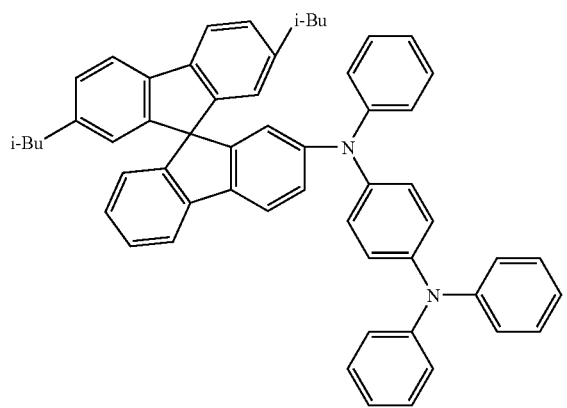

-continued
(21)
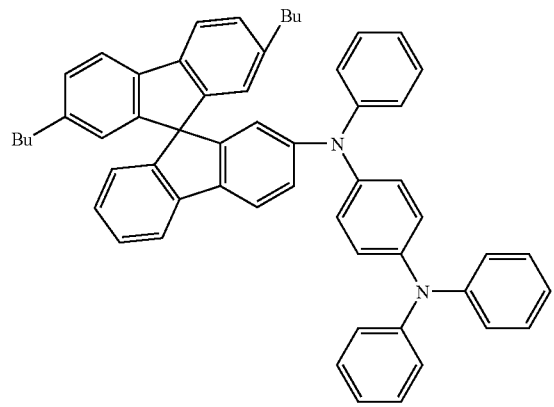
(22)
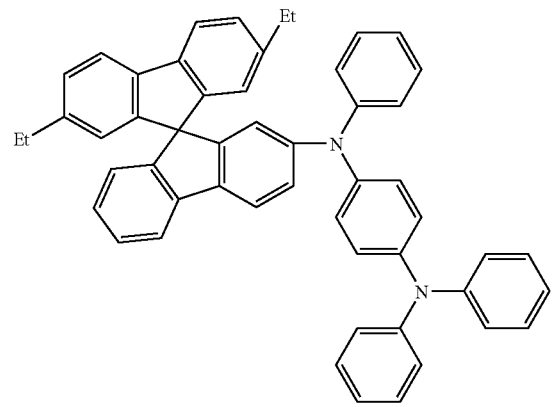
(23)
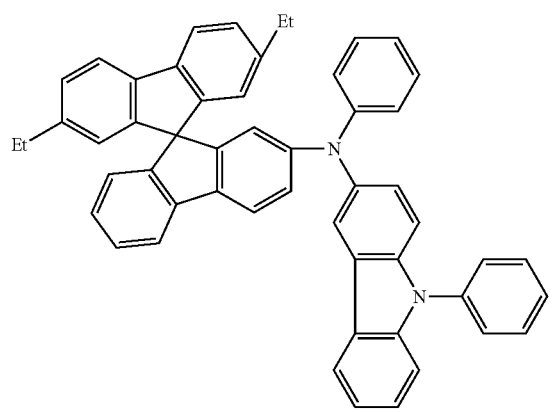
(24)
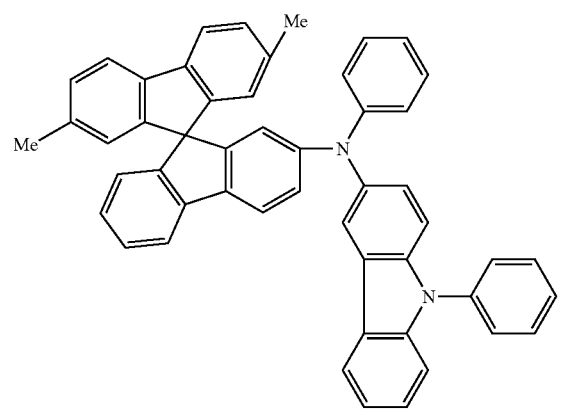
(25)
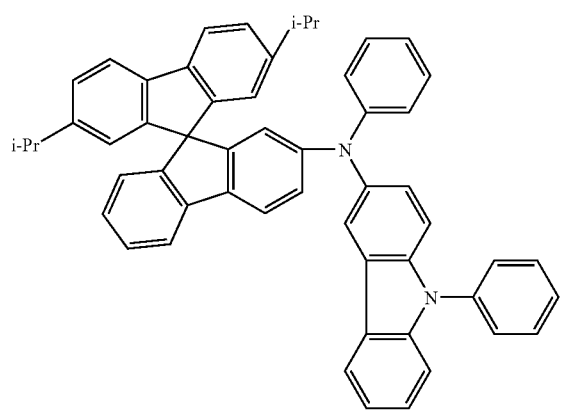
(26)
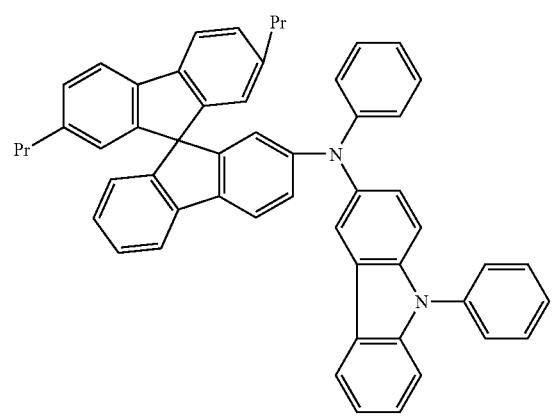

-continued
(27)
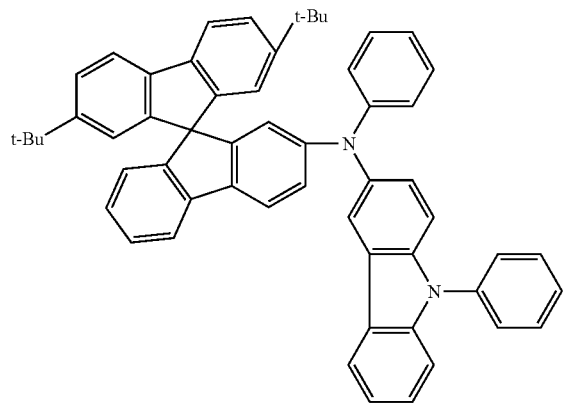
(28)
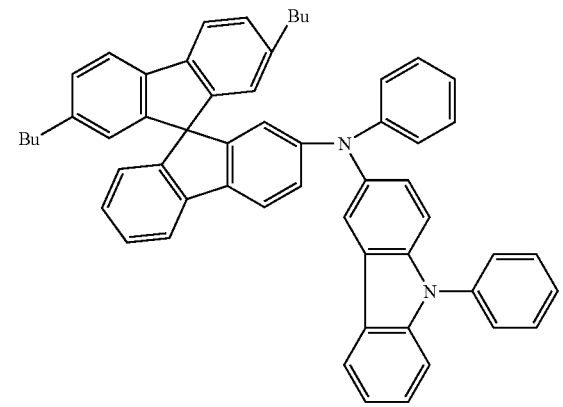
(29)
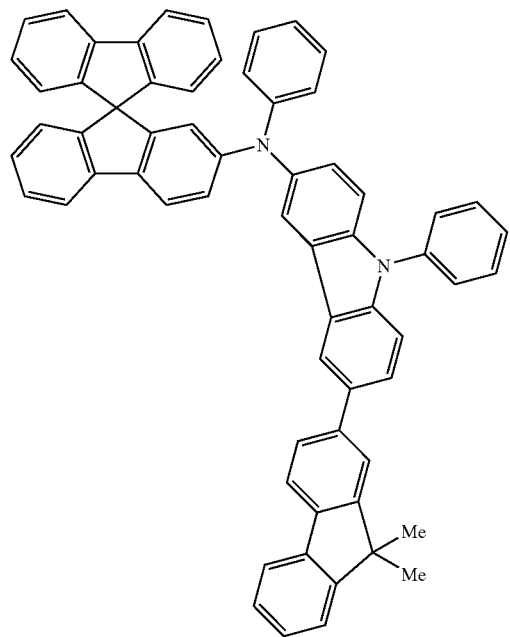
(30)
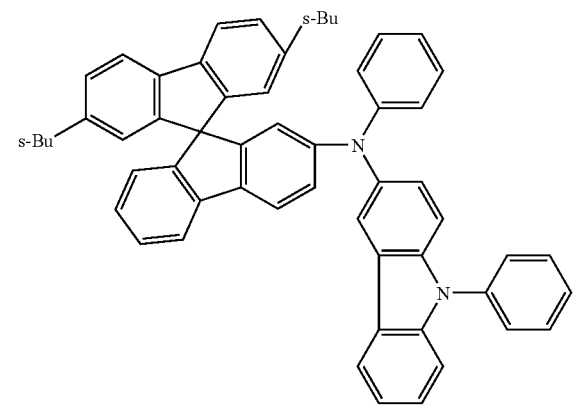
(31)
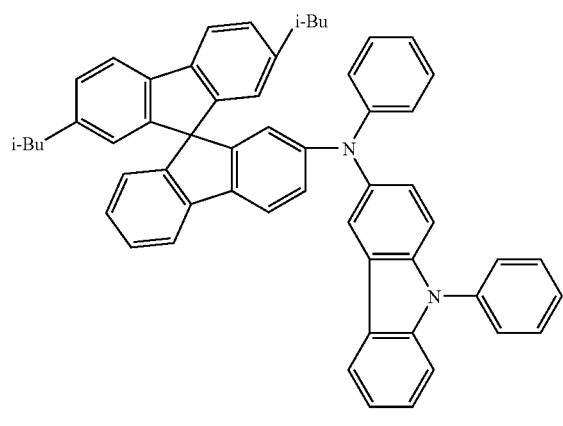
(32)
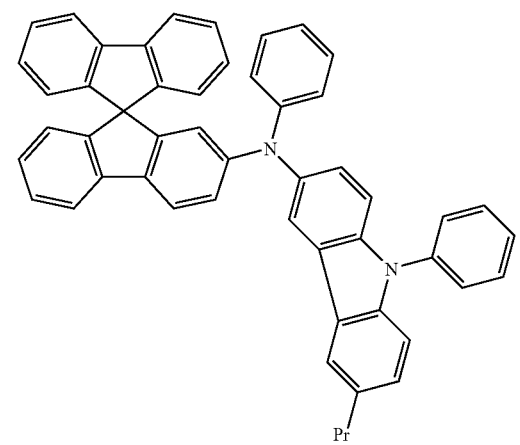

-continued
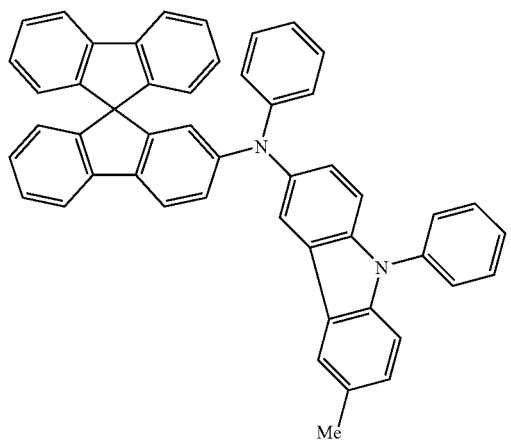
(33)
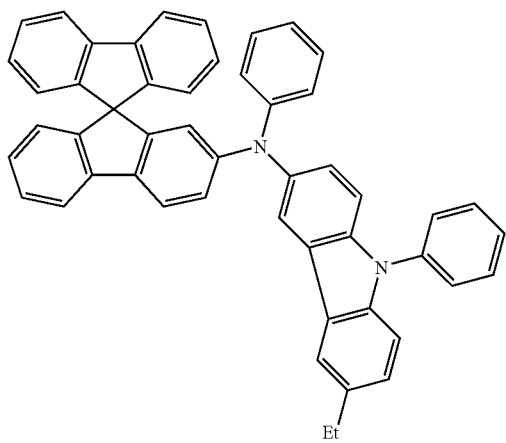
(34)
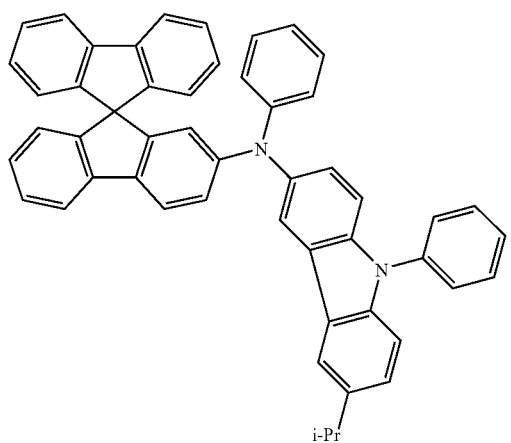
(35)
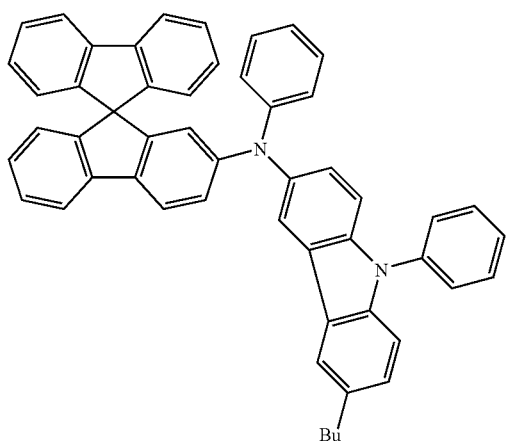
(36)
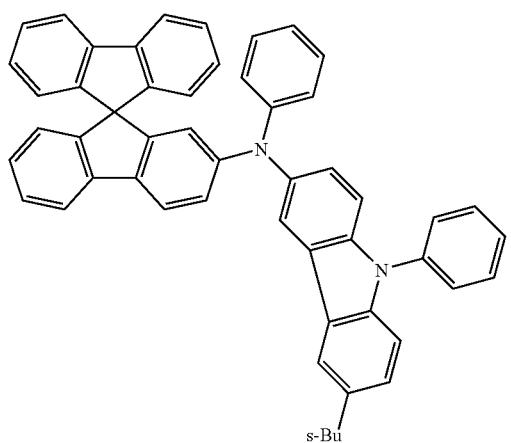
(37)
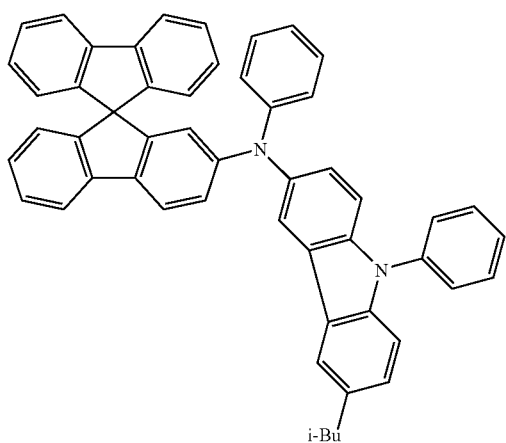
(38)

-continued
(39)
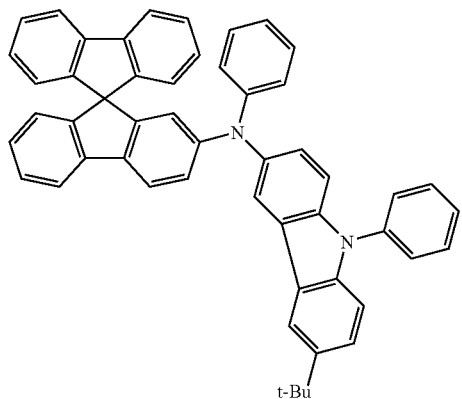
(40)
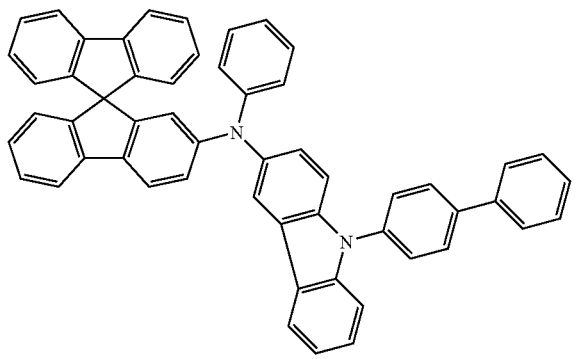
(41)
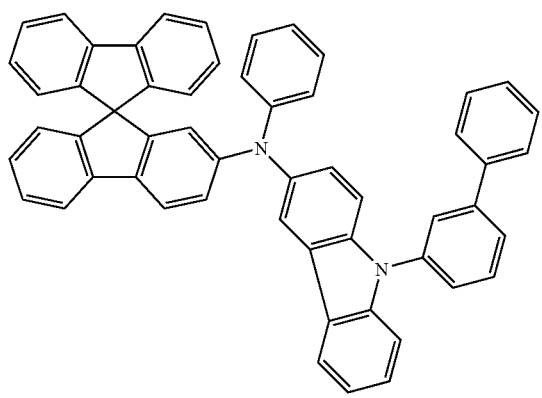
(42)
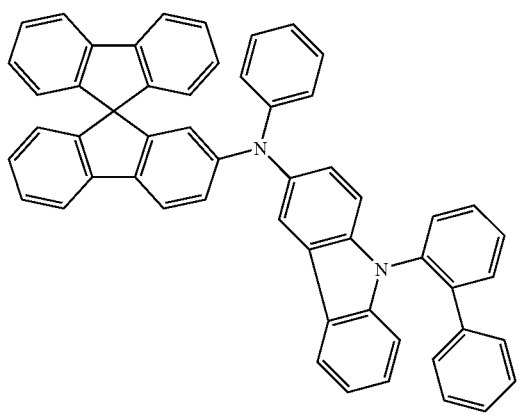
(43)
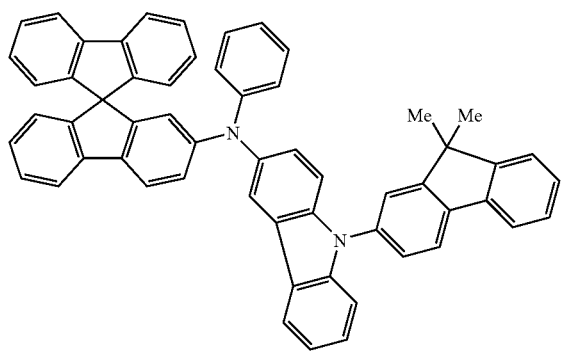
(44)
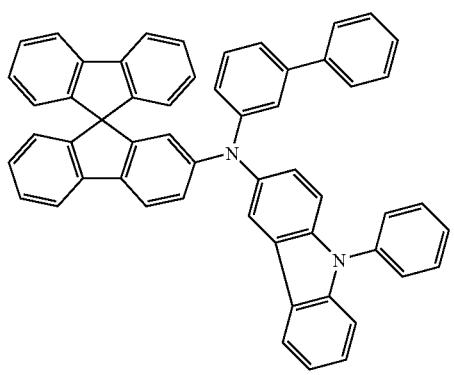

-continued
(45)
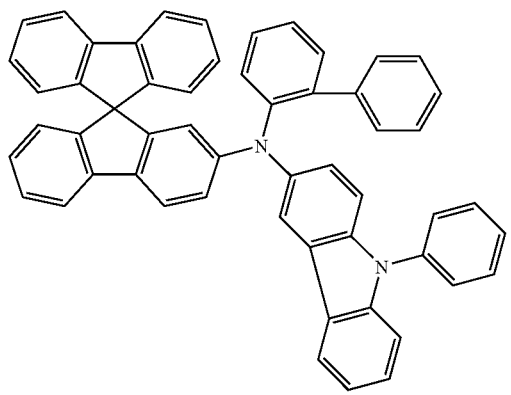
(46)
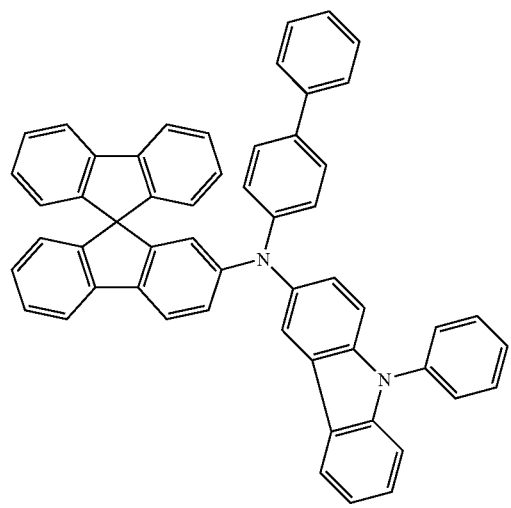
(47)
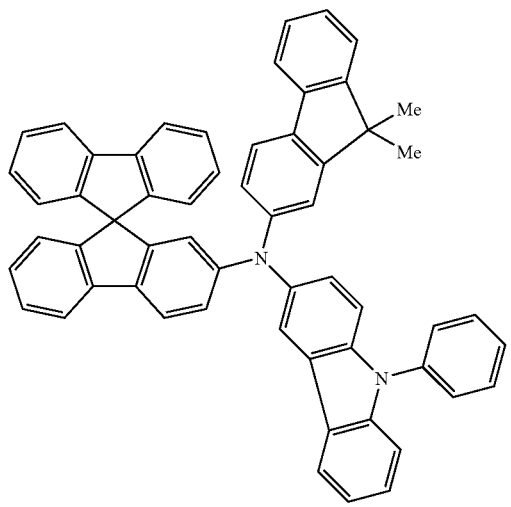
(48)
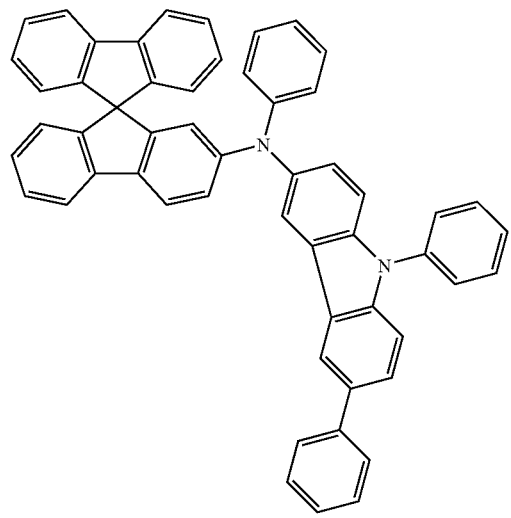
(49)
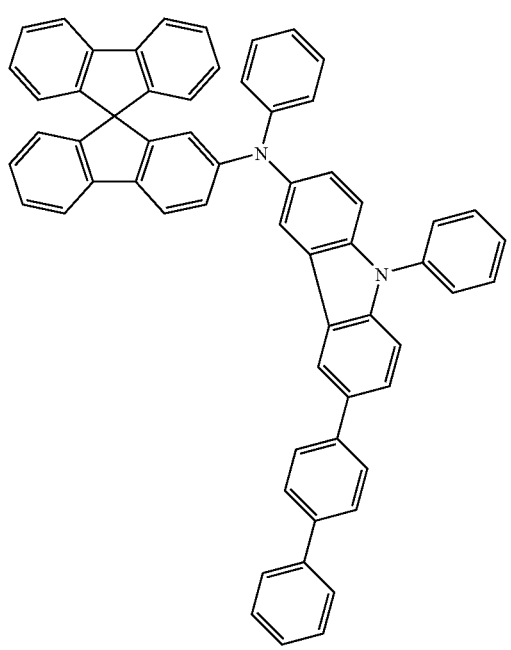
(50)
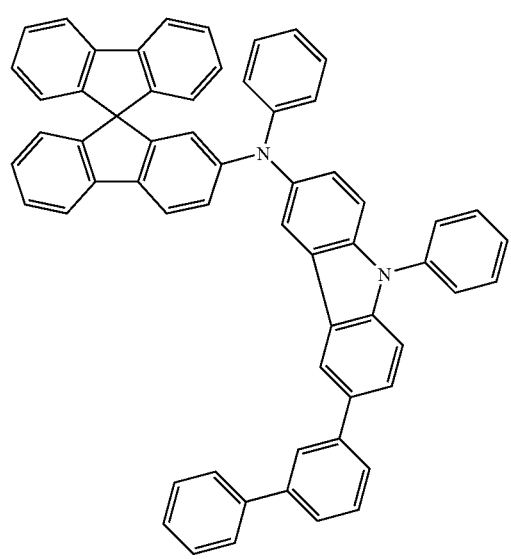

-continued
(51)
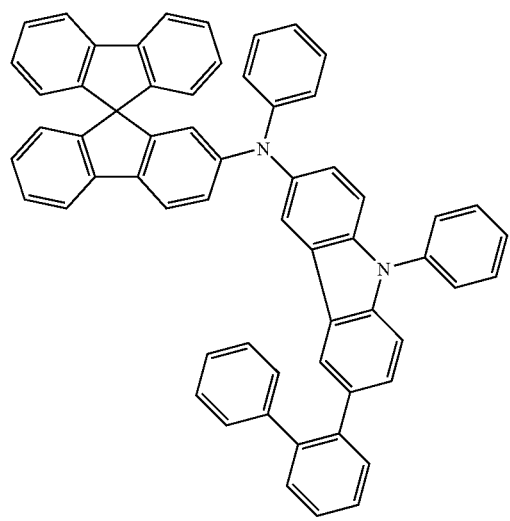
(52)
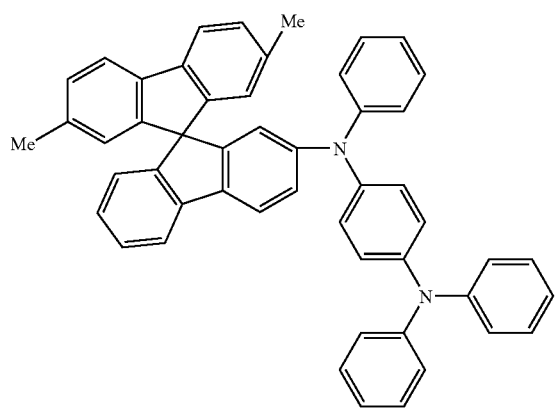
(53)
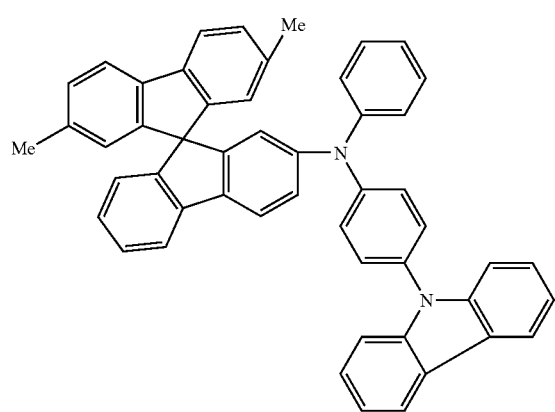
(54)
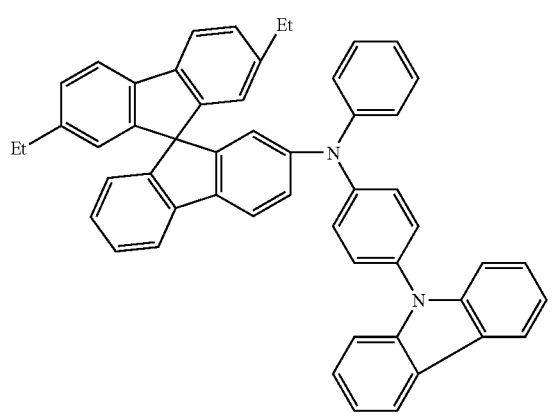
(55)
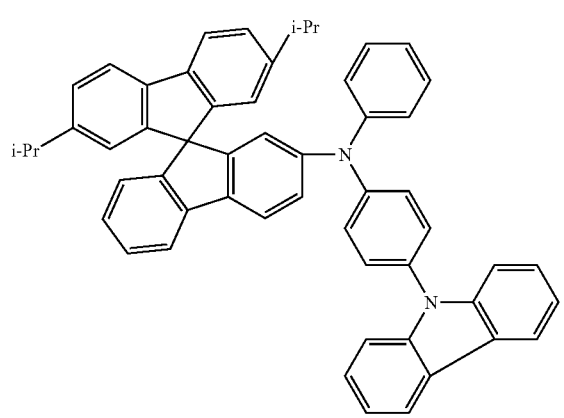
(56)
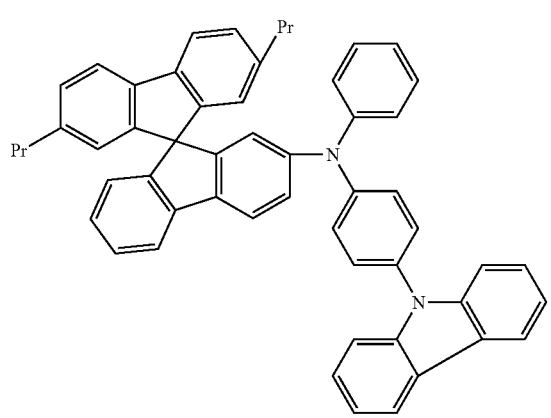

-continued
(57) 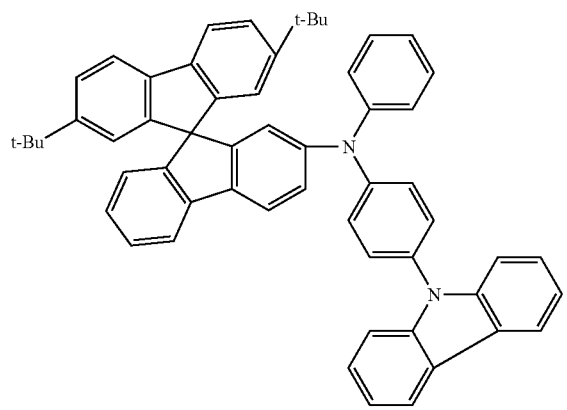
(58) 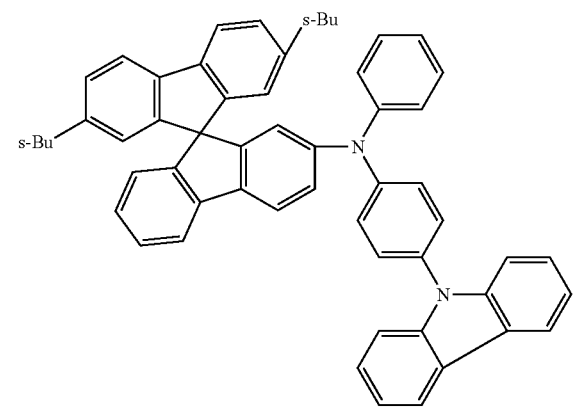
(59) 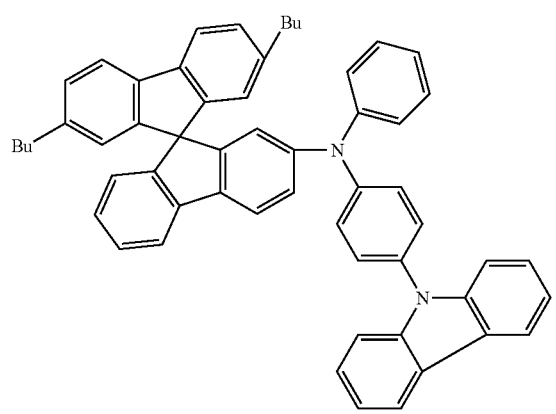
(60) 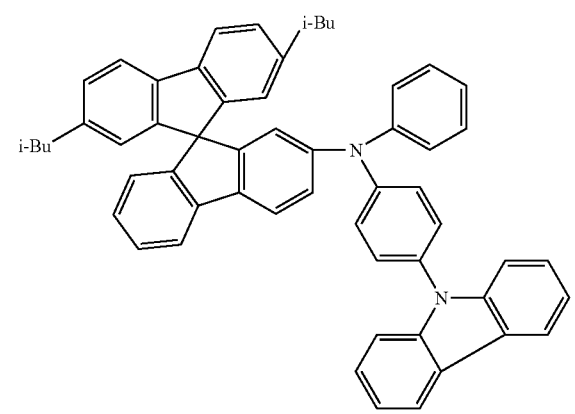
(61) 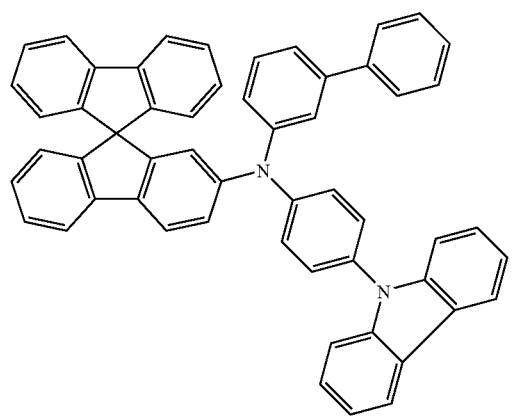
(62) 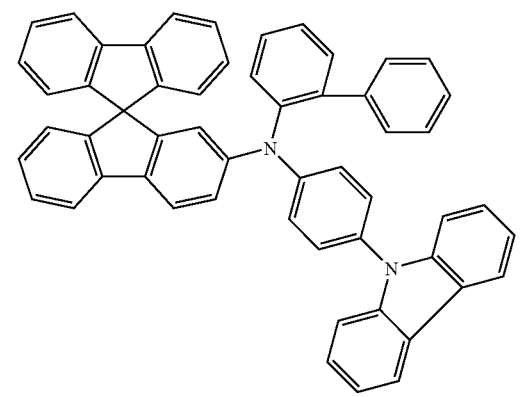

-continued
(63)
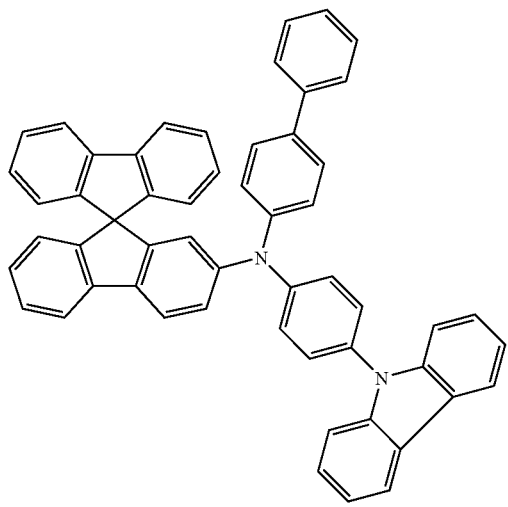
(64)
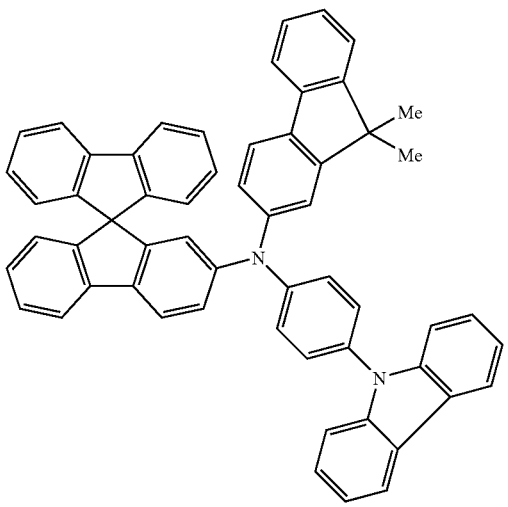
(65)
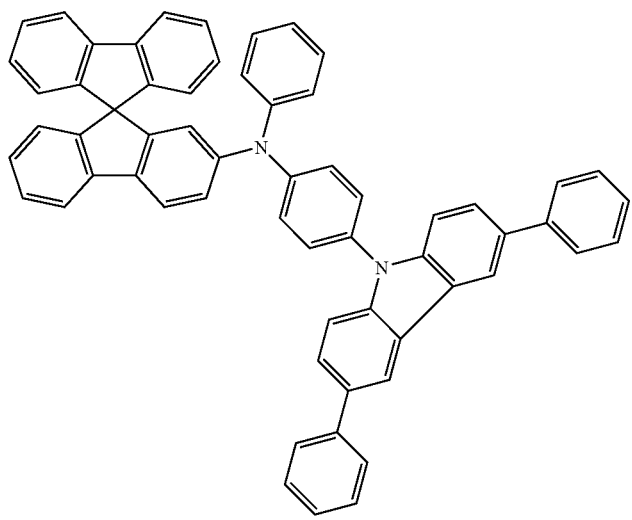
(66)
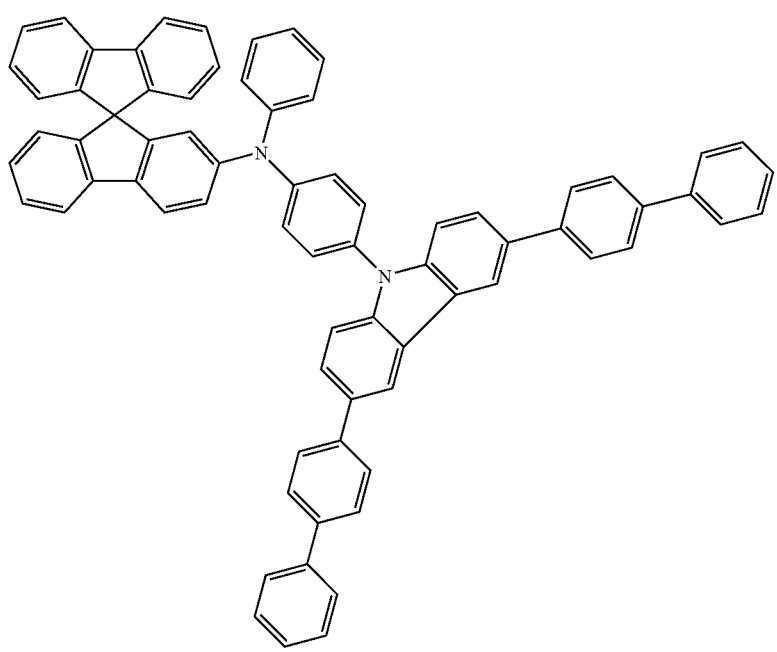

-continued
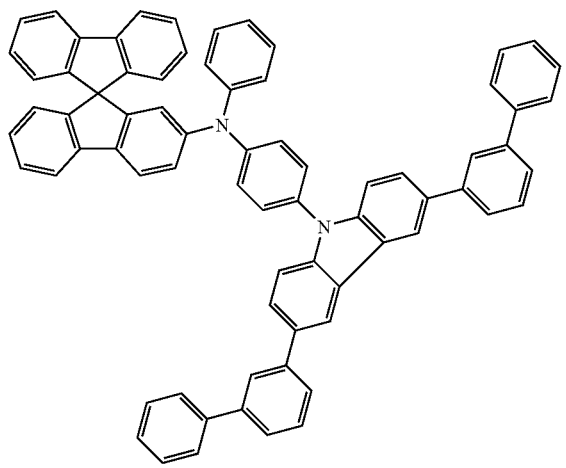
(67)
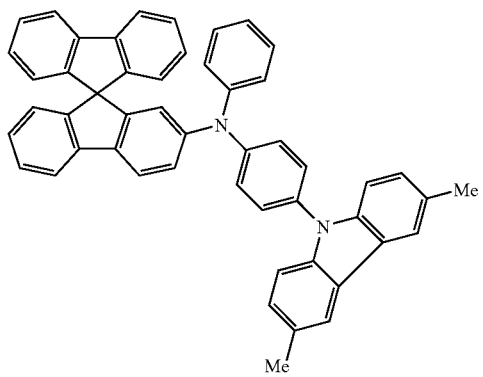
(68)
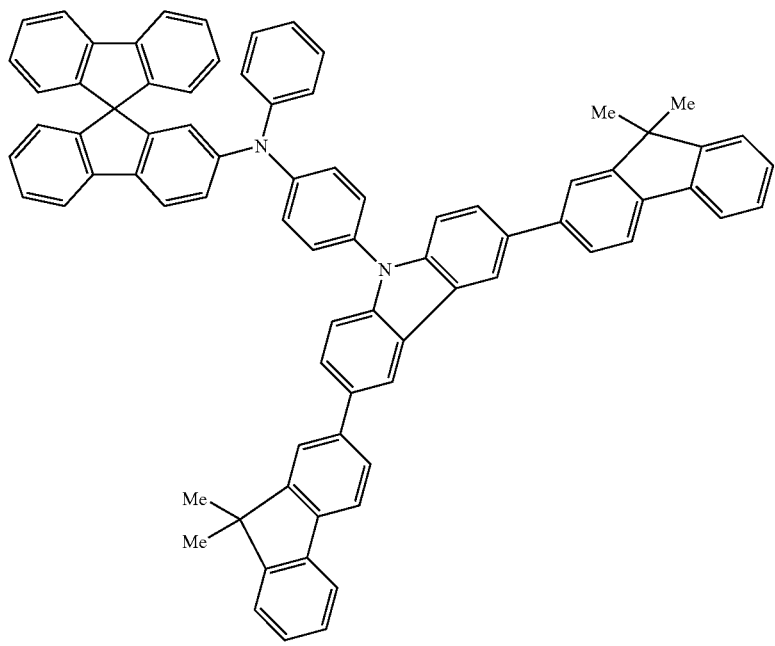
(69)
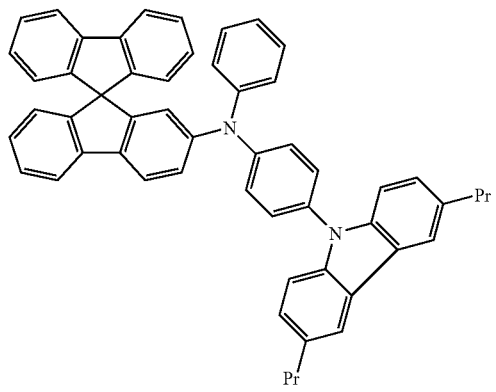
(70)
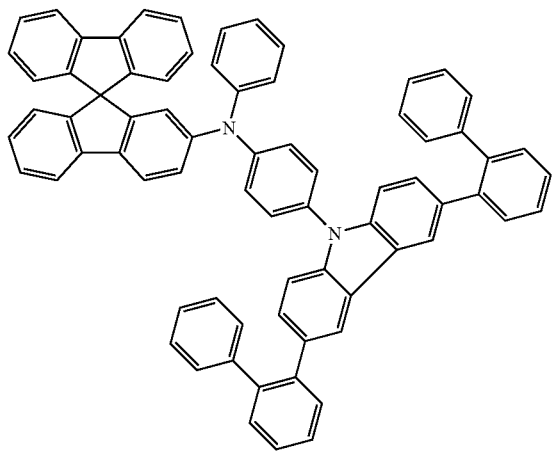
(71)

-continued
(72)
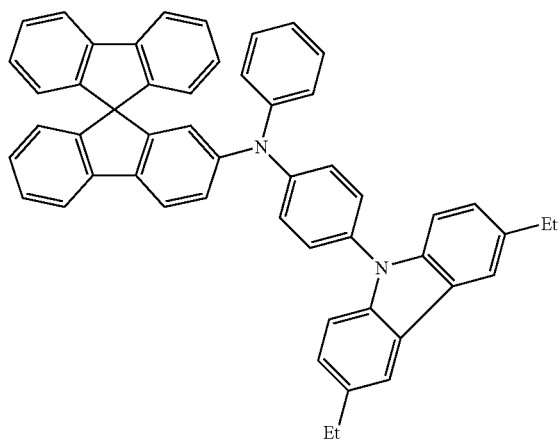
(73)
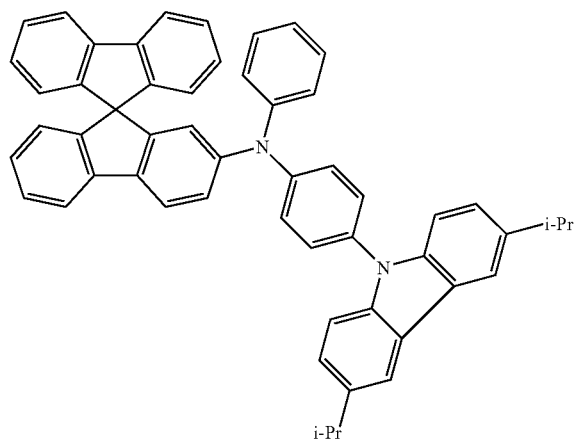
(74)
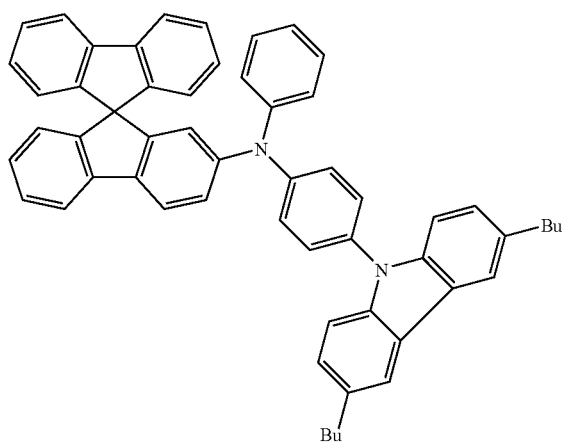
(75)
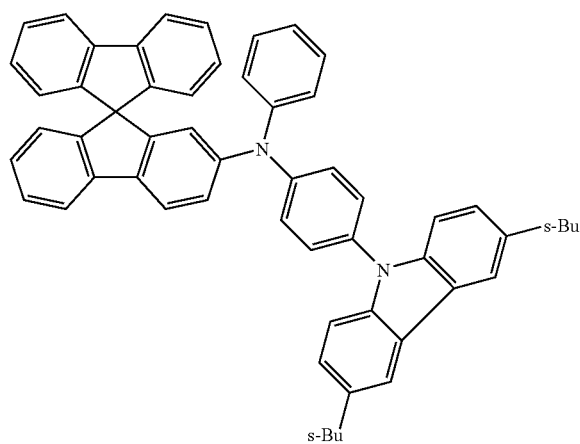
(76)
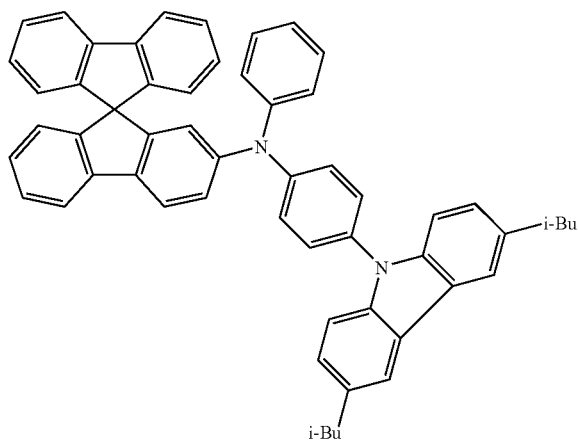
(77)
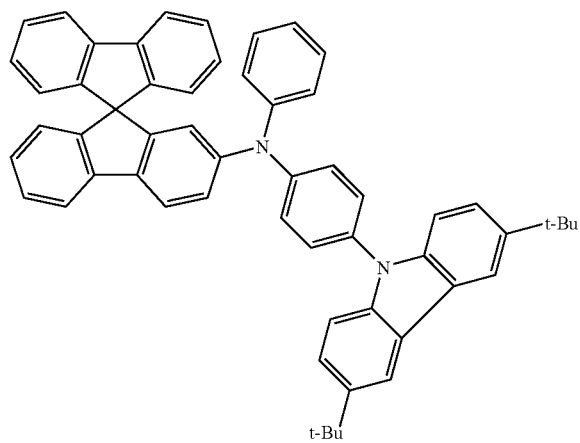

-continued
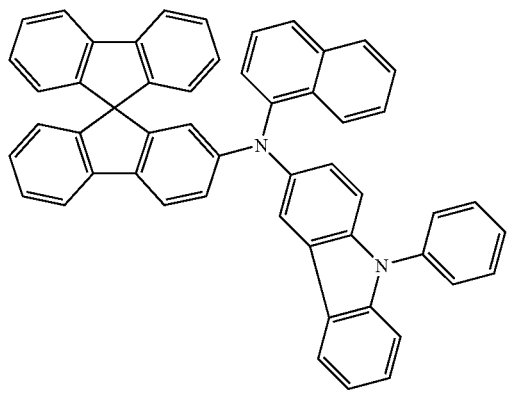
(78)
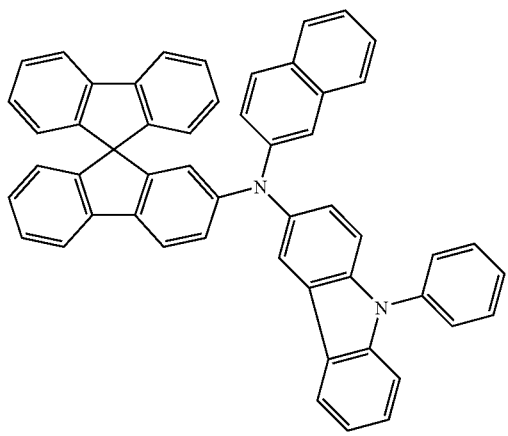
(79)
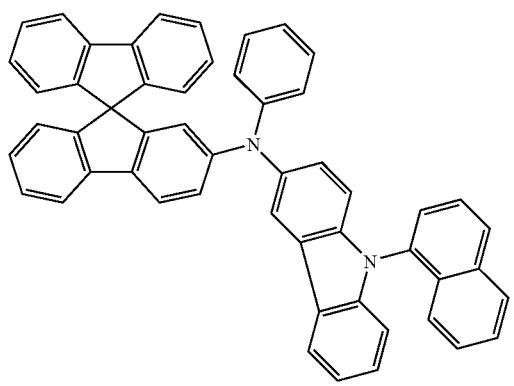
(80)
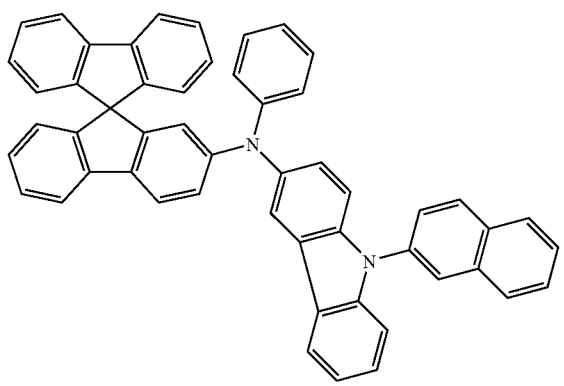
(81)
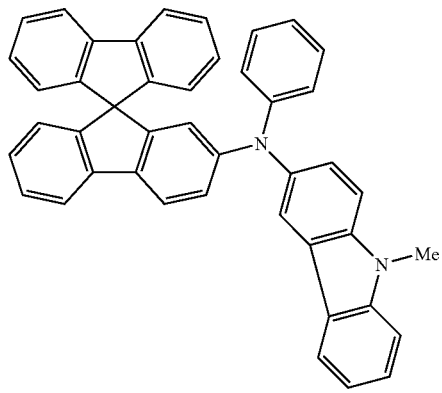
(82)
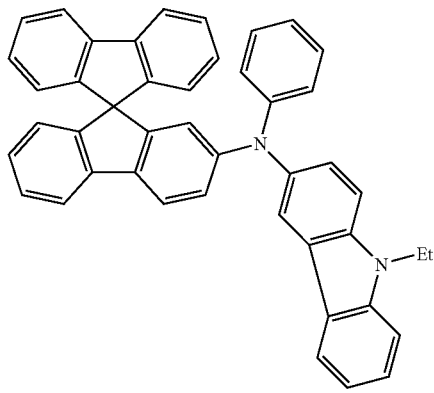
(83)
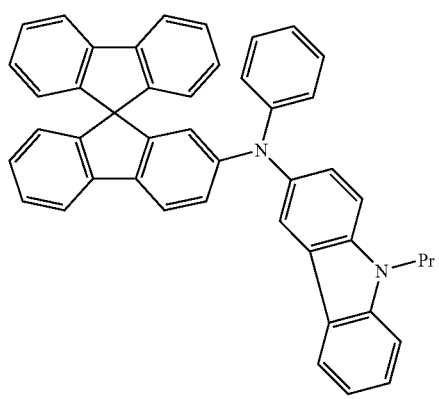
(84)
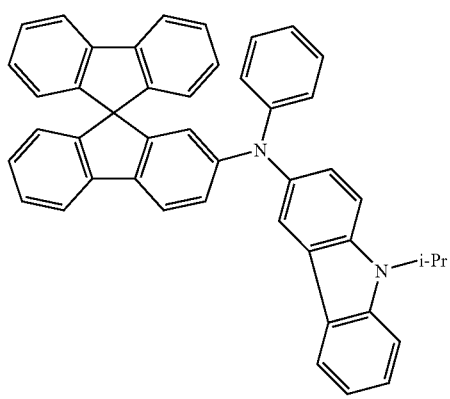
(85)

-continued
(86)
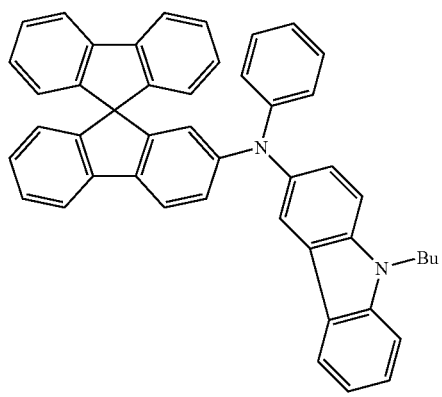
(87)
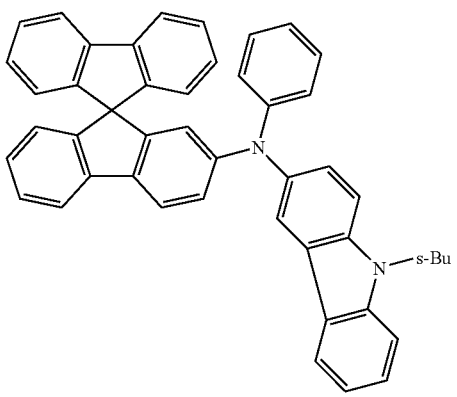
(88)
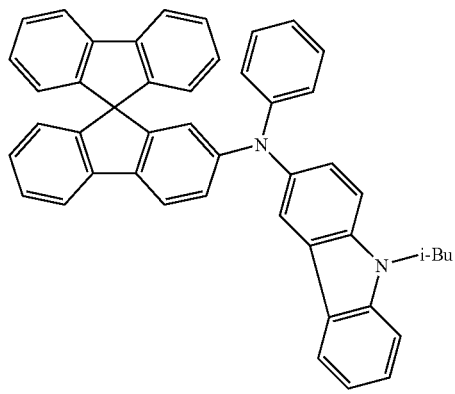
(89)
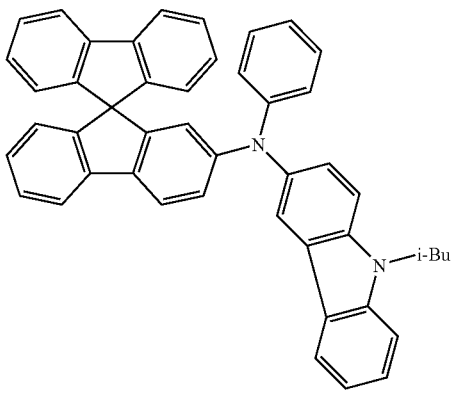
(90)
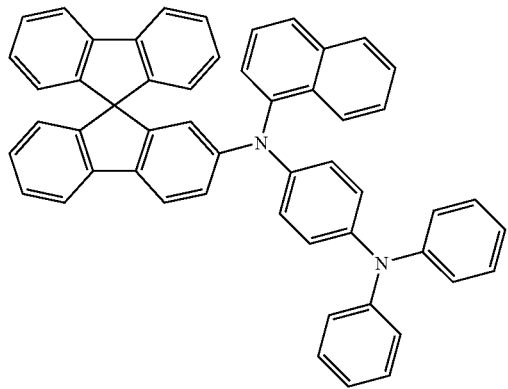
(91)
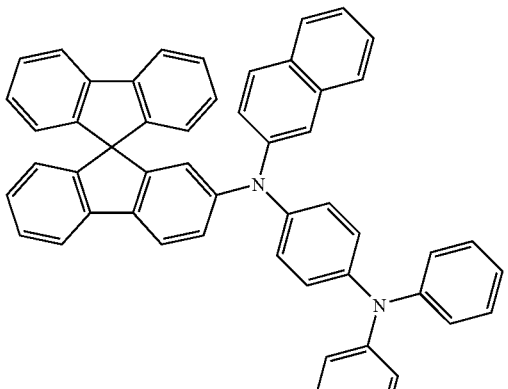
(92)
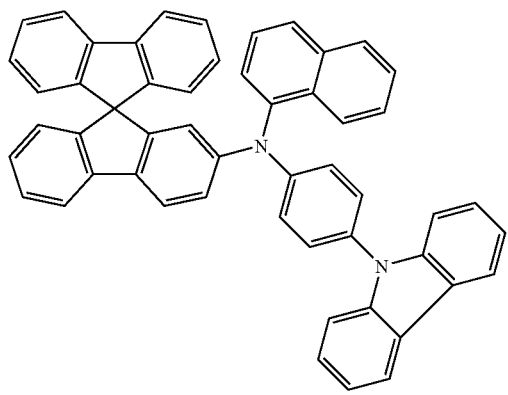
(93)
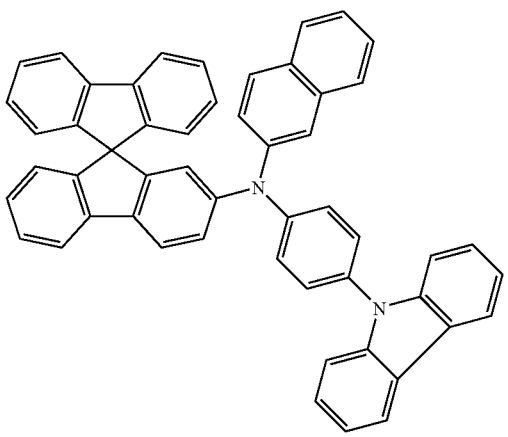

-continued

(94)
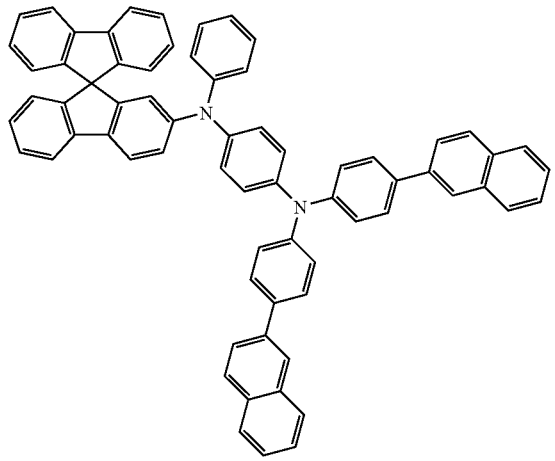

(95)
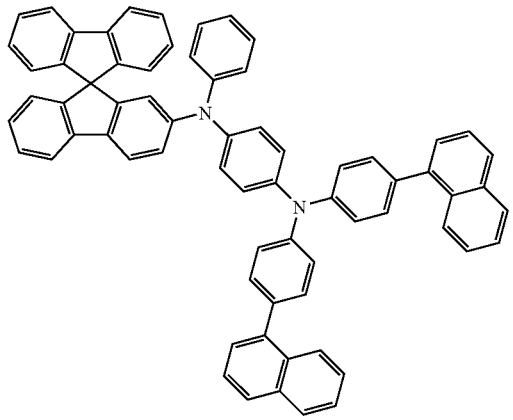

Since the spiro-9,9'-bifluorene derivative described in Embodiment Mode 2 has a sufficiently high $T_1$ level and high hole-transporting property, the spiro-9,9'-bifluorene derivative is preferably used for a hole-transporting layer. The spiro-9,9'-bifluorene derivative described in Embodiment Mode 2 is a material with a high glass transition temperature (Tg) and high heat resistance. The first layer in the light-emitting element of the present invention includes the above-described spiro-9,9'-bifluorene derivative; therefore, the light-emitting element with high heat resistance can be obtained. Further, the spiro-9,9'-bifluorene derivative described in Embodiment Mode 2 has a high $T_1$ level; therefore, triplet excitation energy is difficult to transfer from other layers and the light-emitting element with high luminous efficiency can be obtained. Further, since the spiro-9,9'-bifluorene derivative described in Embodiment Mode 2 has a high $T_1$ level, the spiro-9,9'-bifluorene derivative can be also preferably used for a light-emitting element which presents an emission color of phosphorescence emitted from the light-emitting layer with large light emission energy like blue to green, and the light-emitting element with high luminous efficiency can be obtained. Since the spiro-9,9'-bifluorene derivative described in Embodiment Mode 2 has a high $T_1$ level, the spiro-9,9'-bifluorene derivative can also be preferably used for a light-emitting element which presents an emission color of phosphorescence emitted from the light-emitting layer with large light emission energy with a wavelength from 440 nm to 540 nm, and the light-emitting element with high luminous efficiency can be obtained.

Further, since the light-emitting element of the present invention has high luminous efficiency, power consumption can be reduced.

When a voltage is applied to such a light-emitting element, a hole injected from the first electrode 101 side and an electron injected from the second electrode 104 side are recombined in the second layer 103, whereby the phosphorescent compound is excited. Light is emitted when an excitation state of the phosphorescent compound returns to a ground state. Note that, in the light-emitting element of Embodiment Mode 2, the first electrode 101 functions as an anode and the second electrode 104 functions as a cathode.

Although there are no particular limitations on the first electrode 101, the first electrode 101 is preferably formed using a substance having a high work function in a case of functioning as an anode as in Embodiment Mode 2. Specific examples of the substance having a high work function include gold (Au), platinum (Pt), nickel (Ni), tungsten (W), chromium (Cr), molybdenum (Mo), iron (Fe), cobalt (Co), copper (Cu), palladium (Pd), and the like in addition to indium tin oxide (ITO), indium tin oxide containing silicon oxide (ITSO), and indium oxide containing zinc oxide at 2 to 20 wt % (IZO). The first electrode 101 can be formed by, for example, a sputtering method, an evaporation method, or the like.

Further, although there are no particular limitations on the second electrode 104, the second electrode 104 is preferably formed of a substance having a low work function in a case of functioning as a cathode as in Embodiment Mode 2. Specific examples of the substance having a low work function include an alkali metal such as lithium (Li) or cesium (Cs), an alkaline-earth metal such as magnesium (Mg) or calcium (Ca), and a rare-earth metal such as erbium (Er) or ytterbium (Yb), in addition to aluminum (Al) and indium (In). In addition, an alloy such as an aluminum-lithium alloy (AlLi) or a magnesium-silver alloy (MgAg) can be used. Note that the second electrode 104 can be formed by, for example, a sputtering method, an evaporation method, or the like.

In order to extract emitted light to the outside, one or both of the first electrode 101 and the second electrode 104 are preferably an electrode formed using a conductive film that can transmit visible light, such as ITO, or an electrode with a thickness of several nm to several tens of nm so as to transmit visible light.

Further, a hole injecting layer 111 may be provided between the first electrode 101 and the first layer 102 as illustrated in FIG. 1. Here, the hole injecting layer is a layer that has a function of assisting injection of holes from the electrode functioning as an anode into the first layer 102. Note that the hole injecting layer 111 is not necessarily provided.

Although there are no particular limitations on a substance forming the hole injecting layer 111, the following substances can be used as this substance: metal oxide such as vanadium oxide, niobium oxide, tantalum oxide, chromium oxide, molybdenum oxide, tungsten oxide, manganese oxide, rhenium oxide, and ruthenium oxide. Further, a phthalocyanine compound such as phthalocyanine (abbrev.: $H_2Pc$) or copper phthalocyanine (abbrev.: CuPc) can be used. An aromatic amine compound such as 4,4'-bis[N-(1-naphthyl)-N-phenylamino]biphenyl (abbrev.: NPB), 4,4'-bis[N-(3-methylphenyl)-N-phenylamino]biphenyl (abbrev.: TPD), 4,4'-bis[N-(9, 9-dimethylfluoren-2-yl)-N-phenylamino]biphenyl (abbrev.: DFLDPBi), 4,4',4''-tris(N,N-diphenylamino)triphenylamine (abbrev.: TDATA), or 4,4',4''-tris[N-(3-methylphenyl)-N-phenylamino]triphenylamine (abbrev.: m-MTDATA) can be also used. Further, a high molecular compound such as a mixture of poly(ethylenedioxythiophene) and poly(styrenesulfonate) (abbrev.: PEDOT/PSS) can also be used.

A composite material of an organic compound and an electron acceptor may be used for the hole injecting layer 111. Such a composite material is superior in a hole injecting property and a hole transporting property since holes are generated in the organic compound by the electron acceptor. In this case, the organic compound is preferably a material excellent in transporting the generated holes. Specifically, the above-described aromatic amine compound, or the like can be used. As the electron acceptor, a substance having an electron accepting property to the organic compound may be used. Specifically, transition metal oxide is preferable and examples thereof include vanadium oxide, niobium oxide, tantalum oxide, chromium oxide, molybdenum oxide, tungsten oxide, manganese oxide, rhenium oxide, ruthenium oxide, and the like. Lewis acid such as iron(III) chloride or aluminum(III) chloride can also be used. In addition, an organic compound such as 7,7,8,8-tetracyano-2,3,5,6-tetrafluoroquinodimethane (abbrev.: $F_4$-TCNQ) can also be used.

The hole injecting layer 111 may have a multilayer structure in which two or more layers are stacked, or may be formed of a mixture of two or more kinds of substances.

An electron transporting layer 112 may be provided between the second electrode 104 and the second layer 103 as illustrated in FIG. 1. Here, the electron transporting layer is a layer that has a function of transporting electrons injected from the second electrode 104 to the second layer 103. In this manner, the electron transporting layer 112 is provided to keep the second electrode 104 away from the second layer 103, whereby quenching of light emission due to metal can be prevented. Note that the electron transporting layer 112 is not necessarily provided.

Although there are no particular limitations on a substance forming the electron transporting layer 112, the following substances can be typically used as this substance: metal complexes such as tris(8-quinolinolato)aluminum (abbrev.: $Alq_3$), tris(4-methyl-8-quinolinolato)aluminum (abbrev.: $Almq_3$), bis(10-hydroxybenzo[h]quinolinato)beryllium (abbrev.: $BeBq_2$), bis(2-methyl-8-quinolinolato)(4-phenylphenolato)aluminum (abbrev.: BAlq), bis[2-(2-hydroxyphenyl)benzoxazolato]zinc (abbrev.: ZnBOX), and bis[2-(2-hydroxyphenyl)benzothiazolato]zinc (abbrev.: $Zn(BTZ)_2$). Further, a heteroaromatic compound such as 2-(4-biphenylyl)-5-(4-t-butylphenyl)-1,3,4-oxadiazole (abbrev.: PBD), 1,3-bis[5-(p-tert-butylphenyl)-1,3,4-oxadiazol-2-yl]benzene (abbrev.: OXD-7), 3-(4-t-butylphenyl)-4-phenyl-5-(4-biphenylyl)-1,2,4-triazole (abbrev.: TAZ), 3-(4-t-butylphenyl)-4-(4-ethylphenyl)-5-(4-biphenylyl)-1,2,4-triazole (abbrev.: p-EtTAZ); bathophenanthroline (abbrev.: BPhen), bathocuproine (abbrev.: BCP), or 4,4'-bis(5-methylbenzoxazol-2-yl)stilbene (abbrev.: BzOs) can be used. Moreover, a high molecular compound such as poly(2,5-pyridin-diyl) (abbrev.: PPy) can also be used.

The electron transporting layer 112 may have a multilayer structure in which two or more layers are stacked, or may be formed of a mixture of two or more kinds of substances.

Further, an electron injecting layer 113 may be provided between the second electrode 104 and the electron transporting layer 112 as illustrated in FIG. 1. Here, the electron injecting layer is a layer that has a function of assisting injection of electrons from the electrode functioning as a cathode into the electron transporting layer 112. Note that the electron injecting layer 113 is not necessarily provided.

Although there are no particular limitations on a substance forming the electron injecting layer 113, an alkali metal compound or an alkaline-earth metal compound such as lithium fluoride (LiF), cesium fluoride (CsF), calcium fluoride ($CaF_2$), or lithium oxide can be used. In addition, a rare-earth metal compound such as erbium fluoride ($ErF_3$) can also be used. The above-mentioned substances forming the electron transporting layer 112 can also be used.

A composite material of an organic compound and an electron donor may be used for the electron injecting layer 113. Such a composite material is superior in an electron injecting property and an electron transporting property since electrons are generated in the organic compound by the electron donor. In this case, the organic compound is preferably a material excellent in transporting the generated electrons. Specifically, the above-described substances forming the electron transporting layer 112 (e.g., a metal complex or a heteroaromatic compound) can be used for example. As the electron donor, a substance showing an electron donating property to the organic compound may be used. Specifically, an alkali metal, an alkaline-earth metal, and a rare-earth metal such as lithium, cesium, magnesium, calcium, erbium, and ytterbium can be given. Further, alkali metal oxide or alkaline-earth metal oxide such as lithium oxide, calcium oxide, barium oxide, or the like can be given. Lewis base such as magnesium oxide can also be used. In addition, an organic compound such as tetrathiafulvalene (abbrev.: TTF) can also be used.

In the above-described light-emitting element of the present invention, each of the hole injecting layer 111, the first layer 102, the second layer 103, the electron transporting layer 112, and the electron injecting layer 113 may be formed by an evaporation method, an ink-jet method, or a coating method. In addition, each of the first electrode 101 and the second electrode 104 may also be formed by a sputtering method, an evaporation method, or the like, or a wet method such as an ink-jet method or a coating method.

Embodiment Mode 3

In Embodiment Mode 3, a light-emitting element with different element structure from that of Embodiment Mode 2 is exemplified in which a plurality of first layers containing a spiro-9,9'-bifluorene derivative and second layers containing a phosphorescent compound are provided and each of second layers containing phosphorescent compounds emits light. Accordingly, light that is a combination of light emitted from the plurality of light-emitting layers can be obtained. In Embodiment Mode 3, a mode of the light-emitting element including a plurality of first layers containing spiro-9,9'-bifluorene derivatives and second layers containing phosphorescent compounds will be explained with reference to FIG. 2.

Figure 2:
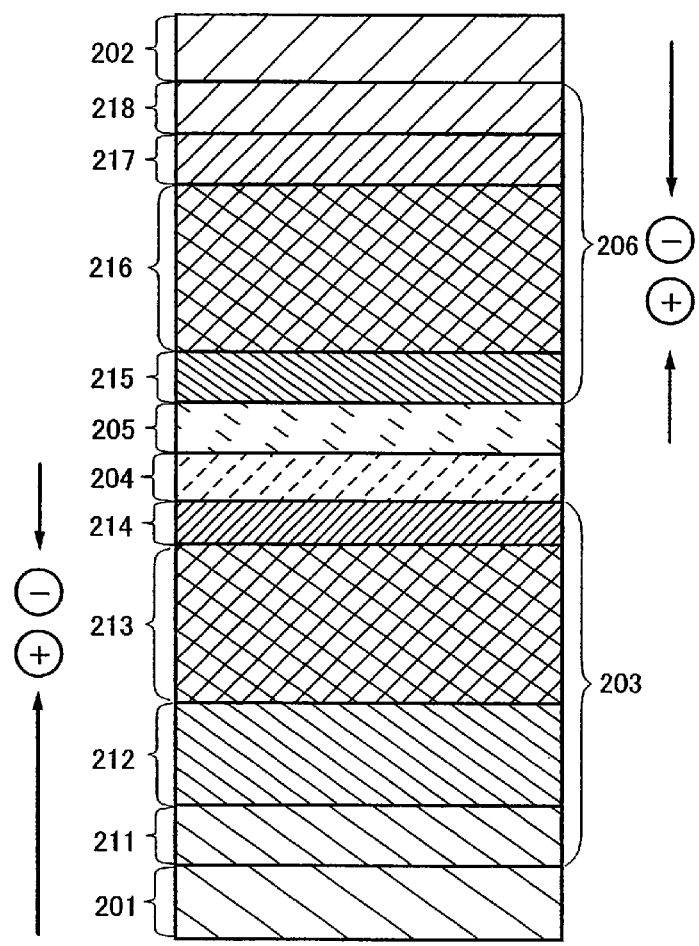
FIG. 2 is a view illustrating a light-emitting element of the present invention.

A light-emitting element in FIG. 2 includes a layer A 203 containing an organic compound and a layer B 206 containing an organic compound between a first electrode 201 and a second electrode 202. The layer A 203 containing an organic compound includes a first layer 212 containing a spiro-9,9'-bifluorene derivative and a second layer 213 containing a phosphorescent compound. The layer B 206 containing an organic compound has a first layer 215 containing a spiro-9,9'-bifluorene derivative and a second layer 216 containing a phosphorescent compound. As a charge generation layer, an N layer 204 and a P layer 205 are provided between the layer A 203 containing an organic compound and the layer B 206 containing an organic compound.

The N layer 204 is a layer that generates electrons, and the P layer 205 is a layer that generates holes. When voltage is applied so that the potential of the first electrode 201 is higher than that of the second electrode 202, holes injected from the first electrode 201 and electrons injected from the N layer 204 are recombined in the second layer 213 containing a phosphorescent compound, so that the phosphorescent compound contained in the second layer 213 containing a phosphorescent compound emits light. Further, electrons injected from the second electrode 202 and holes injected from the P layer 205 are recombined in the second layer 216 containing a phosphorescent compound, so that the phosphorescent compound contained in the second layer 216 containing a phosphorescent compound emits light.

Since the N layer 204 is a layer that generates electrons, it may be formed using the composite material of the organic compound and the electron donor described above in Embodiment Mode 2. With such a structure, electrons can be injected to the side of the second layer 213 containing a phosphorescent compound.

Since the P layer 205 is a layer that generates holes, it may be formed using the composite material of the organic compound and the electron acceptor described above in Embodiment Mode 2. With such a structure, holes can be injected to the side of the second layer 216 containing a phosphorescent compound. For the P layer 205, metal oxide having an excellent hole injecting property, such as molybdenum oxide, vanadium oxide, ITO, or ITSO, can also be used.

Further, a layer containing metal oxide such as molybdenum oxide or ITSO, or a metal such as aluminum or silver may be formed between the N layer 204 and the P layer 205 so that light can be transmitted through the layer.

The layer A 203 containing an organic compound and the layer B 206 containing an organic compound may have the same structure as the layer 120 containing an organic compound described above in Embodiment Mode 2. For example, as illustrated in FIG. 2, in the layer A containing an organic compound, a hole injecting layer 211 is provided between the first electrode 201 and the first layer 212. Further, an electron transporting layer 214 is provided between the second layer 213 and the N layer 204. In the layer B containing an organic compound, an electron transporting layer 217 and an electron injecting layer 218 are provided between the second electrode 202 and the second layer 216.

Embodiment Mode 3 describes a light-emitting element in which the two layers containing organic compounds are provided as illustrated in FIG. 2; however, the number of layers containing organic compounds is not limited to two, and may be three, for example. Light emitted from each of the second layers containing phosphorescent compounds may be mixed.

Embodiment Mode 3 describes a light-emitting element in which the two layers containing organic compounds are provided and each of the layers contains a phosphorescent compound as illustrated in FIG. 2; however, for example, two layers containing organic compounds are provided and one of the two layers containing organic compounds may have a different structure from that of the present invention. As the different structure from that of the present invention, for example, a structure can be given in which a fluorescent compound is used instead of the phosphorescent compound of the second layer containing a phosphorescent compound. Then, light emitted from the second layer containing the phosphorescent compound and light emitted from a layer containing a fluorescent compound may be mixed.

Embodiment Mode 4

In Embodiment Mode 4, a light-emitting device manufactured using a light-emitting element of the present invention will be explained.

Figure 3A:
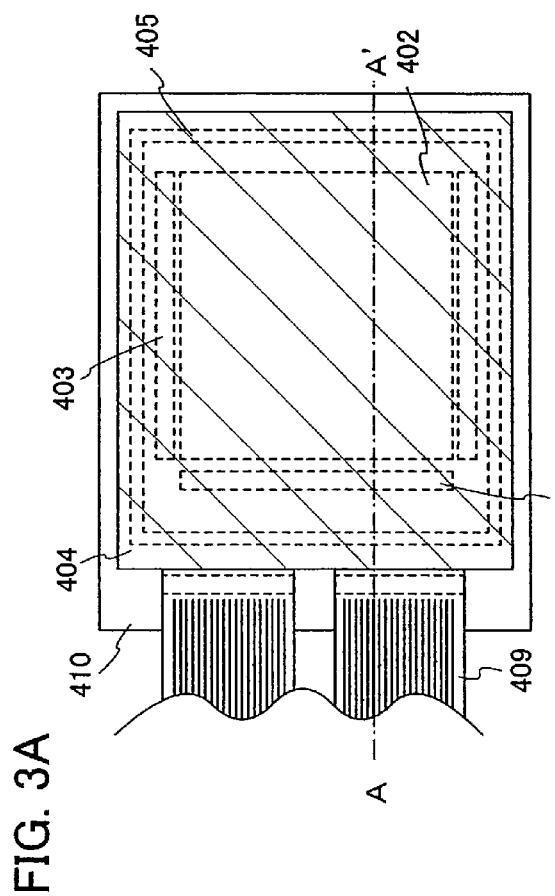
FIGS. 3A and 3B are views illustrating a light-emitting device of the present invention.
Figure 3B:
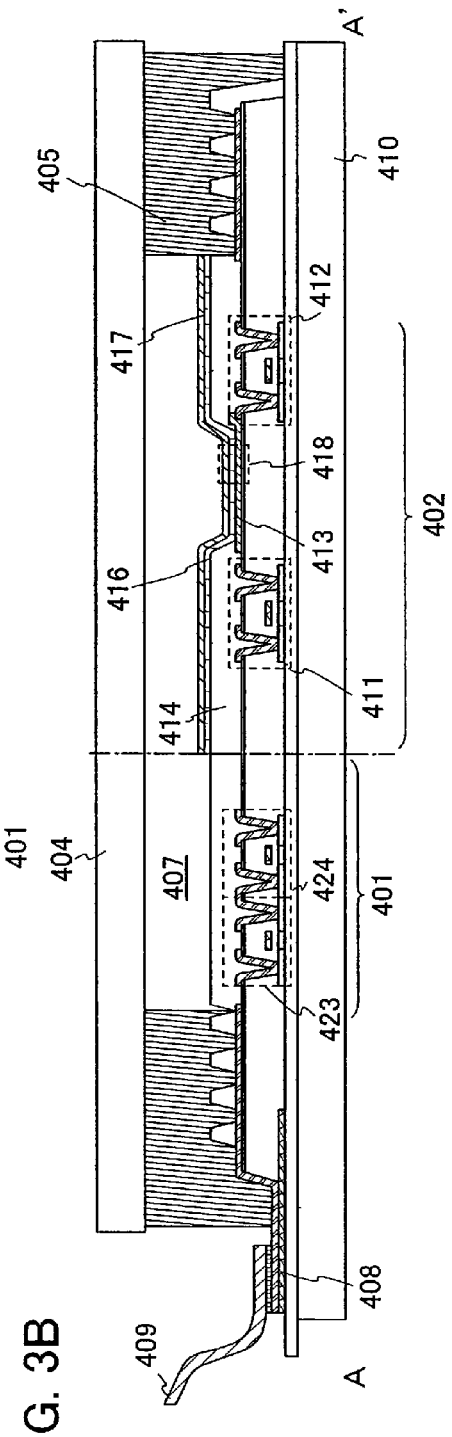

In Embodiment Mode 4, a light-emitting device manufactured using a light-emitting element of the present invention will be explained with reference to FIGS. 3A and 3B. FIG. 3A is a top view of the light-emitting device, and FIG. 3B is a cross sectional view of FIG. 3A taken along a line A-A'. Reference numeral 401 denotes a driver circuit portion (source side driver circuit), 402 denotes a pixel portion, and 403 denotes a driver circuit portion (gate side driver circuit), which are indicated by dotted lines. Reference numeral 404 denotes a sealing substrate; 405 denotes a sealing material; and 407 denotes a space surrounded by the sealing material 405.

A lead wiring 408 is a wiring to transmit a signal to be inputted to the source side driver circuit 401 and the gate side driver circuit 403, and receives a video signal, a clock signal, a start signal, a reset signal, and the like from a flexible printed circuit (FPC) 409 which serves as an external input terminal. Note that, although only an FPC is illustrated here, this FPC may be provided with a printed wiring board (PWB). The light-emitting device in this specification includes not only a light-emitting device itself but also a light-emitting device provided with an FPC or a PWB.

Next, a cross-sectional structure is described with reference to FIG. 3B. Although the driver circuit portions and the pixel portion are formed over a substrate 410, the source side driver circuit 401 which is the driver circuit portions and one pixel in the pixel portion 402 are illustrated here.

A CMOS circuit that is a combination of an n-channel TFT 423 and a p-channel TTF 424 is formed as the source side driver circuit 401. The driver circuit may be formed using a CMOS circuit, a PMOS circuit, or an NMOS circuit. In Embodiment Mode 4, a driver integration type in which a driver circuit is formed over the substrate is described; however, a driver circuit is not necessarily formed over the substrate and can also be formed outside the substrate.

The pixel portion 402 includes a plurality of pixels, each of which includes a switching TFT 411, a current control TFT 412, and a first electrode 413 which is electrically connected to the drain of the current control TFT 412. Note that an insulator 414 is formed so as to cover an end portion of the first electrode 413. Here, a positive photosensitive acrylic resin film is used for the insulator 414.

The insulator 414 is formed so as to have a curved surface having curvature at an upper end portion or a lower end portion thereof in order to obtain favorable coverage. For example, in a case of using a positive photosensitive acrylic as a material of the insulator 414, the insulator 414 is preferably formed so as to have a curved surface with a curvature radius (0.2 µm to 3 µm) only at the upper end portion thereof. Either a negative type that becomes insoluble in an etchant by light or a positive type that becomes soluble in an etchant by light can be used as the insulator 414.

A layer 416 containing an organic compound and a second electrode 417 are formed over the first electrode 413. Here, a material having a high work function is preferable as a material used for the first electrode 413 which serves as an anode. For example, the first electrode 413 can be formed using a single-layer film such as an indium tin oxide (ITO) film, an indium tin oxide film containing silicon, an indium zinc oxide (IZO) film, a titanium nitride film, a chromium film, a tungsten film, a Zn film, or a Pt film, or the like; a stacked layer of the film selected from the films and a film containing a titanium nitride and aluminum as its main component; a three-layer structure of a titanium nitride film, a film containing aluminum as its main component, and another titanium nitride film; or the like. When the first electrode 413 has a stacked layer structure, it can have low resistance as a wiring, allow formation of a favorable ohmic contact, and further function as an anode.

The layer 416 containing an organic compound is formed by various methods such as an evaporation method using an evaporation mask, an ink-jet method, and a spin coating method. The layer 416 containing an organic compound includes the spiro-9,9'-bifluorene derivative and the phosphorescent compound described in Embodiment Mode 2 as a part. As a material which can be combined, a low molecular material, a medium molecular material which has an intermediate property between a low molecular material and a high molecular material (including oligomer and dendrimer), or a high molecular material may be used. Although a single layer or a stacked layer of an organic compound is generally used as the layer containing an organic compound, the present invention may include a structure in which an organic compound film that partially contains an inorganic compound is used as the layer containing an organic compound.

As a material used for the second electrode 417 that is formed over the layer 416 containing an organic compound, a material having a low work function (Al, Ag, Li, Ca, or an alloy or a compound of them, such as MgAg, MgIn, AlLi, $CaF_2$, calcium nitride, or calcium fluoride) is preferably used. In the case where light emitted from the layer 416 containing an organic compound is transmitted through the second electrode 417 which serves as a cathode, a stacked layer of a metal thin film with reduced film thickness and a transparent conductive film (formed using an indium oxide-tin oxide alloy (ITO), an indium oxide-zinc oxide alloy ($In_2O_3$—ZnO), zinc oxide (ZnO), or the like) is preferably used as the second electrode 417.

Attachment of the sealing substrate 404 to the substrate 410 with the sealing material 405 makes a structure in which a light-emitting element 418 is provided in the space 407 surrounded by the substrate 410, the sealing substrate 404, and the sealing material 405. Note that the present invention also includes a structure in which the space 407 is filled with the sealing material 405, and a structure in which the space 407 is filled with an inert gas (e.g., nitrogen or argon).

An epoxy-based resin is preferably used as the sealing material 405. The material desirably allows as little moisture and oxygen as possible to penetrate. As the sealing substrate 404, a plastic substrate made of fiberglass-reinforced plastics (FRP), polyvinyl fluoride (PVF), polyester, an acrylic resin, or the like can be used besides a glass substrate or a quartz substrate.

In the above-described manner, a light-emitting device manufactured using the light-emitting element of the present invention can be obtained.

Since the light-emitting element described in Embodiment Mode 2 or Embodiment Mode 3 is used, the light-emitting device of the present invention has favorable characteristics. Specifically, since the light-emitting element with high luminous efficiency is included, a light-emitting device with low power consumption can be obtained.

Figure 4A:
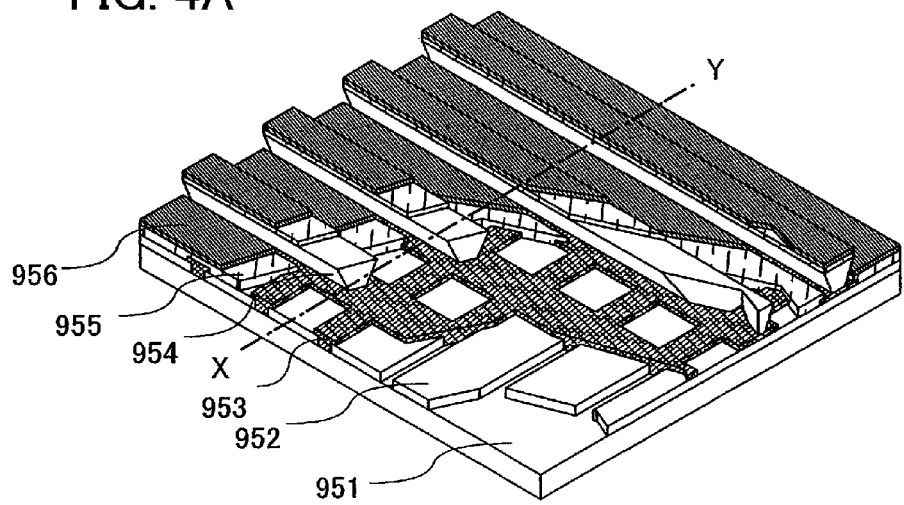
FIGS. 4A and 4B are views illustrating a light-emitting device of the present invention.
Figure 4B:
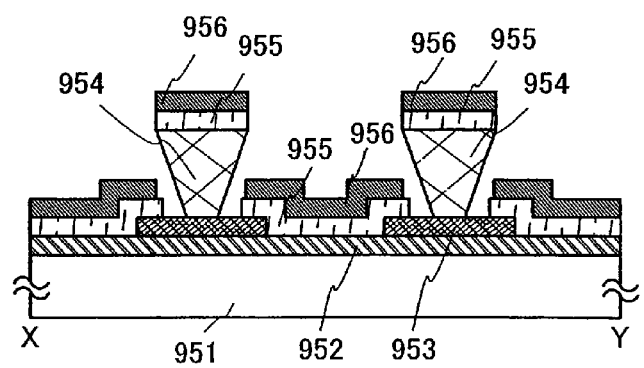

Although, as described above, description is made of an active matrix image display device that controls driving of a light-emitting element using transistors, the present invention may include a passive matrix image display device that drives a light-emitting element without particularly providing an element for driving such as a transistor. FIGS. 4A and 4B illustrate a passive matrix image display device manufactured by using the present invention. FIG. 4A is a perspective view illustrating the passive matrix image display device and FIG. 4B is a cross sectional view of FIG. 4A taken along a line X-Y. In FIGS. 4A and 4B, an electrode 952 and an electrode 956 are provided over a substrate 951, and a layer 955 containing an organic compound is provided between the electrodes 952 and 956. An end portion of the electrode 952 is covered with an insulating layer 953. A partition layer 954 is provided over the insulating layer 953. Sidewalls of the partition layer 954 slope so that a distance between one sidewall and the other sidewall becomes narrower toward a substrate surface. That is, a cross section of the partition layer 954 in the direction of a short side is trapezoidal, and a base (side that is provided in the same direction as a plane direction of the insulating layer 953 and in contact with the insulating layer 953) is shorter than the upper side (side that is provided in the same direction as the plane direction of the insulating layer 953 and not in contact with the insulating layer 953). By providing the partition layer 954 in this manner, a defect of the light-emitting element caused by static electricity or the like can be prevented.

Embodiment Mode 5

In Embodiment Mode 5, electronic appliances of the present invention including the light-emitting device described in Embodiment Mode 4 will be described. The electronic appliances of the present invention include a spiro-9,9'-bifluorene derivative and a phosphorescent compound described in Embodiment Mode 2 and have a display portion with high emission efficiency and low power consumption.

The electronic appliances each including the light-emitting element of the present invention include video cameras, digital cameras, goggle type displays, navigation systems, audio reproducing devices (e.g., car audio components and audio components), computers, game machines, portable information terminals (e.g., mobile computers, mobile phones, portable game machines, and electronic books), and image reproducing devices provided with a recording medium (specifically, devices capable of reproducing a recording medium such as a digital versatile disc (DVD) and provided with a display device that can display the image), and the like. Specific examples of these electronic appliances are illustrated in FIGS. 5A to 5D.

Figure 5A:
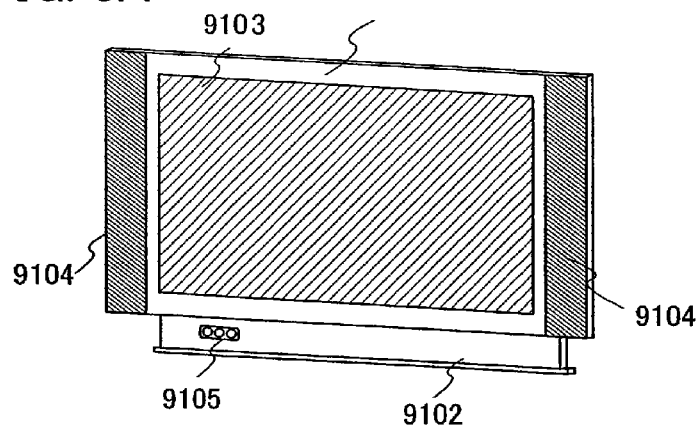
FIGS. 5A to 5D are views illustrating electronic appliances of the present invention.

FIG. 5A illustrates a television set according to the present invention. The television set includes a housing 9101, a supporting base 9102, a display portion 9103, a speaker portion 9104, a video input terminal 9105, and the like. In the television set, the display portion 9103 has a matrix arrangement of light-emitting elements that are similar to those described in Embodiment Modes 1 to 3. The light-emitting elements have a characteristic of high emission efficiency. Since the display portion 9103 including the light-emitting elements has similar characteristics, the television set can emit light with high luminance and have low power consumption. Accordingly, the television set according to the present invention, which achieves low power consumption and high image quality, can be provided as a product that is suitable for the residential environment.

Figure 5B:
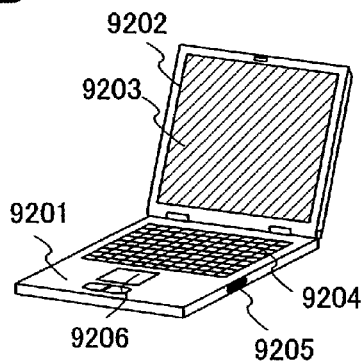

FIG. 5B illustrates a computer according to the present invention. The computer includes a main body 9201, a housing 9202, a display portion 9203, a keyboard 9204, an external connection port 9205, a pointing device 9206, and the like. In this computer, the display portion 9203 has a matrix arrangement of light-emitting elements that are similar to those described in Embodiment Modes 1 to 3. The light-emitting elements have a characteristic of high emission efficiency. Since the display portion 9203 including the light-emitting elements has similar characteristics, light emission with high luminance and low power consumption can be achieved. Accordingly, the computer according to the present invention, which achieves low power consumption and high image quality, can be provided as a product that is suitable for the environment.

Figure 5C:
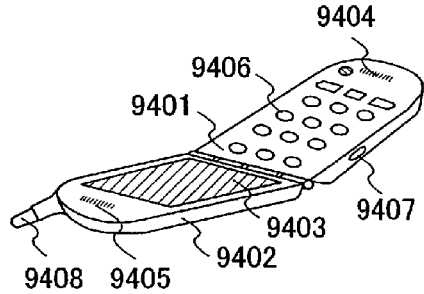

FIG. 5C illustrates a mobile phone according to the present invention. The mobile phone includes a main body 9401, a housing 9402, a display portion 9403, an audio input portion 9404, an audio output portion 9405, operation keys 9406, an external connection port 9407, an antenna 9408, and the like. In the mobile phone, the display portion 9403 has a matrix arrangement of light-emitting elements that are similar to those described in Embodiment Modes 1 to 3. The light-emitting elements have a characteristic of high emission efficiency. Since the display portion 9403 including the light-emitting elements has similar characteristics, light emission with high luminance and low power consumption can be achieved. Accordingly, the mobile phone according to the present invention, which achieves low power consumption and high image quality, can be provided as a product that is suitable for portable use.

Figure 5D:
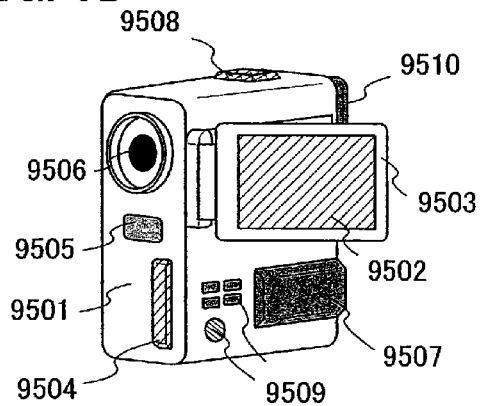

FIG. 5D illustrates a camera according to the present invention. The camera includes a main body 9501, a display portion 9502, a housing 9503, an external connection port 9504, a remote control receiving portion 9505, an image receiving portion 9506, a battery 9507, an audio input portion 9508, an operation key 9509, an eye piece portion 9510, and the like. In this camera, the display portion 9502 has a matrix arrangement of light-emitting elements that are similar to those described in Embodiment Modes 1 to 3. The light-emitting elements have a characteristic of high emission efficiency. Since the display portion 9502 including the light-emitting elements has similar characteristics, light emission with high luminance and low power consumption can be achieved. Accordingly, the camera according to the present invention, which achieves low power consumption and high image quality, can be provided as a product that is suitable for portable use.

As described above, the applicable range of the light-emitting device of the present invention is so wide that the light-emitting device can be applied to electronic appliances in various fields. By using the light-emitting element of the present invention, electronic appliances that have a display portion with high emission efficiency and low power consumption can be provided.

The light-emitting device of the present invention can also be used as a lighting device. One mode using the light-emitting element of the present invention as a lighting device will be described with reference to FIG. 6.

Figure 6:
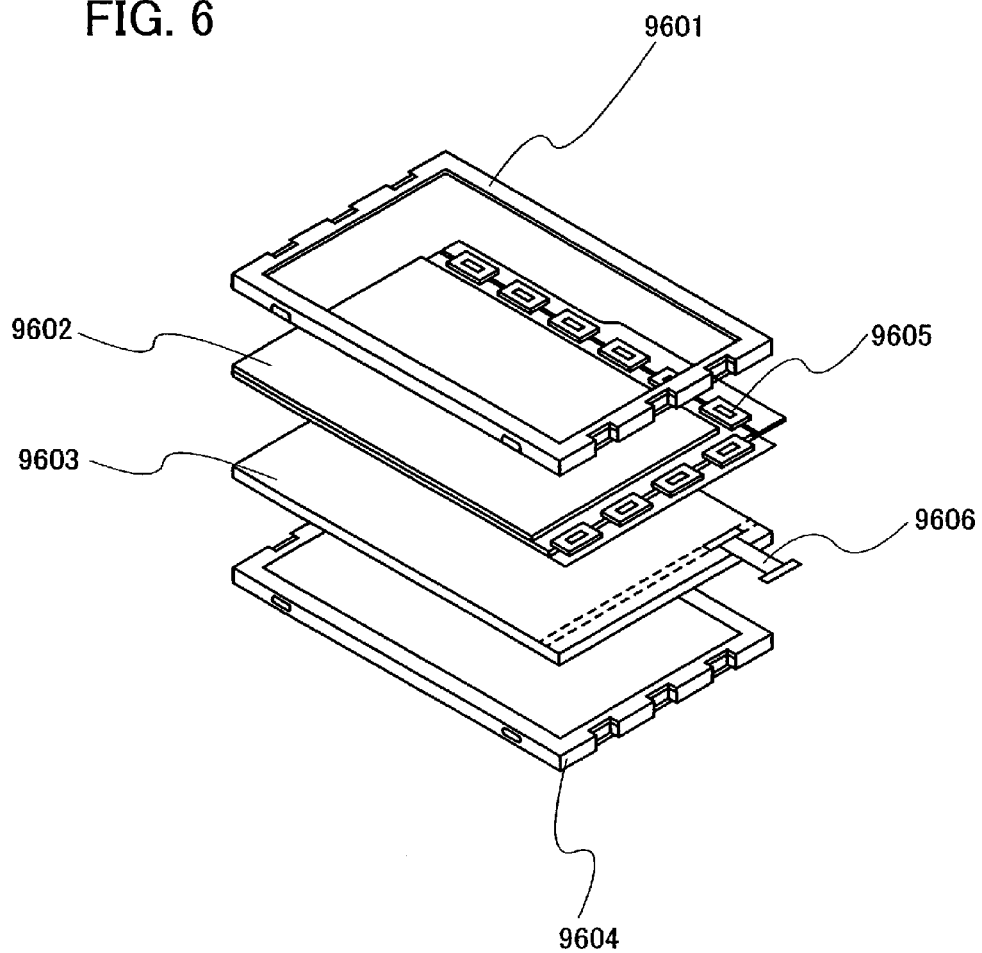
FIG. 6 is a view illustrating a lighting device of the present invention.

FIG. 6 illustrates an example of a liquid crystal display device using the light-emitting device of the present invention as a backlight. The liquid crystal display device illustrated in FIG. 6 includes a housing 9601, a liquid crystal layer 9602, a backlight 9603, and a housing 9604, and the liquid crystal layer 9602 is connected to a driver IC 9605. The light-emitting device of the present invention is used as the backlight 9603, and current is supplied through a terminal 9606.

By using the light-emitting device of the present invention as a backlight of a liquid crystal display device, the backlight with high emission efficiency and low power consumption can be obtained. The light-emitting device of the present invention is a lighting device with plane light emission, and can have a large area. Therefore, the backlight can have a large area, and thus a liquid crystal display device having a large area can be realized. Furthermore, the light-emitting device of the present invention has a thin type and consumes low power, and thus reduction in thickness and low power consumption of a display device can also be realized. Moreover, the light-emitting device of the present invention can emit light with high luminance, and thus the liquid crystal display device including the light-emitting device of the present invention can also emit light with high luminance.

Figure 7:
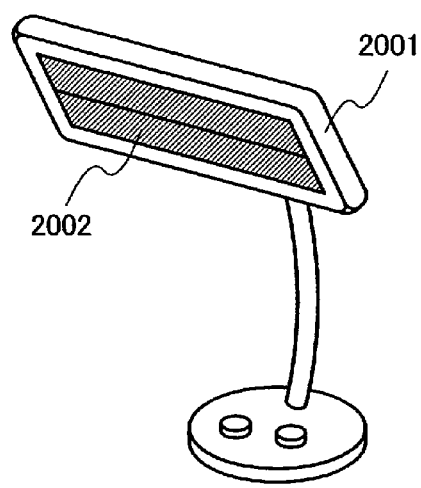
FIG. 7 is a view illustrating a lighting device of the present invention.

FIG. 7 illustrates an example of using the light-emitting device to which the present invention is applied as a table lamp that is a lighting device. The table lamp illustrated in FIG. 7 includes a housing 2001 and a light source 2002 to which the light-emitting device of the present invention is applied. The light-emitting device of the present invention achieves high emission efficiency and low power consumption, and thus the table lamp also achieves high emission efficiency and low power consumption.

Figure 8:
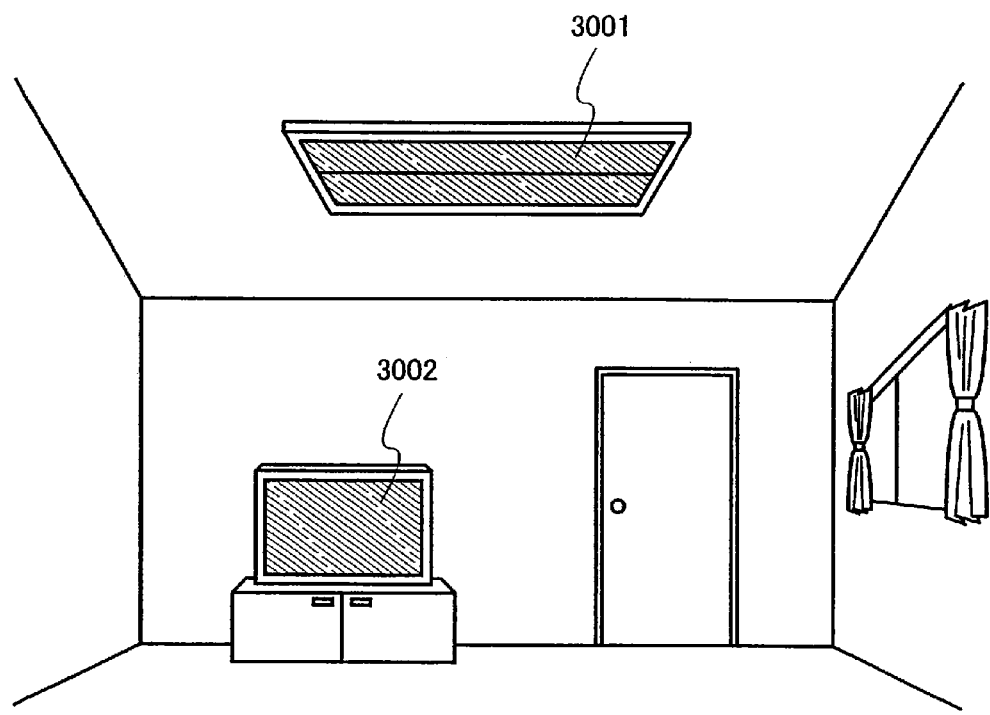
FIG. 8 is a view illustrating a lighting device of the present invention.

FIG. 8 illustrates an example of using the light-emitting device to which the present invention is applied as an indoor lighting device 3001. The light-emitting device of the present invention can have a large area, and thus the light-emitting device of the present invention can be used as a lighting device having a large area. Further, the light-emitting device of the present invention has a thin type and consumes low power, and thus the light-emitting device of the present invention can be used as a thin lighting device with low power consumption. Accordingly, in a room where the light-emitting device to which the present invention is applied is used as the indoor lighting device 3001, a television set 3002 according to the present invention as illustrated in FIG. 5A is placed so that public broadcasting and movies can be watched. In such a case, since both of the devices consume low power, a powerful image can be watched in a bright room without concern about electricity charges.

Embodiment Mode 6

In Embodiment Mode 6, a synthetic method of a spiro-9,9'-bifluorene derivative used for a light-emitting element of the present invention will be explained.

<Synthetic Method of the spiro-9,9'-bifluorene Derivative Represented by the General Formula (1)>

The spiro-9,9'-bifluorene derivative used for the light-emitting element of the present invention can be synthesized by conducting a coupling reaction of an organic compound represented by the following general formula (96) with an organic compound represented by the following general formula (97) using a metal catalyst.

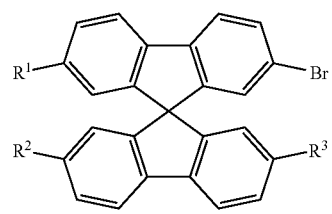

(96)

(Note that, in the formula, $R^1$ is any one of hydrogen and an alkyl group having 1 to 4 carbon atoms. Each of $R^2$ and $R^3$ is any one of hydrogen and an alkyl group having 1 to 4 carbon atoms and $R^2$ and $R^3$ may be identical or different.)

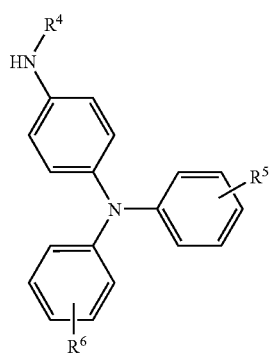

(97)

(Note that, in the formula, $R^4$ is an aryl group having 6 to 15 carbon atoms. Each of $R^5$ and $R^6$ is any one of hydrogen, an alkyl group having 1 to 4 carbon atoms, and an aryl group having 6 to 15 carbon atoms and $R^2$ and $R^3$ may be identical or different.)

As represented by the following synthetic scheme (a), the above general formula (96) and the above general formula (97) are heated in an appropriate solvent using a metal catalyst, thereby obtaining the spiro-9,9'-bifluorene derivative represented by the general formula (1).

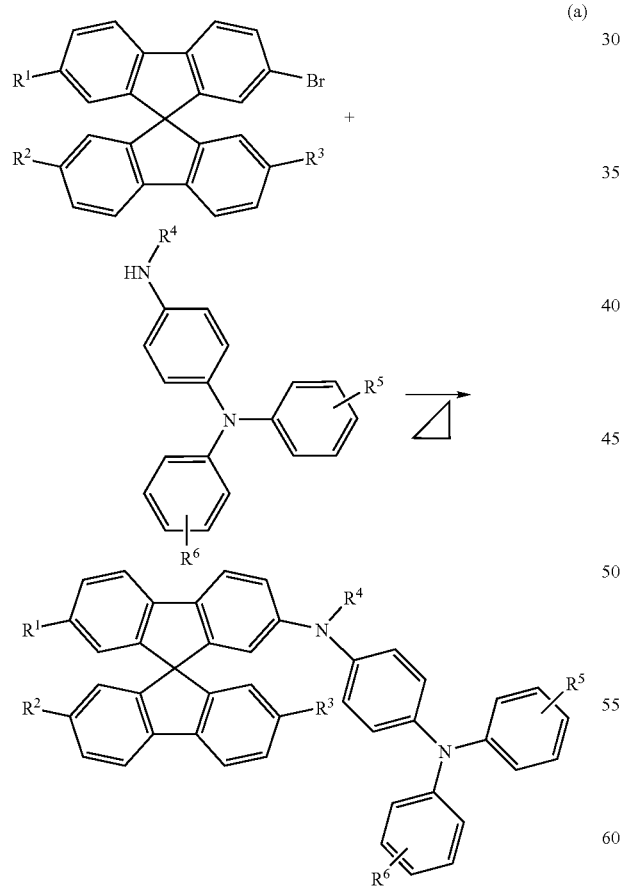

(a)

(Note that, in the formula, $R^1$ is any one of hydrogen and an alkyl group having 1 to 4 carbon atoms. Each of $R^2$ and $R^3$ is any one of hydrogen and an alkyl group having 1 to 4 carbon atoms and $R^2$ and $R^3$ may be identical or different. $R^4$ is an aryl group having 6 to 15 carbon atoms. Each of $R^5$ and $R^6$ is any one of hydrogen, an alkyl group having 1 to 4 carbon atoms, and an aryl group having 6 to 15 carbon atoms and $R^2$ and $R^3$ may be identical or different.)

Example 1

In Example 1, the light-emitting element of the present invention will be explained with reference to FIG. 9. A chemical formulae of materials used in this embodiment is shown below.

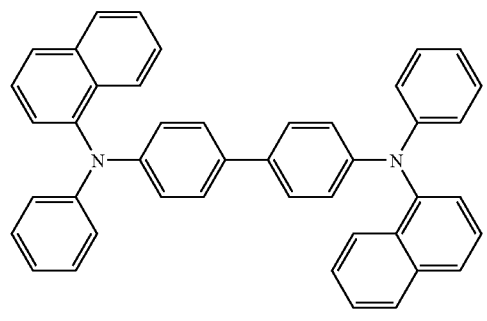

NPB

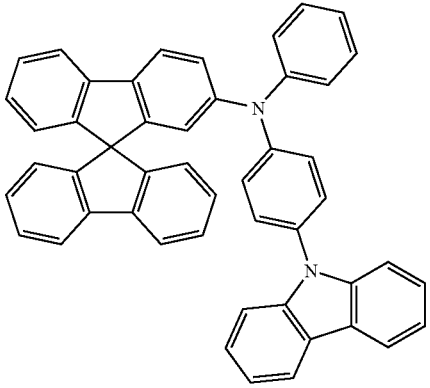

YGASF

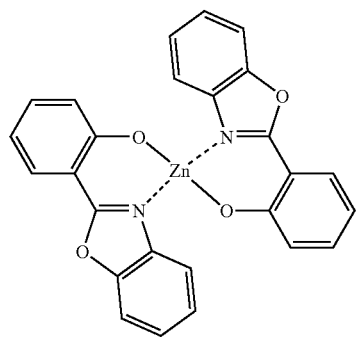

Zn (PBO)$_2$

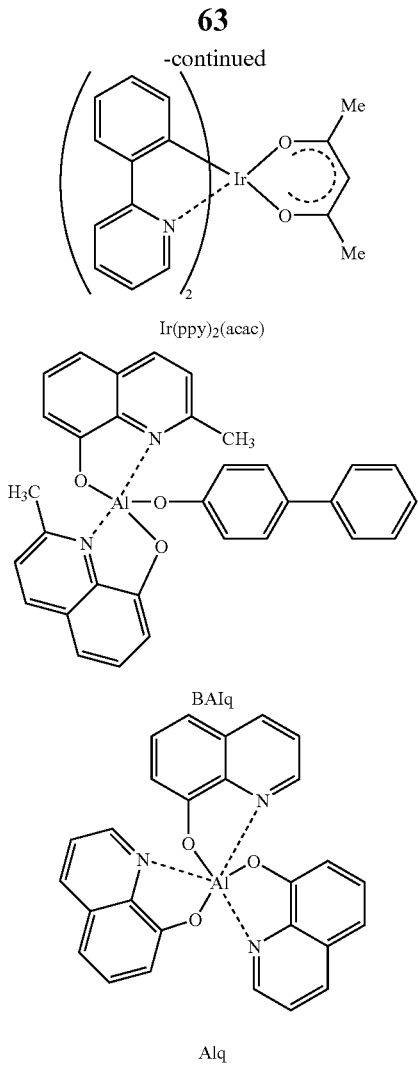

Ir(ppy)₂(acac)

BAlq

Alq (Light-Emitting Element 1)

First, a first electrode 1102 was formed using indium tin oxide containing silicon oxide over a glass substrate 1101 by a sputtering method. The film thickness of the first electrode 1102 was 110 nm and the area thereof was 2 mm×2 mm.

Next, the substrate provided with the first electrode was fixed to a substrate holder that was provided in a vacuum evaporation apparatus so that a surface provided with the first electrode faced downward. The pressure in the vacuum evaporation apparatus was reduced to approximately $10^{-4}$ Pa. Then, a layer 1103 containing a composite material of an organic compound and an inorganic compound was formed on the first electrode 1102 by co-evaporation of NPB and molybdenum(VI) oxide. The film thickness was 50 nm and the weight ratio between NPB and molybdenum oxide was adjusted to be 4:1 (NPB:molybdenum oxide). Note that the co-evaporation refers to an evaporation method by which evaporation is carried out simultaneously from a plurality of evaporation sources in one treatment chamber.

Next, a hole transporting layer 1104 was formed on the layer 1103 containing the composite material with a thickness of 10 nm using 2-{N-[4-(N-carbazolyl)phenyl]N-phenylamino]-spiro-9,9'-bifluorene (abbrev.: YGASF) by an evaporation method using resistance heating.

Further, a light-emitting layer 1105 was formed with a thickness of 30 nm on the hole transporting layer 1104 by co-evaporation of Zn(PBO)₂ and Ir(ppy)₂(acac). Here, the weight ratio between Zn(PBO)₂ and Ir(ppy)₂(acac) was adjusted to be 1:0.05 (=Zn(PBO)₂:Ir(ppy)₂(acac)).

Then, an electron transporting layer 1106 was formed with a thickness of 10 nm on the light-emitting layer 1105 by an evaporation method using resistance heating by using bis(2-methyl-8-quinolinolato)(4-phenylphenolato)aluminum (abbrev.: BAlq).

Further, an electron injecting layer 1107 was formed with a thickness of 20 nm on the electron transporting layer 1106 by co-evaporation of tris(8-quinolinolato)aluminum (abbrev.: Alq) and lithium. The weight ratio between Alq and lithium was adjusted to be 1:0.01 (=Alq:lithium).

Lastly, a second electrode 1108 was formed with a thickness of 200 nm using aluminum on the electron injecting layer 1107 by an evaporation method using resistance heating. Thus, the light-emitting element 1 was manufactured.

Figure 10:
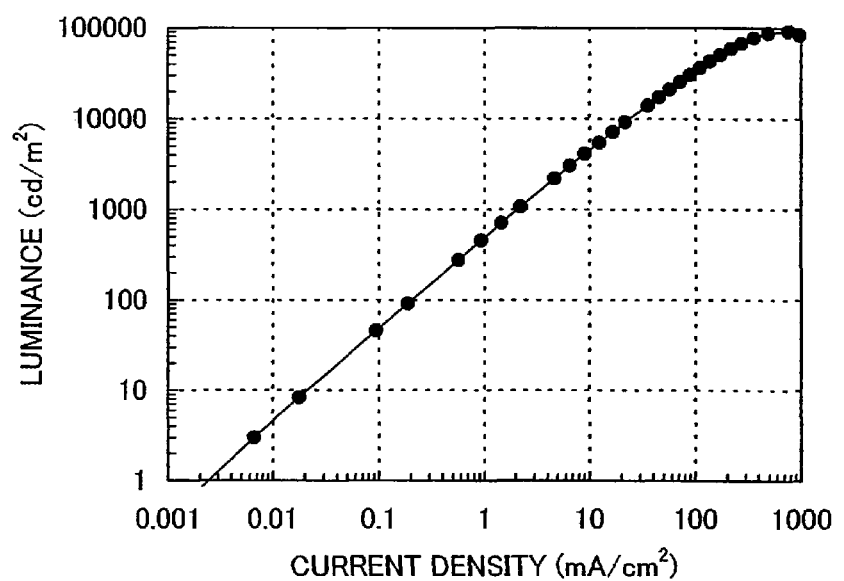
FIG. 10 shows a luminance-current density characteristic of a light-emitting element manufactured in Embodiment 1.
Figure 11:
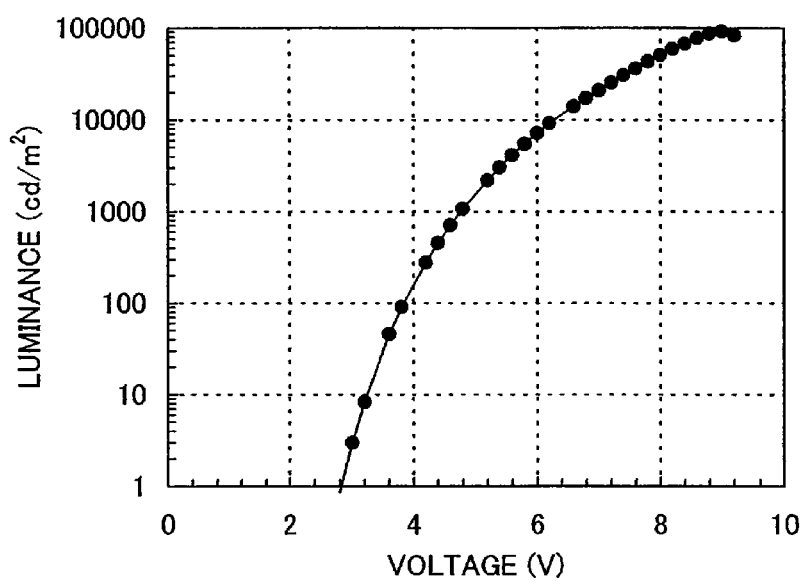
FIG. 11 shows a luminance-voltage characteristic of a light-emitting element manufactured in Embodiment 1.
Figure 12:
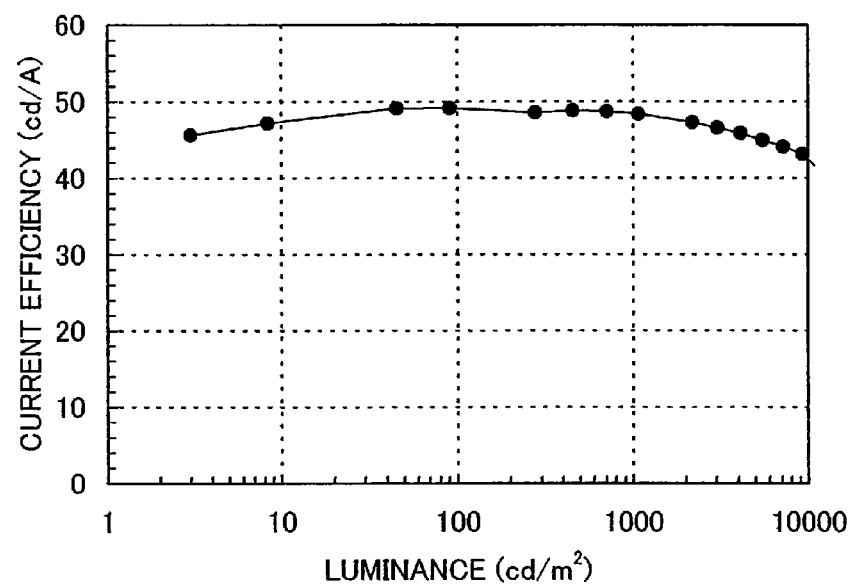
FIG. 12 shows a current efficiency-luminance characteristic of a light-emitting element manufactured in Embodiment 1.
Figure 13:
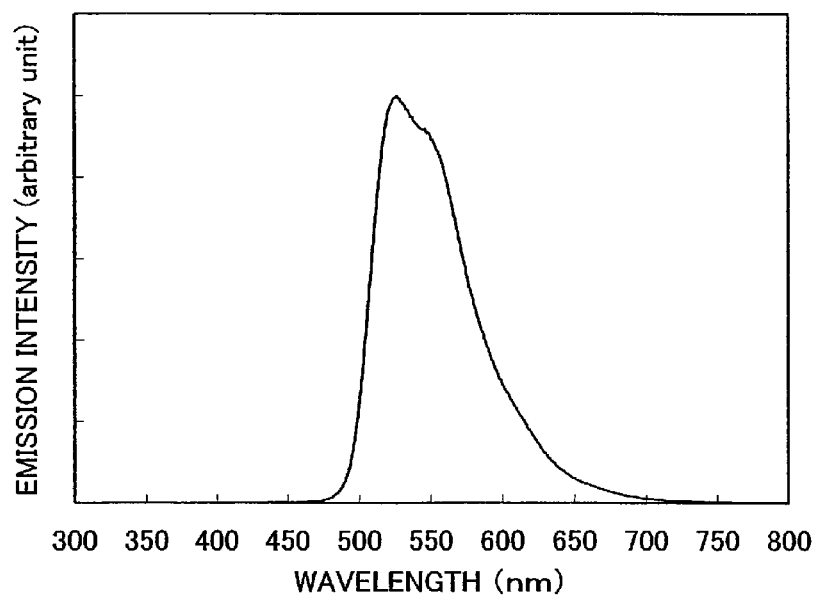
FIG. 13 shows an emission spectrum of a light-emitting element manufactured in Embodiment 1.

FIG. 10 shows a current density-luminance characteristic of the light-emitting element 1. FIG. 11 shows a voltage-luminance characteristic thereof. FIG. 12 shows a luminance-current efficiency characteristic thereof. FIG. 13 shows an emission spectrum upon applying a current of 1 mA.

Comparative Example 1

In Comparative Example 1, a light-emitting element in which NBP is used as a hole-transporting layer and the other structure is similar to that of the light-emitting element 1 will be explained with reference to FIG. 9.

Figure 9:
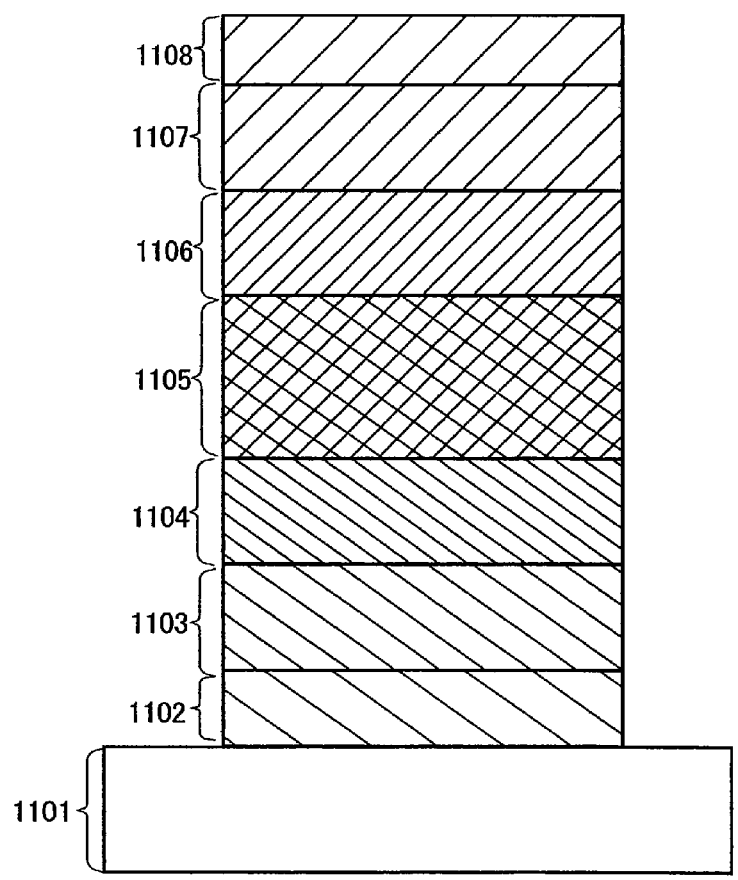
FIG. 9 is a view illustrating a light-emitting element in Embodiments.

In this comparative example, as shown in FIG. 9, NPB is used for a hole-transporting layer 1104 which is formed on a layer 1103 containing a composite material, thereby forming the light-emitting element, which is similar to the light-emitting element in which YGASF is used for the hole-transporting layer. That is, in both of the light-emitting elements, structures, film thicknesses and manufacturing methods of all the layers are the same except the materials of the hole-transporting layers.

Figure 14:
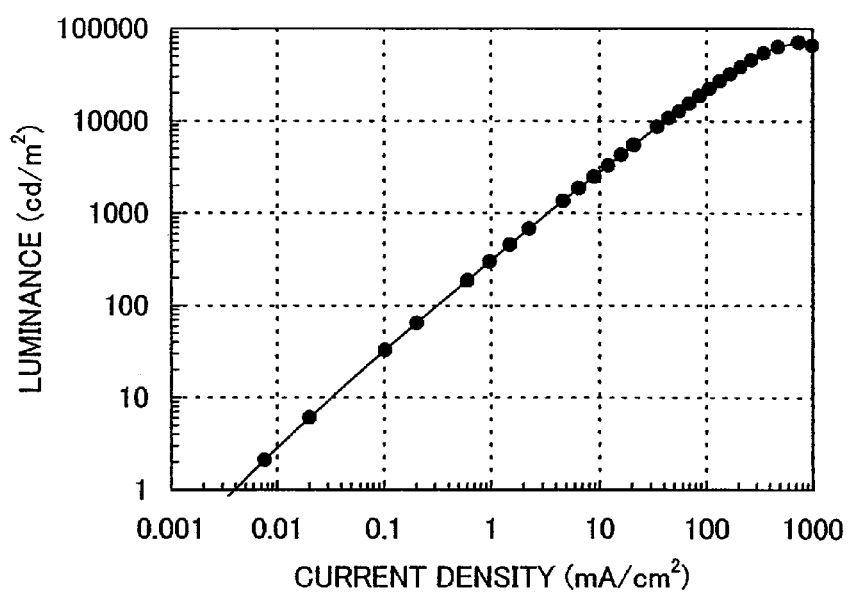
FIG. 14 shows a luminance-current density characteristic of a light-emitting element manufactured in Comparative Example 1.
Figure 15:
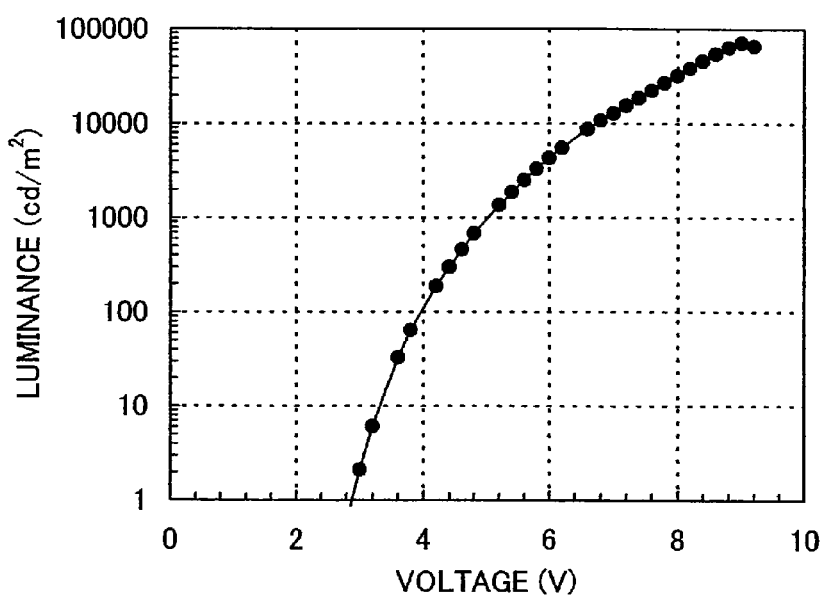
FIG. 15 shows a luminance-voltage characteristic of a light-emitting element manufactured in Comparative Example 1.
Figure 16:
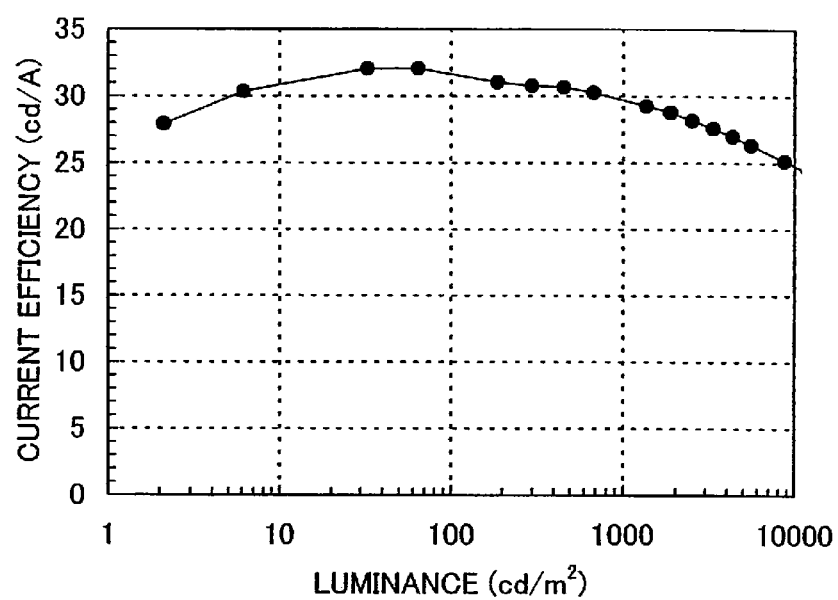
FIG. 16 shows a current efficiency-luminance characteristic of a light-emitting element manufactured in Comparative Example 1.
Figure 17:
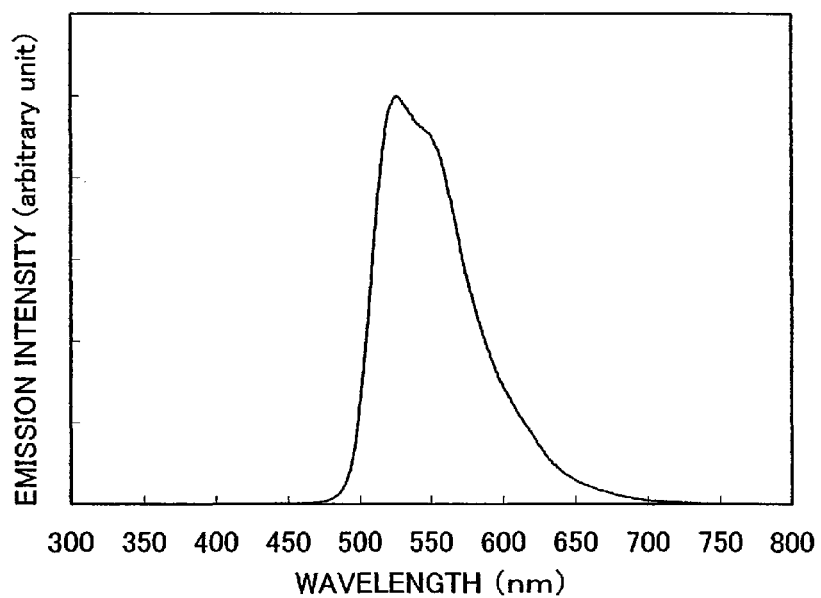
FIG. 17 shows an emission spectrum of a light-emitting element manufactured in Comparative Example 1.

FIG. 14 shows a luminance-current density characteristic of the light-emitting element. FIG. 15 shows a luminance-voltage characteristic. FIG. 16 shows a current efficiency-luminance characteristic. FIG. 17 shows an emission spectrum upon applying a current of 1 mA.

Table 1 shows a characteristic at a luminance of approximately 460 cd/m².

TABLE 1

|  | VOLTAGE [V] | CURRENT EFFICIENCY [cd/A] | EXTERNAL QUANTUM EFFICIENCY [%] | POWER EFFICIENCY [lm/W] |
|---|---|---|---|---|
| EMBODIMENT | 4.4 | 49 | 13 | 35 |
| COMPARATIVE EXAMPLE | 4.6 | 31 | 8.2 | 21 |

As described above, the light-emitting element of the present invention has very favorable characteristics. Since the spiro-9,9'-bifluorene derivative included in the light-emitting element of the present invention has a high glass transition temperature (Tg), the light-emitting element of the present invention has high heat resistance. In light-emitting elements with the same structure, when the light-emitting element in which NPB is used for a hole transporting layer is compared to the light-emitting element in which YGASF of the present invention is used for a hole transporting layer, the light-emitting element in which NPB is used has lower light emission efficiency. The decrease in light emission efficiency of the light-emitting element in which NPB is used is significant in a light-emitting element in which an electron-transporting host material is used as a host material of a light-emitting layer.

A synthetic example of YGASF used in Embodiment 1 will be explained.

<Synthetic Example of YGASF>

A synthetic example of YGASF will be explained in this synthetic example.

YGASF can be synthesized by conducting a coupling reaction of 2-bromo-spiro-9,9'-bifluorene, which is represented by the following structural formula (98) and 9-[4-(N-phenylamino)phenyl]carbazole (abbrev.: YGA), which is represented by the following structural formula (99), using a metal catalyst.

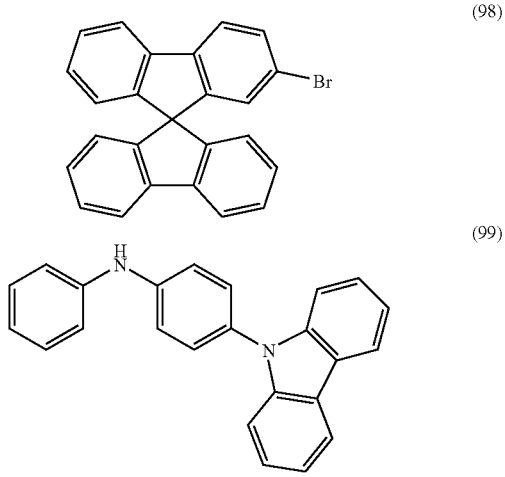

[Step 1]

A synthetic method of 2-bromo-spiro-9,9'-bifluorene will be explained.

1.26 g (0.052 mol) of magnesium was put in a 100-mL three-neck flask to which a dropping funnel and a Dimroth condenser were connected, and the flask was evacuated. The magnesium was activated by heating and stirring for 30 minutes. After cooling to room temperature, the flask was placed under a nitrogen flow. 5 mL of diethyl ether and several drops of dibromoethane were added thereto, and 11.65 g (0.050 mol) of 2-bromobiphenyl dissolved in 15 mL of diethyl ether was slowly dripped from the dropping funnel into the mixture. After the dripping was finished, the mixture was refluxed for 3 hours and made into a Grignard reagent. 11.7 g (0.045 mol) of 2-bromo-9-fluorenone and 40 mL of diethyl ether were put in a 200-mL three-neck flask to which a dropping funnel and a Dimroth condenser were connected. To this reaction solution, the synthesized Grignard reagent was slowly dripped from the dropping funnel. After the dripping was finished, the mixture was refluxed for 2 hours, and then stirred at room temperature for about 12 hours. After the reaction was finished, the solution was washed twice with a saturated ammonia chloride solution. An aqueous layer was extracted twice with ethyl acetate and was washed with saturated saline together with an organic layer. After drying with magnesium sulfate, suction filtration and concentration were conducted; thus, 18.76 g of a solid of 9-(biphenyl-2-yl)-2-bromo-9-fluorenol was obtained in the yield of 90%.

A synthetic scheme (a-1) of 9-(biphenyl-2-yl)-2-bromo-9-fluorenol is shown below.

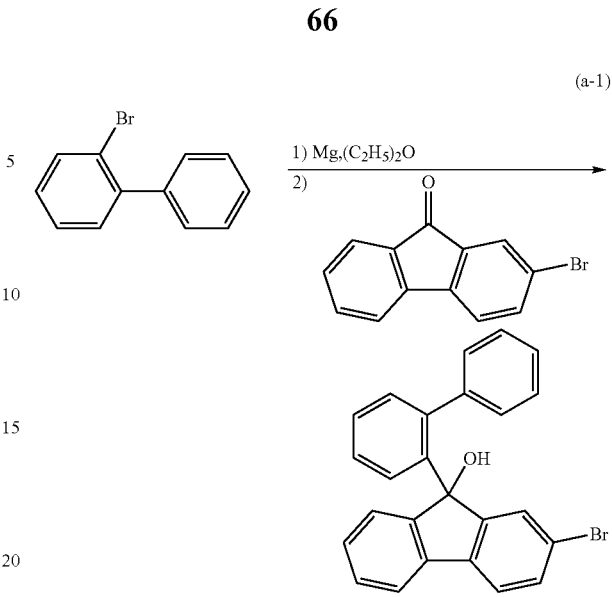

18.76 g (0.045 mol) of the synthesized 9-(biphenyl-2-yl)-2-bromo-9-fluorenol and 100 mL of glacial acetic acid were put in a 200-mL three-neck flask, several drips of concentrated hydrochloric acid were added thereto, and the mixture was refluxed for 2 hours. After the reaction was finished, a precipitate was collected by suction filtration, and the precipitate was filtered and washed with a saturated sodium hydrogen carbonate solution and water. The obtained brown solid was recrystallized with ethanol; thus, 10.24 g of a light-brown powdered solid was obtained as 2-bromo-spiro-9,9'-fluorene in the yield of 57%.

A synthetic scheme (a-2) of 2-bromo-spiro-9,9'-fluorene is shown below.

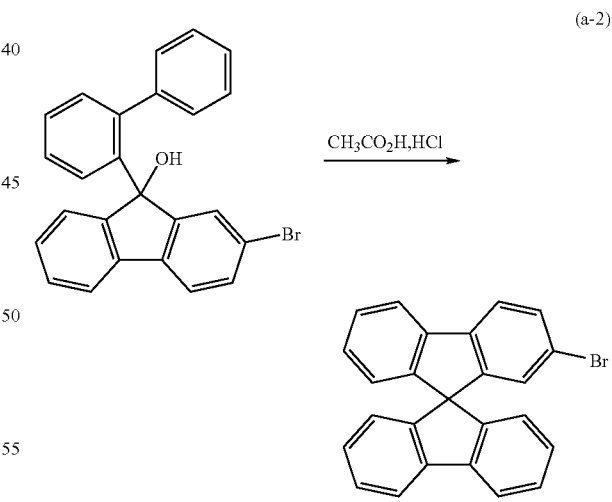

[Step 2]

A synthetic method of YGA will be explained.

56.3 g (0.24 mol) of 1,4-dibromobenzene, 31.3 g (0.18 mol) of carbazole, 4.6 g (0.024 mol) of copper iodide, 66.3 g (0.48 mol) of potassium carbonate, and 2.1 g (0.008 mol) of 18-crown-6-ether were placed in a 300-mL three-neck flask, and nitrogen substitution was carried out. 8 mL of DMPU was added, and the mixture was stirred for 6 hours at 180° C. After cooling the reaction mixture to room temperature, the precipitate was removed by suction filtration. The filtrate was washed with dilute hydrochloric acid, a saturated sodium hydrogen carbonate solution, and a saturated saline solution, in this order, and then dried with magnesium sulfate. After drying, the reaction mixture was filtered naturally, the filtrate was concentrated, and the oily substance obtained was purified by silica gel column chromatography (hexane:ethyl acetate=9:1). After recrystallization with chloroform and hexane, 20.7 g of light brown plate-shaped crystals were obtained as N-(4-bromophenyl)carbazole in the yield of 35%.

A synthetic scheme (b-1) of N-(4-bromophenyl)carbazole is shown below.

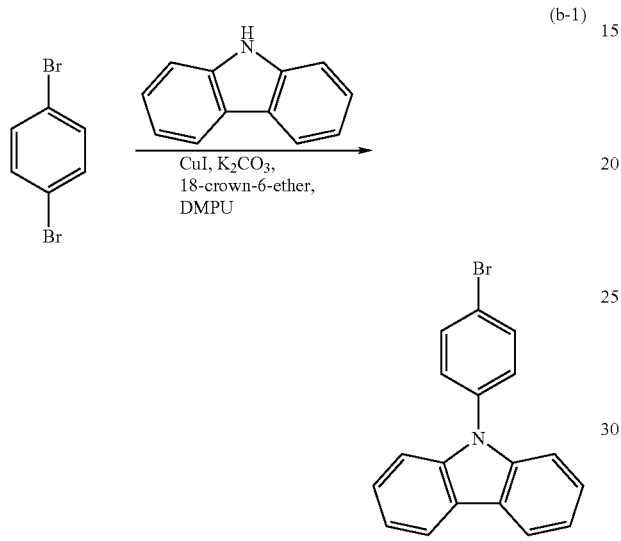

(b-1)

5.4 g (17.0 mmol) of N-(4-bromophenyl)carbazole, 1.8 mL (20.0 mmol) of aniline, 100 mg (0.17 mmol) of bis(dibenzylideneacetone)palladium(0) (abbrev.: Pd(dba)₂), and 3.9 g (40 mmol) of sodium-t-butoxide (abbrev.: t-BuONa) were put in a 200-mL three-neck flask, and nitrogen substitution was conducted. 0.1 mL of tri-t-butylphosphine (abbrev.: P(t-Bu)₃) and 50 mL of toluene were added, and the mixture was stirred for 6 hours at 80° C. The reaction mixture was filtered through Florisil (manufactured by Wako Pure Chemical Industries, Ltd., catalog number: 540-00135), Celite (manufactured by Wako Pure Chemical Industries, Ltd., catalog number: 531-16855) and alumina. The filtrate was washed with water and a saturated saline solution, and then dried with magnesium sulfate. The reaction mixture was filtered naturally. The filtrate was concentrated, and the oily substance obtained was purified by silica gel column chromatography (hexane:ethyl acetate=9:1), and thus 4.1 g of YGA was obtained in the yield of 73%.

A synthetic scheme (b-2) of YGA is shown below.

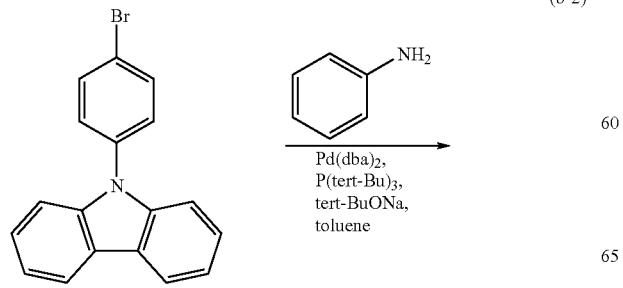

(b-2)

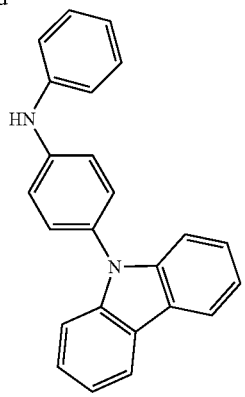

[Step 3]

A synthetic method of YGASF will be explained.

2.0 g (5.1 mmol) of 2-bromo-spiro-9,9'-bifluorene, 1.7 mg (5.1 mmol) of YGA, 30.4 mg (0.05 mmol) of bis(dibenzylideneacetone)palladium(0), and 2.0 g (21 mmol) of t-butoxysodium were placed in a 100-mL three-neck flask. Nitrogen substitution was carried out, 30 mL of toluene was added, and the 100-mL three-neck flask was depressurized and degassed. 0.1 mL of tri(t-butyl)phosphine (10 wt % hexane solution) was added, and the mixture was stirred for 6 hours at 80° C. After the reaction, filtration was performed through Celite (manufactured by Wako Pure Chemical Industries, Ltd., catalog number: 531-16855). The filtrate was washed 3 times with water and once with a saturated saline solution, and dried with magnesium sulfate. The reaction mixture was naturally filtered, the filtrate was concentrated, and an oily substance was obtained. This oily substance was purified by silica gel column chromatography (hexane:toluene=7:3), and after concentration and recrystallization with chloroform and hexane, 2.9 g of YGASF was obtained as a white powdered solid in the yield of 88%.

A synthetic scheme (c-1) of YGASF is shown below.

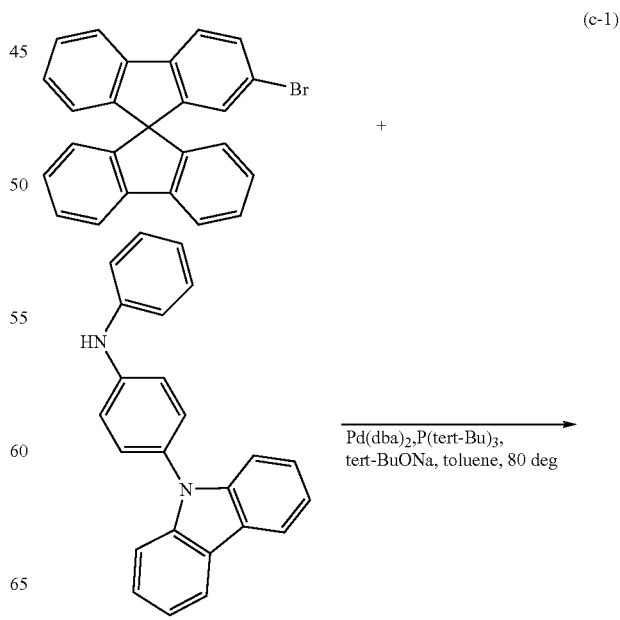

(c-1)

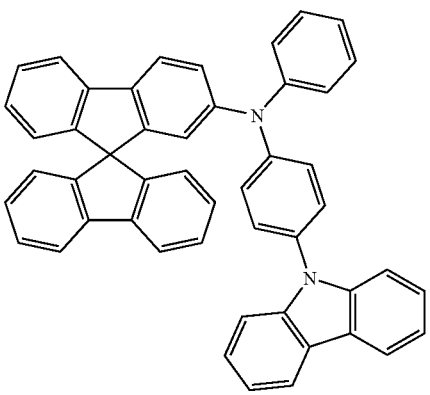

Example 2

In this example, a method of manufacturing a light-emitting element which is different from the light-emitting element in Example 1 in which Zn(PBO)$_2$ is used as a host material for a light-emitting layer will be explained with reference to FIG. 9. A chemical formula of a material used in this example is shown below.

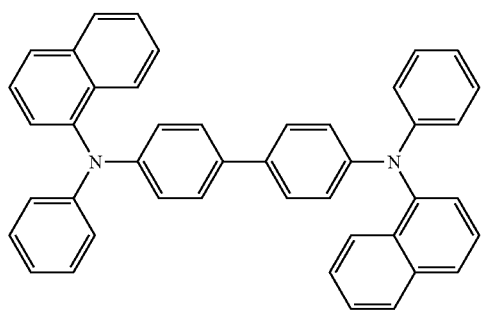

NPB

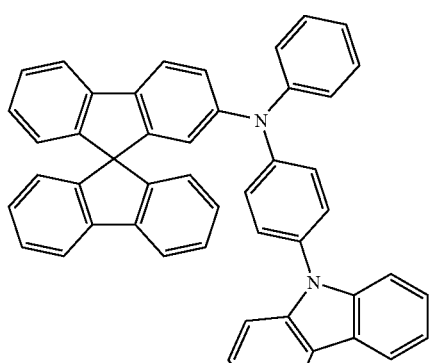

YGASF

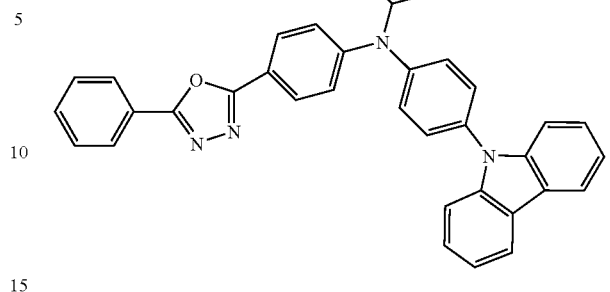

YGAO11

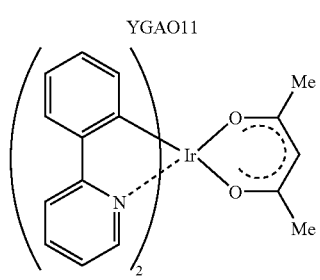

Ir(ppy)$_2$(acac)

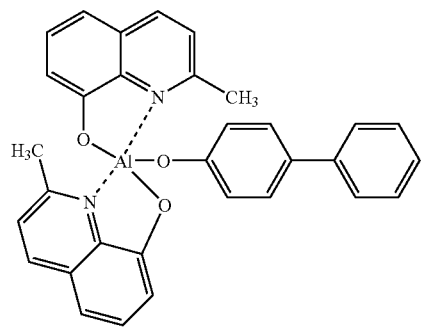

BAlq

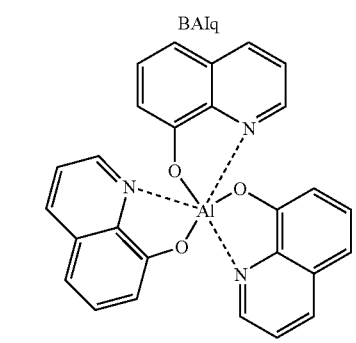

Alq (Light-Emitting Element 2)

First, indium tin oxide containing silicon oxide was formed over a glass substrate 1101 by a sputtering method to form a first electrode 1102. The film thickness of the first electrode 1102 was 110 nm and the area thereof was 2 mm×2 mm.

Next, the glass substrate provided with the first electrode was fixed to a substrate holder that was provided in a vacuum evaporation apparatus so that a surface provided with the first electrode faced downward. The pressure in the vacuum evaporation apparatus was reduced to approximately 10$^{-4}$ Pa. Then, a layer 1103 containing a composite material was formed with a thickness of 50 nm on the first electrode 1102 by co-evaporation of NPB:molybdenum(VI) oxide (NPB and molybdenum oxide=4:1).

Next, a hole transporting layer 1104 was formed on the layer 1103 containing the composite material, with a thickness of 10 nm using YGASF by an evaporation method using resistance heating.

Next, a light-emitting layer 1105 was formed on the hole transporting layer 1104, with a thickness of 30 nm by co-evaporation of YGAO11 and Ir(ppy)$_2$(acac) by an evaporation method using resistance heating. The weight ratio between YGAO11 and Ir(ppy)$_2$(acac) was 1:0.06. Note that YGAO11 was used as a host material and Ir(ppy)$_2$(acac) was used as a dopant material.

Then, an electron transporting layer 1106 was formed of BAlq with a thickness of 10 nm on the light-emitting layer 1105 by an evaporation method using resistance heating.

An electron injecting layer 1107 was formed with a thickness of 20 nm by co-evaporation of Alq$_3$ and lithium. The weight ratio between Alq$_3$ and lithium was adjusted to be 1:0.01.

Lastly, a second electrode 1108 was formed with a thickness of 200 nm using Al on the electron injecting layer 1107 by an evaporation method using resistance heating. Thus, the light-emitting element 2 was manufactured.

Figure 18:
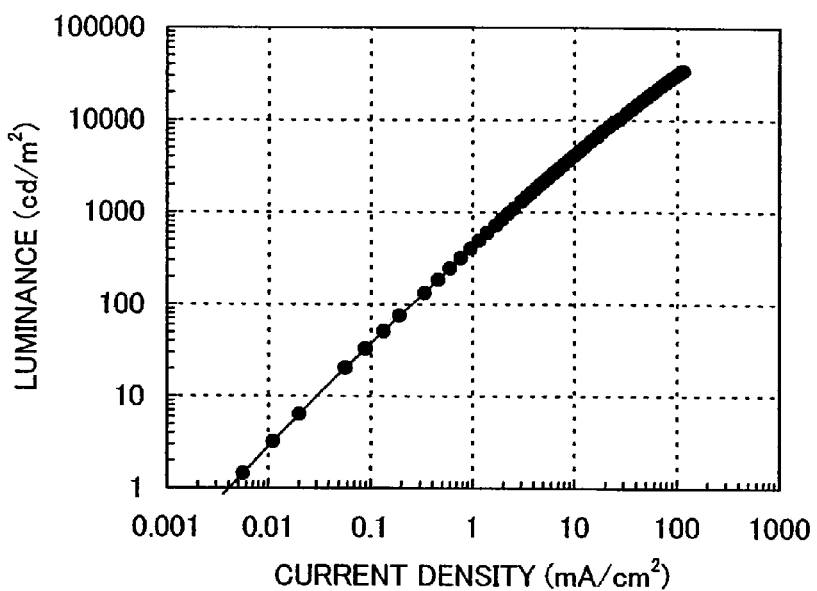
FIG. 18 shows a luminance-current density characteristic of a light-emitting element manufactured in Embodiment 2.
Figure 19:
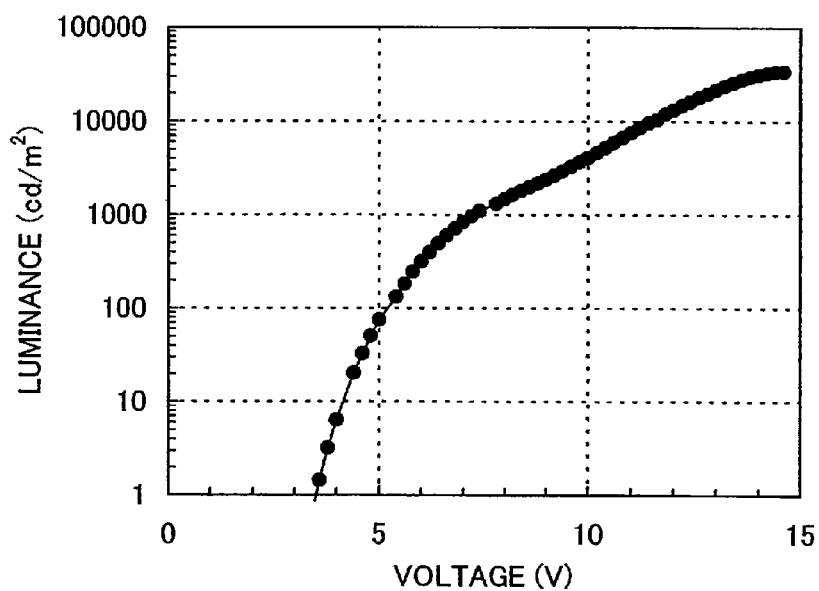
FIG. 19 shows a luminance-voltage characteristic of a light-emitting element manufactured in Embodiment 2.
Figure 20:
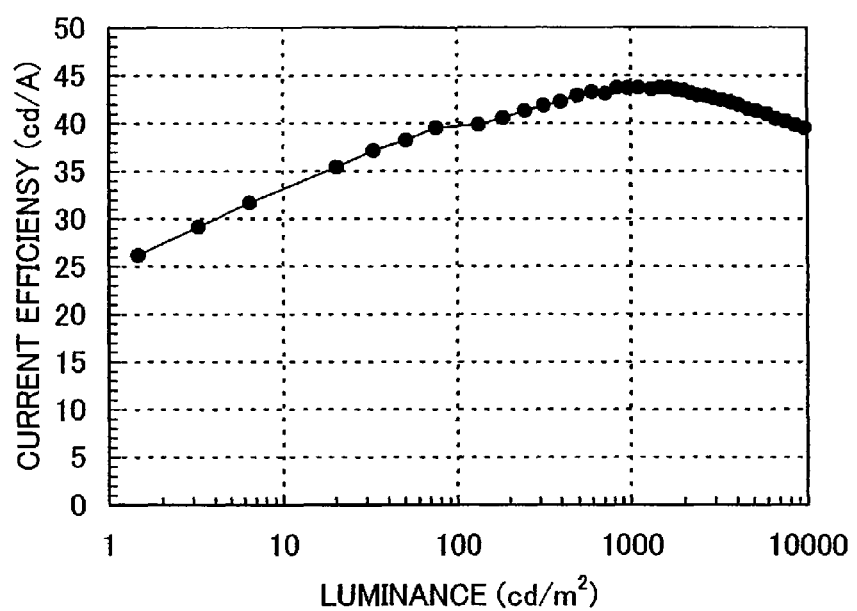
FIG. 20 shows a current efficiency-luminance characteristic of a light-emitting element manufactured in Embodiment 2.
Figure 21:
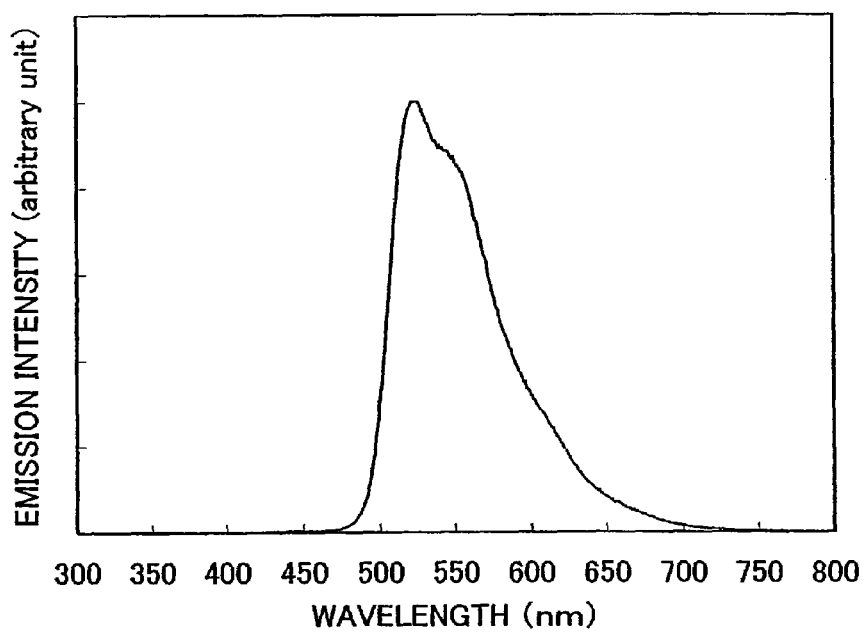
FIG. 21 shows an emission spectrum of a light-emitting element manufactured in Embodiment 2.

FIG. 18 shows a luminance-current density characteristic of the light-emitting element 2. FIG. 19 shows a luminance-voltage characteristic thereof. FIG. 20 shows a current efficiency-luminance characteristic thereof. FIG. 21 shows an emission spectrum upon applying a current of 1 mA.

Comparative Example 2

In Comparative Example 2, a light-emitting element in which NBP is used as a hole-transporting layer and the other structure is similar to that of the light-emitting element 2 will be explained with reference to FIG. 9.

In this comparative example, as shown in FIG. 9, NPB is used for a hole-transporting layer 1104 which is formed on a layer 1103 containing a composite material, thereby forming the light-emitting element. The light-emitting layer in this comparative example is similar to the above-described light-emitting element 2 of the present invention, that is, the light-emitting element using YGASF for a hole transporting layer, except that NPB was used for a hole-transporting layer. That is, in the both light-emitting elements, structures, film thicknesses and manufacturing methods of all the layers are the same except materials of the hole-transporting layers.

Figure 22:
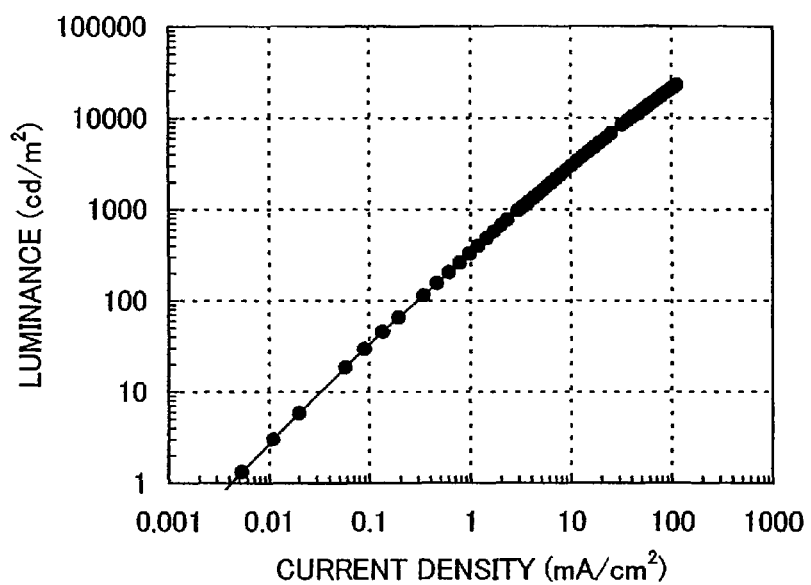
FIG. 22 shows a luminance-current density characteristic of a light-emitting element manufactured in Comparative Example 2.
Figure 23:
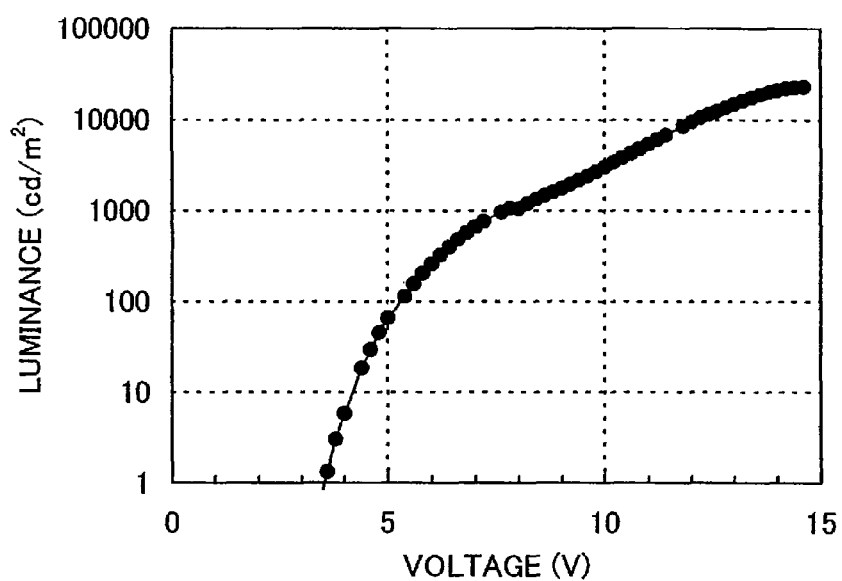
FIG. 23 shows a luminance-voltage characteristic of a light-emitting element manufactured in Comparative Example 2.
Figure 24:
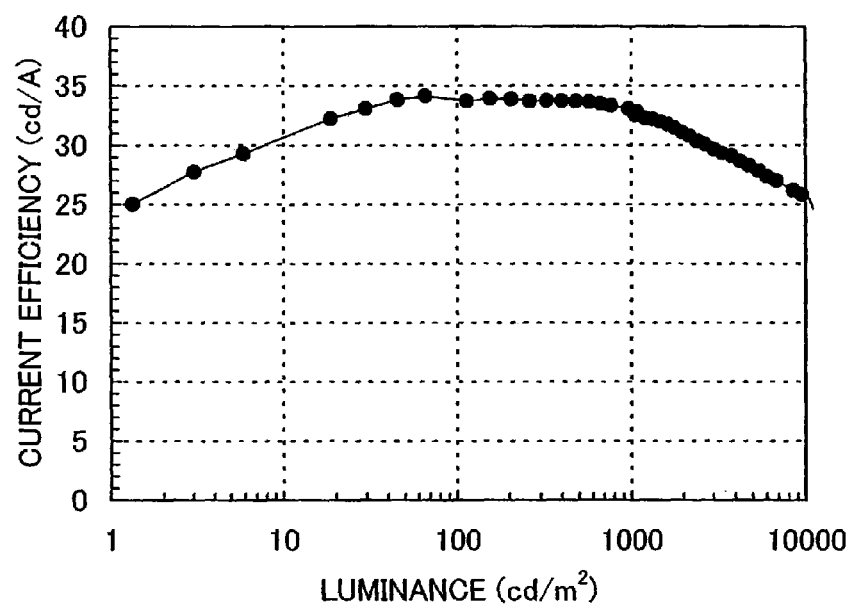
FIG. 24 shows a current efficiency-luminance characteristic of a light-emitting element manufactured in Comparative Example 2.
Figure 25:
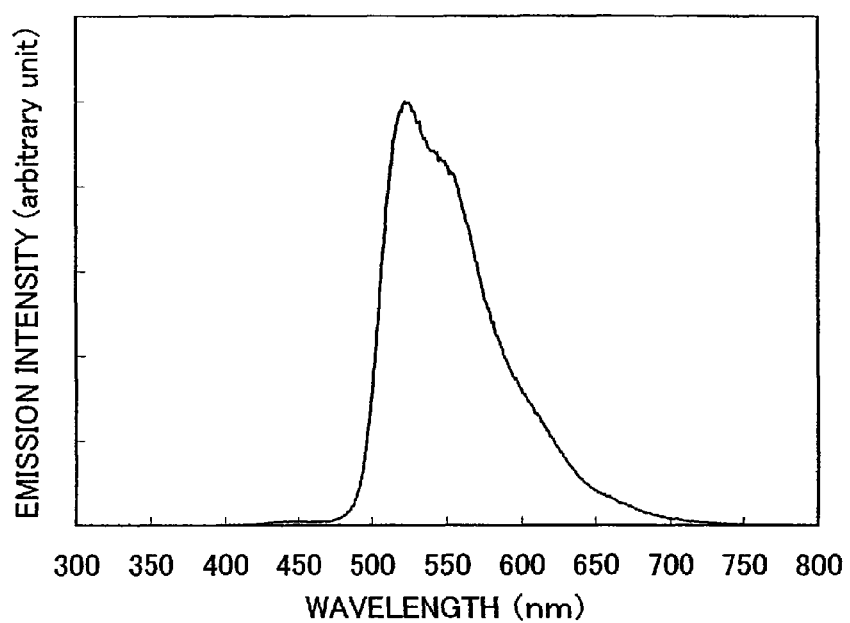
FIG. 25 shows an emission spectrum of a light-emitting element manufactured in Comparative Example 2.

FIG. 22 shows a luminance-current density characteristic of the light-emitting element. FIG. 23 shows a luminance-voltage characteristic. FIG. 24 shows a current efficiency-luminance characteristic. FIG. 25 shows an emission spectrum upon applying a current of 1 mA.

When the current efficiency of the light-emitting element of the present invention shown in FIG. 20 and the current efficiency of the comparative element shown in FIG. 24 are compared, the light-emitting element of the present invention has higher current efficiency.

A synthetic example of YGAO11 used in Example 2 will be explained.

<Synthetic Example of YGAO11>

In this synthetic example, a synthetic example of YGAO11 will be explained.

To a toluene solution (45 mL) including 3.0 g (10.0 mmol) of 2-(4-bromophenyl)-5-phenyl-1,3,4-oxadiazole, 3.4 g (10.0 mmol) of 9-(4-[N-phenylamino]phenyl)carbazole, and 1.9 g (19.9 mmol) of sodium t-butoxide, 0.3 mL of tri-t-butylphosphine (10% hexane solution) and 0.3 g (0.6 mmol) of bis(dibenzylideneacetone)palladium(0) were added under nitrogen atmosphere. The mixture was heated at 120° C. for 5 hours. After the reaction was finished, the reaction solution was cooled to room temperature and filtered using Celite (manufactured by Wako Pure Chemical Industries, Ltd., catalog number: 531-16855). The filtrate was washed with water and dried with magnesium sulfate. The dried reaction solution was filtered and the filtrate was concentrated to obtain a solid. The solid was dissolved in toluene and then purified by silica gel column chromatography (toluene, and then toluene:ethyl acetate=1:1). The resultant substance was concentrated and recrystallized with chloroform and hexane to obtain 4.7 g of YGAO11 as a light yellow solid in the yield of 85%.

A synthetic scheme (d-1) of YGAO11 is shown below.

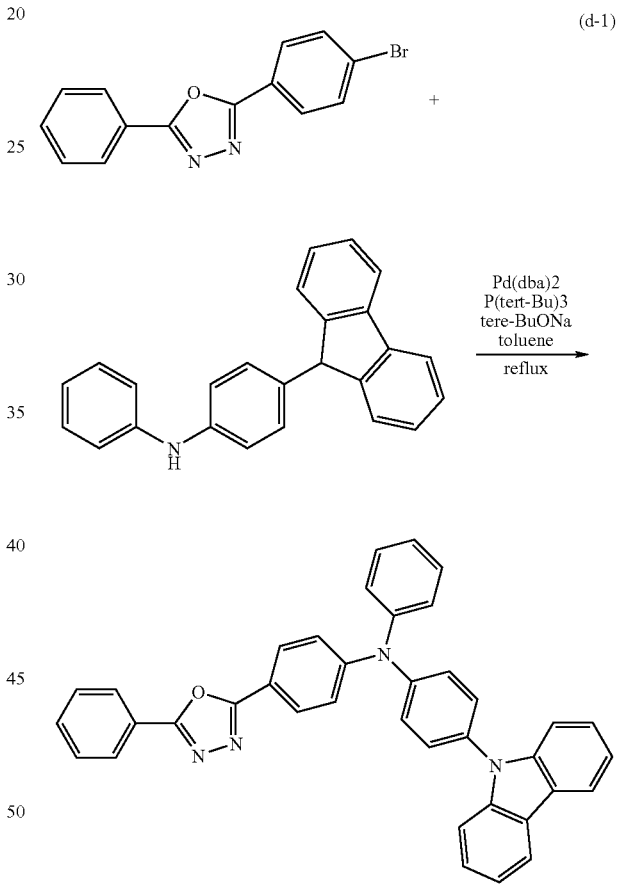

This application is based on Japanese Patent Application serial no. 2007-049843 filed with Japan Patent Office on Feb. 28, in 2007, the entire contents of which are hereby incorporated by reference.

The invention claimed is:

1. A light-emitting element comprising:
a first layer over an anode;
an N layer over the first layer;
a P layer over the N layer;
a second layer over the P layer; and
a cathode over the second layer,
wherein each of the first layer and the second layer contains a third layer and a fourth layer over the third layer, wherein the third layer contains a spirofluorene derivative represented by the structure:

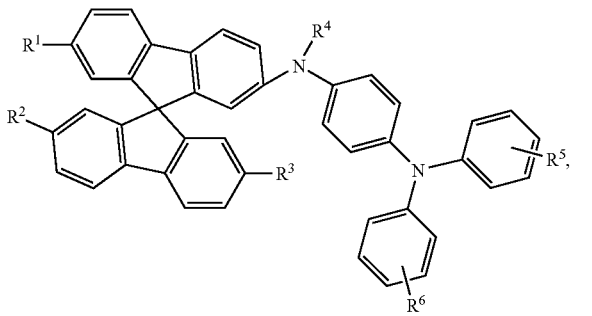

wherein R¹ is any one of hydrogen and an alkyl group having 1 to 4 carbon atoms, each of R² and R³ is any one of hydrogen and an alkyl group having 1 to 4 carbon atoms and R² and R³ may be identical or different, R⁴ is an aryl group having 6 to 15 carbon atoms, each of R⁵ and R⁶ is any one of hydrogen, an alkyl group having 1 to 4 carbon atoms, and an aryl group having 6 to 15 carbon atoms and R⁵ and R⁶ may be identical or different, wherein the fourth layer contains a phosphorescent compound, wherein the N layer contains an organic compound and an electron donor, and wherein the P layer contains an organic compound and an electron acceptor.

2. A light-emitting element according to claim 1, wherein R⁴ is a substituent represented by the structure:

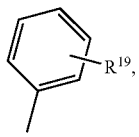

wherein R¹⁹ is any one of hydrogen, an alkyl group having 1 to 4 carbon atoms, and an aryl group having 6 to 15 carbon atoms.

3. A light-emitting element according to claim 1, wherein R⁴ is a phenyl group and each of R⁵ and R⁶ is hydrogen.

4. A light-emitting element according to claim 1, wherein R⁴ is a phenyl group and each of R¹, R⁵ and R⁶ is hydrogen.

5. A light-emitting element according to claim 1, wherein R⁴ is a phenyl group and each of R¹, R², R³, R⁵ and R⁶ is hydrogen.

6. A light-emitting element comprising:
a first layer over an anode;
an N layer over the first layer;
a P layer over the N layer;
a second layer over the P layer; and
a cathode over the second layer,
wherein each of the first layer and the second layer contains a third layer and a fourth layer over the third layer,
wherein the third layer contains a spirofluorene derivative represented by the structure:

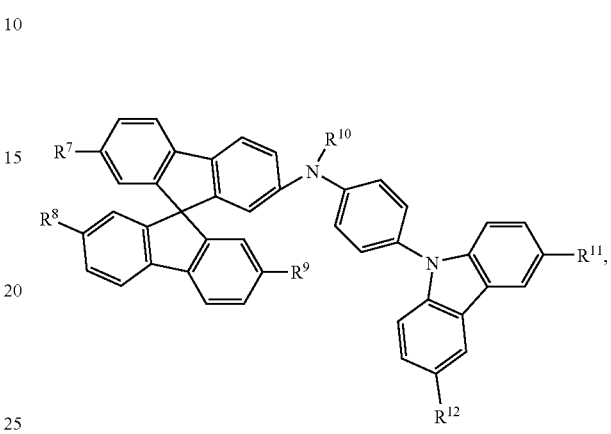

wherein R⁷ is any one of hydrogen and an alkyl group having 1 to 4 carbon atoms, each of R⁸ and R⁹ is any one of hydrogen and an alkyl group having 1 to 4 carbon atoms and R⁸ and R⁹ may be identical or different, R¹⁰ is an aryl group having 6 to 15 carbon atoms, each of R¹¹ and R¹² is any one of hydrogen, an alkyl group having 1 to 4 carbon atoms, and an aryl group having 6 to 15 carbon atoms and R¹¹ and R¹² may be identical or different, wherein the fourth layer contains a phosphorescent compound, wherein the N layer contains an organic compound and an electron donor, and wherein the P layer contains an organic compound and an electron acceptor.

7. A light-emitting element according to claim 6, wherein R¹⁰ is a substituent represented by the structure:

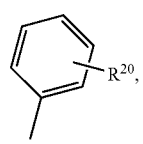

wherein R²⁰ any one of hydrogen, an alkyl group having 1 to 4 carbon atoms, and an aryl group having 6 to 15 carbon atoms.

8. A light-emitting element according to claim 6, wherein R¹⁰ is a phenyl group and each of R¹¹ and R¹² is hydrogen.

9. A light-emitting element according to claim 6, wherein R¹⁰ is a phenyl group and each of R⁷, R¹¹ and R¹² is hydrogen.

10. A light-emitting element according to claim 6, wherein R¹⁰ is a phenyl group and each of R⁷, R⁸, R⁹, R¹¹ and R¹² is hydrogen.

11. A light-emitting element comprising:
a first layer over an anode;
an N layer over the first layer;
a P layer over the N layer;
a second layer over the P layer; and
a cathode over the second layer,
wherein each of the first layer and the second layer contains a third layer and a fourth layer over the third layer,
wherein the third layer contains a spirofluorene derivative represented by the structure:

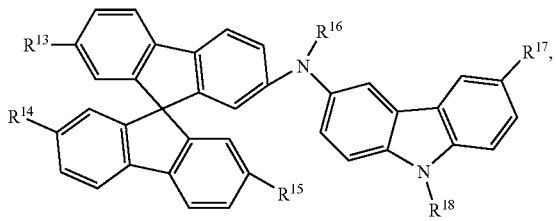

wherein $R^{13}$ is any one of hydrogen and an alkyl group having 1 to 4 carbon atoms, each of $R^{14}$ and $R^{15}$ is any one of hydrogen and an alkyl group having 1 to 4 carbon atoms and $R^{14}$ and $R^{15}$ may be identical or different, $R^{16}$ is an aryl group having 6 to 15 carbon atoms, $R^{17}$ is any one of hydrogen, an alkyl group having 1 to 4 carbon atoms, and an aryl group having 6 to 15 carbon atoms, and $R^{18}$ is any one of an alkyl group having 1 to 4 carbon atoms and an aryl group having 6 to 15 carbon atoms,
wherein the fourth layer contains a phosphorescent compound,
wherein the N layer contains an organic compound and an electron donor, and
wherein the P layer contains an organic compound and an electron acceptor.

12. A light-emitting element according to claim 11, wherein $R^{16}$ and $R^{18}$ each are a substituent represented by the structure:

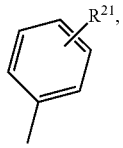

wherein $R^{21}$ is any one of hydrogen, an alkyl group having 1 to 4 carbon atoms, and an aryl group having 6 to 15 carbon atoms.

13. A light-emitting element according to claim 11, wherein each of $R^{16}$ and $R^{18}$ is a phenyl group and $R^{17}$ is hydrogen.

14. A light-emitting element according to claim 11, wherein each of $R^{16}$ and $R^{18}$ is a phenyl group and each of $R^{13}$ and $R^{17}$ is hydrogen.

15. A light-emitting element according to claim 11, wherein each of $R^{16}$ and $R^{18}$ is a phenyl group and each of $R^{13}$, $R^{14}$, $R^{15}$ and $R^{17}$ is hydrogen.

16. The light-emitting element according to any one of claims 1 to 11,
wherein the electron donor is selected from an alkali metal and an alkaline-earth metal.

17. The light-emitting element according to any one of claims 1 to 11,
wherein the electron acceptor is a transition metal oxide.

18. An electronic appliance comprising:
a display portion using the light-emitting element according to any one of claims 1 to 11.

19. A lighting device comprising the light-emitting element according to any one of claims 1 to 11.

* * * * *

UNITED STATES PATENT AND TRADEMARK OFFICE
CERTIFICATE OF CORRECTION

PATENT NO.          : 8,304,094 B2
APPLICATION NO.     : 12/071636
DATED               : November 6, 2012
INVENTOR(S)         : Nobuharu Ohsawa et al.

It is certified that error appears in the above-identified patent and that said Letters Patent is hereby corrected as shown below:

At column 13, line 57, "Tb(acaC)₃(Phen)" should be --Tb(acac)$_3$(Phen)--;

At column 72, line 6, "Lid." should be --Ltd.--;

At column 72, please replace the part of synthetic scheme (d-1) located between lines 30 to 40 with the following structural formula:

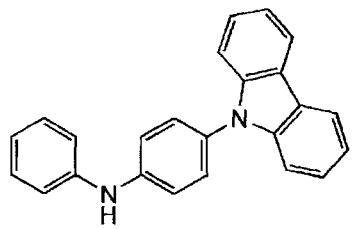

At column 74, line 58, "wherein $R^{20}$ any" should be --wherein $R^{20}$ is any--.

Signed and Sealed this
Twelfth Day of February, 2013

Teresa Stanek Rea
*Acting Director of the United States Patent and Trademark Office*